United States Patent
Noh et al.

(10) Patent No.: US 11,227,896 B2
(45) Date of Patent: Jan. 18, 2022

(54) NONVOLATILE MEMORY DEVICE HAVING STACKED CELL TRANSISTORS AND OPERATING METHOD THEREOF

(71) Applicants: SK hynix Inc., Icheon-si (KR); Seoul National University R&DB Foundation, Seoul (KR)

(72) Inventors: Yoo-Hyun Noh, Icheon-si (KR); Jong-Ho Lee, Seoul (KR)

(73) Assignees: SK hynix Inc., Icheon-si (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 16/662,969

(22) Filed: Oct. 24, 2019

(65) Prior Publication Data
US 2020/0203427 A1   Jun. 25, 2020

(30) Foreign Application Priority Data
Dec. 21, 2018 (KR) .......................... 10-2018-0167587

(51) Int. Cl.
H01L 29/06 (2006.01)
H01L 27/24 (2006.01)
G11C 5/06 (2006.01)
H01L 45/00 (2006.01)

(52) U.S. Cl.
CPC .......... *H01L 27/2454* (2013.01); *G11C 5/063* (2013.01); *H01L 27/2481* (2013.01); *H01L 45/1206* (2013.01); *H01L 45/16* (2013.01)

(58) Field of Classification Search
CPC ..... G11C 5/603; G11C 5/063; H01L 27/2454; H01L 27/2481; H01L 45/1206; H01L 45/16
See application file for complete search history.

(56) References Cited

U.S. PATENT DOCUMENTS

| | | | | |
|---|---|---|---|---|
| 7,382,018 B2* | 6/2008 | Kim | ...................... | H01L 27/115 257/328 |
| 7,729,164 B2* | 6/2010 | Kim | .................. | H01L 29/42336 365/185.01 |
| 7,732,855 B2* | 6/2010 | Park | .................. | G11C 16/0408 257/316 |
| 8,148,767 B2* | 4/2012 | Park | ...................... | B82Y 10/00 257/315 |
| 8,203,177 B2* | 6/2012 | Shin | ........................ | G11C 5/02 257/314 |
| 8,208,279 B2* | 6/2012 | Lue | ...................... | H01L 27/0688 365/63 |

(Continued)

*Primary Examiner* — Jay C Kim

(57) ABSTRACT

A nonvolatile memory device includes a gate line extending in a first horizontal direction; a gate electrode of a pillar shape extending in a vertical direction from the gate line; a plurality of bit lines and a plurality of source lines extending in parallel in a second horizontal direction perpendicular to the first horizontal direction, the plurality of bit lines and the plurality of source lines being stacked in the vertical direction; and a plurality of cell transistors vertically stacked to surround an outer side surface of the gate electrode between the plurality of bit lines and the plurality of source lines. Each of the cell transistors includes a gate dielectric layer which surrounds the outer side surface of the gate electrode and a channel layer which surrounds an outer side surface of the gate dielectric layer.

16 Claims, 81 Drawing Sheets

(56) References Cited

U.S. PATENT DOCUMENTS

| | | | | |
|---|---|---|---|---|
| 8,385,122 B2* | 2/2013 | Kim | ................... | G11C 16/0483 365/185.17 |
| 8,563,961 B2* | 10/2013 | Sasago | ................ | H01L 27/2481 257/4 |
| 8,633,535 B2* | 1/2014 | Matsuo | ................... | H01L 27/24 257/324 |
| 8,901,712 B2* | 12/2014 | Sasago | ................ | H01L 27/2454 257/536 |
| 8,964,079 B2 | 2/2015 | Fukuda et al. | | |
| 8,987,088 B2* | 3/2015 | Sakuma | ............ | H01L 29/40117 438/268 |
| 9,219,168 B2* | 12/2015 | Seol | ................... | G11C 16/0483 |
| 9,520,485 B2 | 12/2016 | Lue | | |
| 9,620,514 B2 | 4/2017 | Kai et al. | | |
| 9,666,642 B2* | 5/2017 | Park | ........................ | H01L 45/14 |
| 9,685,452 B2* | 6/2017 | Lee | ...................... | H01L 23/535 |
| 9,780,139 B2 | 10/2017 | Tayanaka et al. | | |
| 9,825,100 B2* | 11/2017 | Sekino | ................... | G11C 5/063 |
| 9,859,207 B2* | 1/2018 | Kim | ...................... | H01L 27/115 |
| 10,032,486 B2* | 7/2018 | Miyazaki | ........... | G11C 13/0026 |
| 10,083,979 B2* | 9/2018 | Matsuo | ............ | H01L 27/11565 |
| 10,629,810 B2* | 4/2020 | Matsuo | ............... | H01L 45/1253 |
| 2017/0062456 A1* | 3/2017 | Sugino | ................ | H01L 27/1157 |

* cited by examiner

NONVOLATILE MEMORY DEVICE HAVING STACKED CELL TRANSISTORS AND OPERATING METHOD THEREOF

CROSS-REFERENCE TO RELATED APPLICATION

This application claims priority under 35 U.S.C. § 119 to Korean Patent Application No. 10-2018-0167587 filed on Dec. 21, 2018, which is incorporated herein by reference in its entirety.

BACKGROUND

1. Field

Exemplary embodiments relate to a nonvolatile memory device and a neuromorphic device including a plurality of stacked cell transistors, and methods for manufacturing and operating a nonvolatile memory device and a neuromorphic device.

2. Discussion of the Related Art

Various structures for improving the degree of integration of a nonvolatile memory device and a neuromorphic device have been suggested. In particular, a nonvolatile memory device capable of storing multi-bit data by having multi-level channel resistance and conductivity has been researched.

SUMMARY

Various embodiments are directed to providing a nonvolatile memory device and a neuromorphic device which are capable of precisely setting a channel resistance level, are excellent in data retention stability and have high degree of integration.

Various embodiments are directed to providing a nonvolatile memory device and a neuromorphic device which have transistors of a FinFET structure.

Various embodiments are directed to providing methods for manufacturing a nonvolatile memory device and a neuromorphic device.

Various embodiments are directed to providing methods for operating a nonvolatile memory device and a neuromorphic device.

Various objects to be achieved by the disclosure are not limited to the aforementioned objects, and those skilled in the art to which the disclosure pertains may clearly understand other objects from the following descriptions.

In an embodiment, a nonvolatile memory device may include: a gate line extending in a first horizontal direction; a gate electrode extending in a vertical direction from the gate line; a gate dielectric layer disposed on an outer surface of the gate electrode extending in a vertical direction; a bit line and a source line extending substantially in parallel in a second horizontal direction at an angle to the first horizontal direction, and a channel layer disposed on an outer surface of the gate dielectric layer. A portion of the channel layer is in contact with the bit line and a portion of the channel layer is in contact with the source line, and a cell transistor of the nonvolatile memory device comprises the channel layer, a portion of the bit line common to the channel layer, a portion of the source line common to the channel layer, a portion of the gate dielectric layer common to the channel layer, and a portion of the gate electrode layer correlating to the channel layer in the horizontal direction The gate dielectric layer may include a tunneling gate dielectric layer through which electrons tunnel, a charge trap gate dielectric layer which traps tunneled electrons, and a blocking gate dielectric layer which blocks tunneling of electrons. The gate electrode has a rod-like shape, and the channel layer is substantially annular.

The nonvolatile memory device further includes a plurality of bit lines and a plurality of source lines, a plurality of channel layers, and a plurality of cell transistors spaced apart along the gate electrode in the vertical direction, and each of the plurality of spaced apart cell transistors comprises one of the plurality of bit lines, one of the plurality of source lines, one of the plurality of channel layers, a portion of the gate electrode in contact with the one of the plurality of channel layers, and a portion of the gate electrode corresponding to the channel layer in the horizontal direction.

The gate dielectric layer comprises a tunneling gate dielectric layer that includes a silicon oxide, a charge trap gate dielectric layer that includes a silicon nitride, and a blocking gate dielectric layer that includes a metal oxide. An upper end of the gate electrode is electrically coupled with a gate line, and a lower end of the gate electrode is electrically floated. The gate electrode is cylindrical, the gate dielectric layer surrounds the outer surface of the gate electrode, and the channel layer is a ring disposed around a portion of the outer surface of the gate dielectric layer. The channel layer comprises any one of an undoped polysilicon and a P-doped polysilicon. A plurality of buffer layers formed between each of the plurality of channel layers and its corresponding one of the plurality of bit lines, and between each of the plurality of channel layers and its corresponding one of plurality of source lines, the buffer layers comprise a metal silicide or a metal nitride. Each of the plurality of buffer layers have a meniscus-like shape and wherein the plurality of buffer layers are disposed on the outer surface of the plurality of channel layers.

Each of the plurality of bit lines comprises an inner bit line and an outer bit line in contact with each other, the inner bit line comprises a polysilicon and the outer bit line comprises one among a metal, a metal compound and a metal silicide, and each of the source lines comprises an inner source line and an outer source line in contact with each other, the inner source line comprises a polysilicon and the outer source line comprises one among a metal, a metal compound and a metal silicide. The outer surface of the gate electrode comprises annular grooves, the gate dielectric layer is conformally formed in the grooves of the gate electrode, and the channel layers are formed in the grooves of the gate dielectric layer.

In an embodiment, a neuromorphic device includes a plurality of stacked cell transistors, and the plurality of stacked cell transistors comprise a common gate electrode extending in a vertical direction in a pillar-like shape; a common gate dielectric layer disposed around an outer surface of the common gate electrode; a plurality of channel layers, each in the shape of a ring, that are vertically spaced apart along an outer surface of the common gate dielectric layer in the vertical direction; a plurality of bit lines, each coupled with a corresponding one of the plurality of channel layers; and a plurality of source lines, each coupled with a corresponding one of the plurality of the channel layers.

The neuromorphic device further comprises a plurality of gate electrodes, each of the plurality of gate electrodes is electrically coupled to a plurality of stacked cell transistors, each of the plurality of gate electrodes is electrically coupled at an upper end to a gate line extending in a horizontal direction, and each of the plurality of gate electrodes is electrically floated at a lower end. The common gate dielectric layer comprises a tunneling gate dielectric layer that includes a silicon oxide, a charge trap gate dielectric layer that includes a silicon nitride, and a blocking gate dielectric layer that includes a metal oxide. The common gate electrode and the common gate dielectric layer are disposed between the bit lines and the source lines of the plurality of cell transistors. The common gate electrode, the bit lines and the source lines are conductors, and the common gate dielectric layer comprises a tunneling gate dielectric layer, a charge trap gate dielectric layer and a blocking gate dielectric layer, and each of the plurality of channel layers comprise a polysilicon. A plurality of conductive buffer layers disposed between the plurality of bit lines and the plurality of channel layers and between the plurality of source lines and the plurality of channel layers, and each of the plurality of conductive buffer layers has the shape of a meniscus. Each of the conductive buffer layers includes a metal, a metal compound or a metal silicide. Each of the plurality of bit lines comprises an inner bit line and an outer bit line in contact with each other, the outer bit line comprises a polysilicon, and the inner bit line comprises one among a metal, a metal compound and a metal silicide, and each of the source lines comprises an inner source line and an outer source line in contact with each other. The outer source line comprises a polysilicon, and the inner source line comprises one among a metal, a metal compound and a metal silicide. The outer side surface of the common gate electrode comprises convexes and concaves, the common gate dielectric layer is conformally formed on the convexes and the concaves of the common gate electrode to have a wave shape, and the channel layers are formed to be embedded in the concaves of the common gate electrode on the common gate dielectric layer. The convexes of the common gate electrode project between the bit line and the source line.

In an embodiment, a method for operating a nonvolatile memory device, the method comprises forming a plurality of cell transistors by extending a pillar-like common gate electrode in a vertical direction; surrounding an outer surface of gate electrode with a gate dielectric layer; encircling a portion of an outer surface of the gate dielectric layer with a ring-like channel layer; adding one or more channel layers along the gate electrode in the vertical direction; coupling a portion of an outer surface of each channel layer to a bit line extending in a horizontal direction; and coupling a portion of the outer surface of each channel layer to a source line substantially parallel to the bit line in the horizontal direction; and applying a first voltage to the gate electrode of a selected cell transistor and applying a second voltage to the bit line and the source line of the selected cell transistor.

The method may further include dividing the gate dielectric layer into a first gate dielectric layer, a second gate dielectric layer, and a third gate dielectric layer; covering the outer surface of the common gate electrode with the first gate dielectric layer; layering the second gate dielectric layer on the first gate dielectric layer; and disposing the third gate dielectric layer on the second gate dielectric layer.

The method may further include creating a voltage difference in the selected cell transistor between the first voltage and the second voltage; tunneling electrons through the third gate dielectric layer of the selected cell transistor from the channel layer; trapping electrons in the second gate dielectric layer; blocking tunneling of electrons through the first gate dielectric layer; and programming the selected cell transistor utilizing a relatively high first voltage and a relatively low second voltage.

The method may further include creating a voltage difference in the selected cell transistor between the first voltage and the second voltage; erasing the selected cell transistor by applying a relatively low first voltage to the gate electrode and applying a relatively high second voltage to the bit line and to the source line.

The method may further include releasing electrons trapped in the second gate dielectric layer; tunneling electrons through the third gate dielectric layer of the selected cell transistor from the second dielectric layer; discharging electrons into the channel layer; and reducing the channel resistance of the selected cell transistor.

The method may further include creating a voltage difference in the selected cell transistor between the first voltage and the second voltage; tunneling electrons through the first gate dielectric layer of the selected cell transistor from the channel layer; trapping electrons in the second gate dielectric layer; blocking tunneling of electrons through the third gate dielectric layer; and increasing the channel resistance of the channel layer of the selected cell transistor. The first voltage is relatively low and the second voltage is relatively high.

The method may further include creating a voltage difference in the selected cell transistor between the first voltage and the second voltage; erasing the selected cell transistor by applying a relatively high first voltage to the gate electrode and applying a relatively low second voltage to the bit line and to the source line.

The method may further include releasing electrons trapped in the second gate dielectric layer; tunneling electrons through the first gate dielectric layer of the selected cell transistor from the second dielectric layer; discharging electrons into the common gate electrode layer; and reducing the channel resistance of the selected cell transistor.

The method may further include applying a third voltage, of a magnitude between that of the first voltage and the second voltage, to the bit line and to the source line of each cell transistor that is not the selected transistor.

The method may further include applying the second voltage to the gate electrode of each cell transistor that is not the selected transistor, and applying a third voltage, of a magnitude between that of the first voltage and the second voltage, to the bit line and to the source line.

In an embodiment, a method for operating a nonvolatile memory device, the method comprising forming a plurality of cell transistors by extending a pillar-like common gate electrode in a vertical direction; surrounding an outer surface of gate electrode with a gate dielectric layer; encircling a portion of an outer surface of the gate dielectric layer with a ring-like channel layer; adding one or more channel layers along the gate electrode in the vertical direction; coupling a portion of an outer surface of each channel layer to a bit line extending in a horizontal direction, coupling a portion of the outer surface of each channel layer to a source line substantially parallel to the bit line in the horizontal direction, applying a first voltage to the gate electrode of a selected cell transistor, applying a second voltage different from the first voltage to the bit line, and applying the first voltage to the source line.

The method may further include dividing the gate dielectric layer into a first gate dielectric layer, a second gate dielectric layer, and a third gate dielectric layer; covering the outer surface of the common gate electrode with the first gate dielectric layer; layering the second gate dielectric layer on the first gate dielectric layer; and disposing the third gate dielectric layer on the second gate dielectric layer.

The method may further include creating a voltage difference in the selected cell transistor between the first voltage and the second voltage; tunneling electrons through the third gate dielectric layer of the selected cell transistor from the channel layer; trapping electrons in the second gate dielectric layer; blocking tunneling of electrons through the first gate dielectric layer; and programming the selected cell transistor utilizing a relatively high first voltage and a relatively low second voltage.

The method may further include creating a voltage difference in the selected cell transistor between the first voltage and the second voltage; tunneling electrons through the first gate dielectric layer of the selected cell transistor from the channel layer; trapping electrons in the second gate dielectric layer; blocking tunneling of electrons through the third gate dielectric layer; and increasing the channel resistance of the channel layer of the selected cell transistor. The first voltage is relatively low and the second voltage is relatively high.

The method may further include erasing the selected cell transistor by applying the second voltage to the common gate electrode.

The method may further include releasing electrons trapped in the second gate dielectric layer; tunneling electrons through the third gate dielectric layer of the selected cell transistor from the second dielectric layer; discharging electrons into the channel layer; and reducing the channel resistance of the selected cell transistor.

The erasing the selected cell transistor may further comprise releasing electrons trapped in the second gate dielectric layer; tunneling electrons through the first gate dielectric layer of the selected cell transistor from the second dielectric layer; discharging electrons into the common gate electrode layer; and reducing the channel resistance of the selected cell transistor.

The method may further include applying the second voltage to the source line of each cell transistor that is not the selected cell transistor.

The method may further include applying the first voltage to the gate electrode of each cell transistor that is not the selected cell transistor, and applying the second voltage to the bit line and to the source line.

The method may further include applying the second voltage to the gate electrode, the bit line and the source line of each cell transistor that is not the selected cell transistor.

In an embodiment, a method for operating a nonvolatile memory device, the method comprising forming a plurality of cell transistors by extending a pillar-like common gate electrode in a vertical direction; surrounding an outer surface of gate electrode with a gate dielectric layer; encircling a portion of an outer surface of the gate dielectric layer with a ring-like channel layer; adding one or more channel layers along the gate electrode in the vertical direction; coupling a portion of an outer surface of each channel layer to a bit line extending in a horizontal direction, coupling a portion of the outer surface of each channel layer to a source line substantially parallel to the bit line in the horizontal direction, applying a first voltage to the gate electrode of a selected cell transistor, floating the bit line of the selected cell transistor, and applying a second voltage different from the first voltage to the source line of the selected cell transistor.

The method may further include dividing the gate dielectric layer into a first gate dielectric layer, a second gate dielectric layer, and a third gate dielectric layer; covering the outer surface of the common gate electrode with the first gate dielectric layer; layering the second gate dielectric layer on the first gate dielectric layer; and disposing the third gate dielectric layer on the second gate dielectric layer.

The method may further include creating a voltage difference in the selected cell transistor between the first voltage and the second voltage; tunneling electrons through the third gate dielectric layer of the selected cell transistor from the channel layer; trapping electrons in the second gate dielectric layer; blocking tunneling of electrons through the first gate dielectric layer; and programming the selected cell transistor.

The method may further include creating a voltage difference in the selected cell transistor between the first voltage and the second voltage; tunneling electrons through the first gate dielectric layer of the selected cell transistor from the channel layer; trapping electrons in the second gate dielectric layer; blocking tunneling of electrons through the third gate dielectric layer; and increasing the channel resistance of the channel layer of the selected cell transistor.

The method may further include erasing the selected cell transistor by applying the second voltage to the common gate electrode, floating the bit line and applying the first voltage to the source line.

The method may further include erasing the selected cell transistor by releasing electrons trapped in the second gate dielectric layer; tunneling electrons through the third gate dielectric layer of the selected cell transistor from the second dielectric layer; discharging electrons into the channel layer; and reducing the channel resistance of the selected cell transistor.

The erasing of the selected cell transistor may further comprise releasing electrons trapped in the second gate dielectric layer; tunneling electrons through the first gate dielectric layer of the selected cell transistor from the second dielectric layer; discharging electrons into the common gate electrode layer; and reducing the channel resistance of the selected cell transistor.

The method may further include applying a third voltage, of a magnitude between the first voltage and the second voltage, to the source line of each cell transistor that is not selected.

The method may further include applying the second voltage to the gate electrode of each unselected cell transistor, floating the bit line and applying a third voltage, of a magnitude between the first voltage and the second voltage, to the source line.

The method may further include applying the second voltage to the gate electrode of each cell transistor that is not selected.

Since the nonvolatile memory device according to the technical spirit of the disclosure may be realized by using cell transistors which are three-dimensionally stacked, degree of integration may be increased.

According to the technical spirit of the disclosure, since a plurality of channel resistance levels of a nonvolatile memory device may be realized by the electric field of a gate electrode and a channel, the stability of the channel resistance level of the nonvolatile memory device may be enhanced.

The technical spirit of the disclosure may be applied to a neuromorphic device. That is to say, cell transistors according to embodiments of the disclosure may be used as synapses of a neuromorphic device.

BRIEF DESCRIPTION OF THE DRAWINGS

FIGS. 36A and 36B to 38A and 38B are representations of examples of views to assist in the explanation of a method for forming a nonvolatile memory device in accordance with an embodiment of the disclosure.

FIGS. 39 to 41A and 41B are representations of examples of views to assist in the explanation of a method for forming a nonvolatile memory device in accordance with an embodiment of the disclosure.

DETAILED DESCRIPTION

Figure 1:
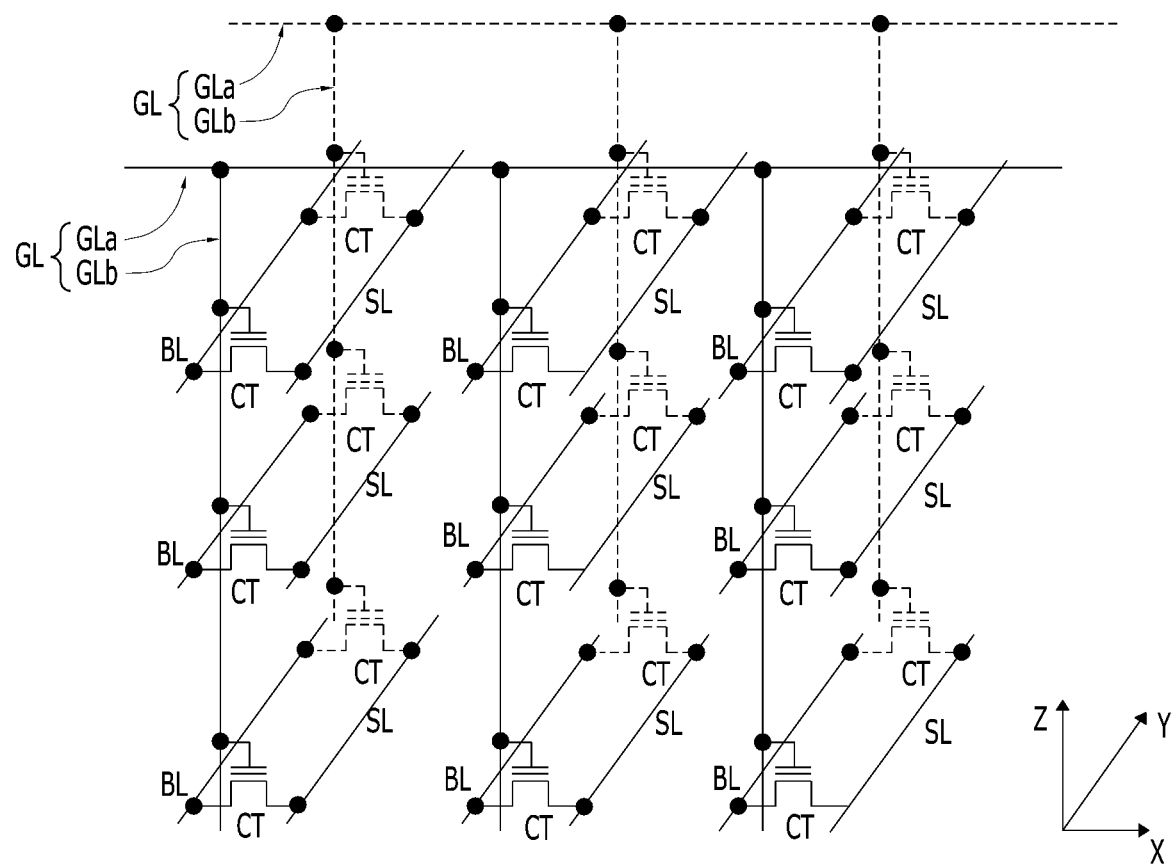
FIG. 1 is an equivalent circuit diagram illustrating a representation of an example of a cell array of a nonvolatile memory device in accordance with an embodiment of the disclosure.

Advantages and features of the disclosure and methods for achieving them will become more apparent after a reading of the following exemplary embodiments taken in conjunction with the drawings. The disclosure may, however, be embodied in different forms and should not be construed as limited to the embodiments set forth herein. Rather, these embodiments are provided so that this disclosure will be thorough and complete, and will fully convey the scope of the disclosure to those skilled in the art. The disclosure will be defined only by the scope of the claims.

Terms used in this specification are used for describing various embodiments, and do not limit the disclosure. As used herein, a singular form is intended to include plural forms as well, unless the context clearly indicates otherwise. It will be further understood that the terms "includes" and/or "including," when used in this specification, specify the presence of at least one stated feature, step, operation, and/or element, but do not preclude the presence or addition of one or more other features, steps, operations, and/or elements thereof.

Throughout the specification, like reference numerals refer to like elements. Therefore, although the same or similar reference numerals are not mentioned or described in a corresponding drawing, the reference numerals may be described with reference to other drawings. Furthermore, although elements are not represented by reference numerals, the elements may be described with reference to other drawings.

FIG. 1 is an equivalent circuit diagram illustrating a representation of an example of a cell array of a nonvolatile memory device in accordance with an embodiment of the disclosure. Two cell layers which are coupled with two gate lines GL are schematically illustrated to avoid complexity in the drawing. Referring to FIG. 1, the cell array of the nonvolatile memory device in accordance with this embodiment of the disclosure may include a plurality of gate lines GL which extend in parallel in a first horizontal direction X and a vertical direction Z, a plurality of bit lines BL and source lines SL which extend in parallel in a second horizontal direction Y, and cell transistors CT. The cell transistors CT include gate electrodes, each of which is coupled with one of the gate lines GL; drain electrodes, each of which is coupled with one of the bit lines BL; and source electrodes, each of which is coupled with one of the source lines SL. The plurality of gate lines GL may include main gate lines GLa which extend horizontally and sub gate lines GLb which extend downwards from the main gate lines GLa. The upper ends of the sub gate lines GLb may be coupled with the main gate lines GLa, and the lower ends of the sub gate lines GLb may be electrically floated. In the present disclosure, it will be understood that the bit lines BL and the source lines SL are interchangeable, and/or the drain electrodes and the source electrodes of the cell transistors CT are interchangeable.

Figure 2A:
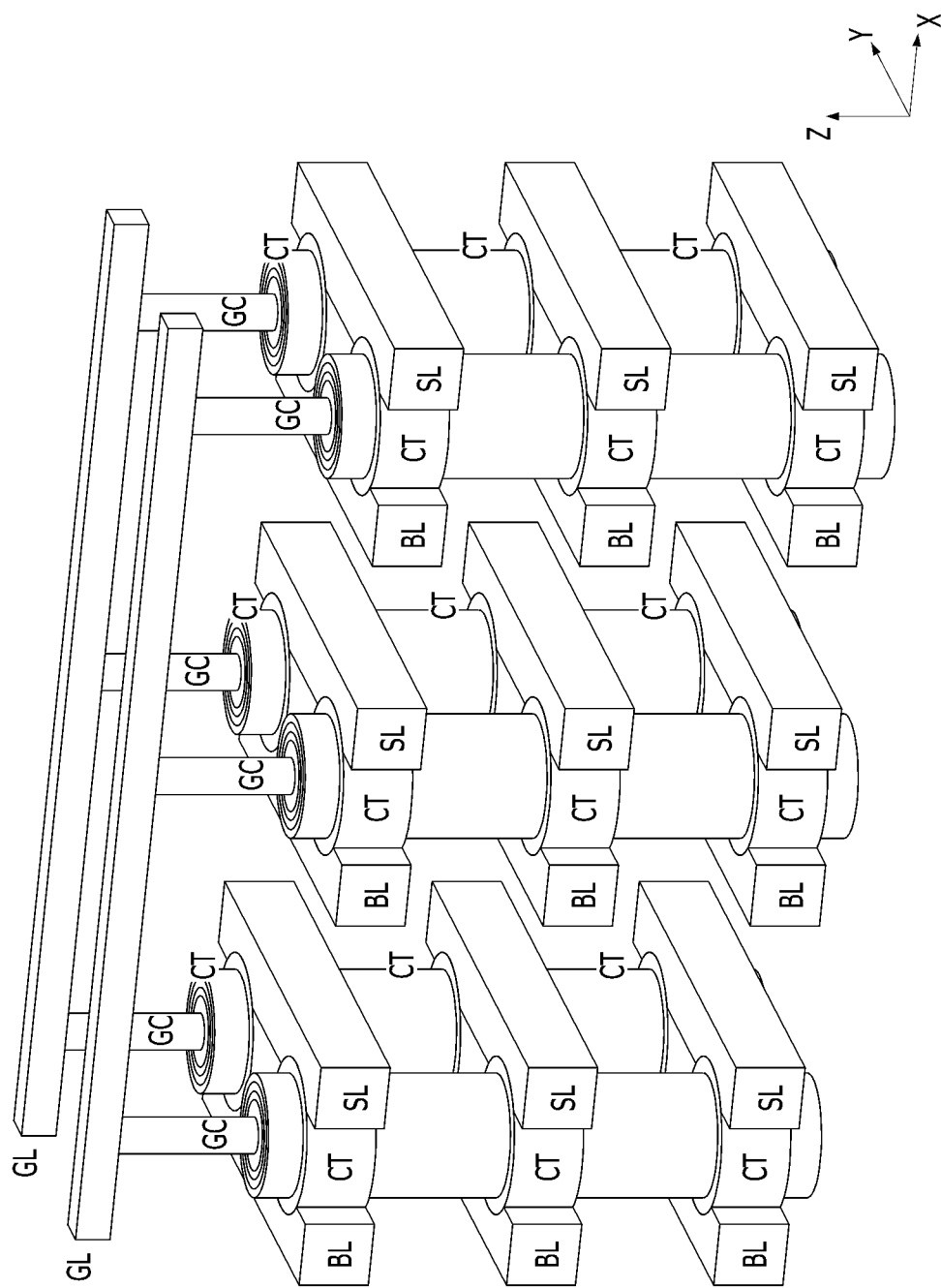
FIG. 2A is a three-dimensional perspective view illustrating a representation of an example of a nonvolatile memory device in accordance with an embodiment of the disclosure.
Figure 2B:
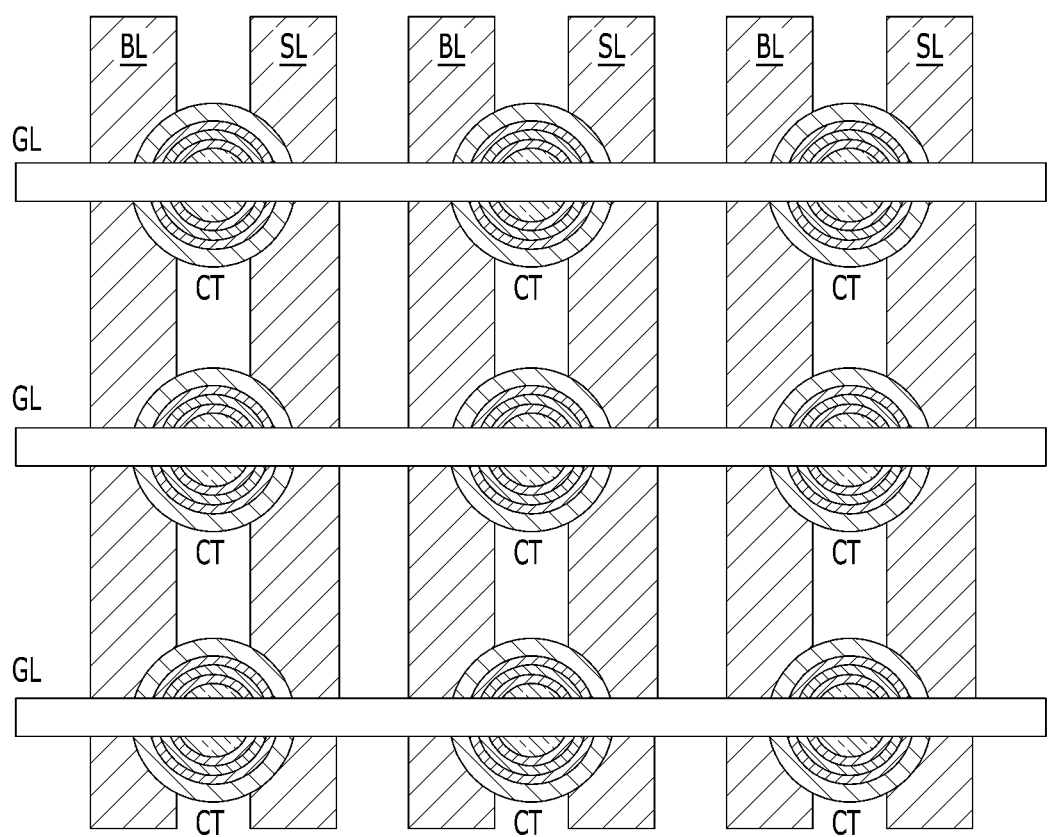
FIG. 2B is a horizontal cross-sectional view illustrating a representation of an example of a random layer of a cell array of the nonvolatile memory device in accordance with an embodiment of the disclosure.

FIG. 2A is a three-dimensional perspective view illustrating a representation of an example of a nonvolatile memory device in accordance with an embodiment of the disclosure, and FIG. 2B is a horizontal cross-sectional view illustrating a representation of an example of a random layer of a cell array of the nonvolatile memory device in accordance with this embodiment of the disclosure. Two cell layers which are coupled with two gate lines GL are schematically illustrated in FIG. 2A to avoid complexity in the drawing, and gate lines GL are illustrated together in FIG. 2B to facilitate the understanding of the disclosure. Referring to FIGS. 2A and 2B, the nonvolatile memory device in accordance with this embodiment of the disclosure may include a plurality of gate lines GL which extend in parallel in a first horizontal direction X, a plurality of gate contact plugs GC which extend in a vertical direction Z from the plurality of gate lines GL, cell transistors CT which are coupled with the plurality of gate contact plugs GC and are stacked or spaced apart in the vertical direction Z, and bit lines BL and source lines SL which are electrically coupled with the cell transistors CT and extend in parallel in a second horizontal direction Y. The bit lines BL and the source lines SL may extend parallel to each other. Therefore, the gate lines GL and the bit lines BL may be perpendicular to each other, and the gate lines GL and the source lines SL may be perpendicular to each other. When viewed in a top view or a horizontal cross-sectional view, the cell transistors CT may be disposed in regions or areas of intersection among the gate lines GL, the bit lines BL and the source lines SL. The gate electrodes of the cell transistors CT may be coupled with the gate lines GL, the drain electrodes of the cell transistors CT may be coupled with the bit lines BL, and the source electrodes of the cell transistors CT may be coupled with the source lines SL. For example, the cell transistors CT may use the gate lines GL as common gate electrodes, may use the bit lines BL as drain electrodes, and may use the source lines SL as source electrodes. In comparison with FIG. 1, the gate lines GL may represent the main gate lines GLa, and the gate contact plugs GC may represent the sub gate lines GLb.

Figure 3A:
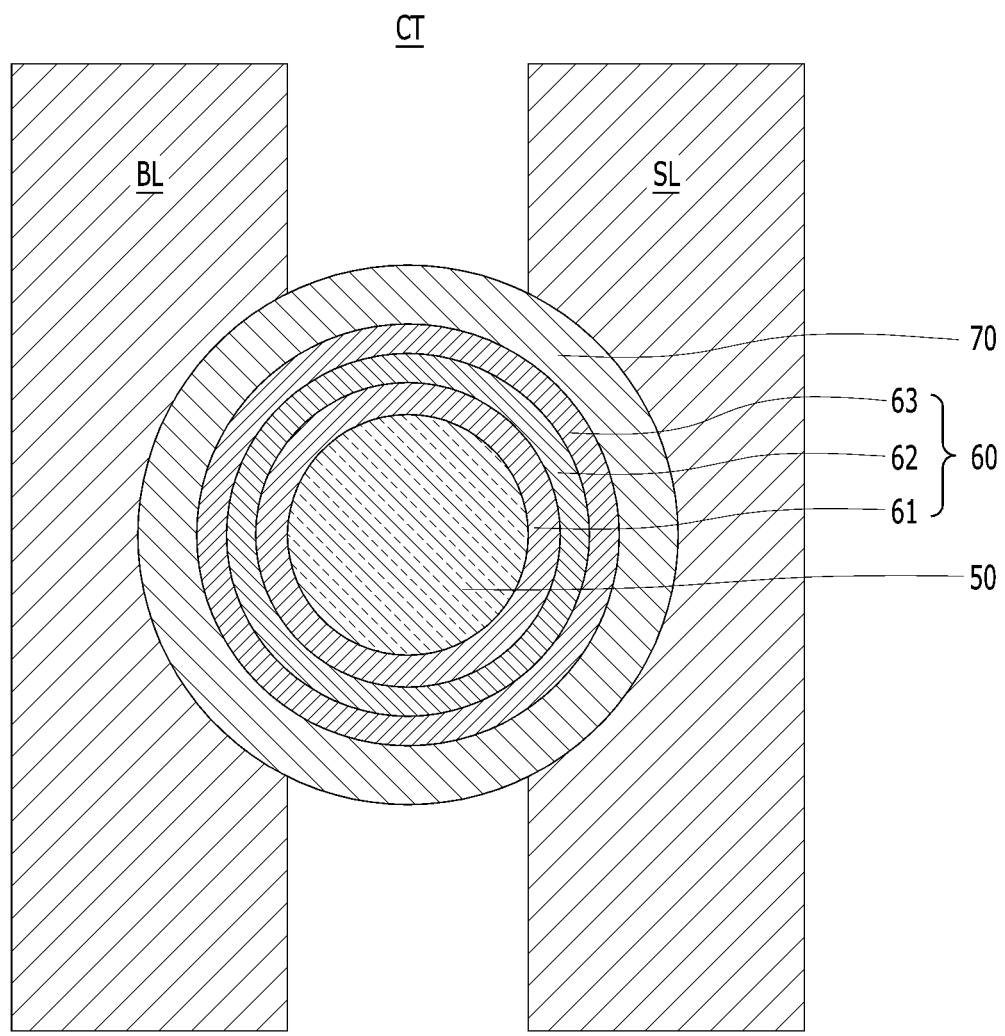
FIG. 3A is a horizontal cross-sectional view schematically illustrating a representation of an example of a cell transistor of a nonvolatile memory device in accordance with an embodiment of the disclosure.
Figure 3B:
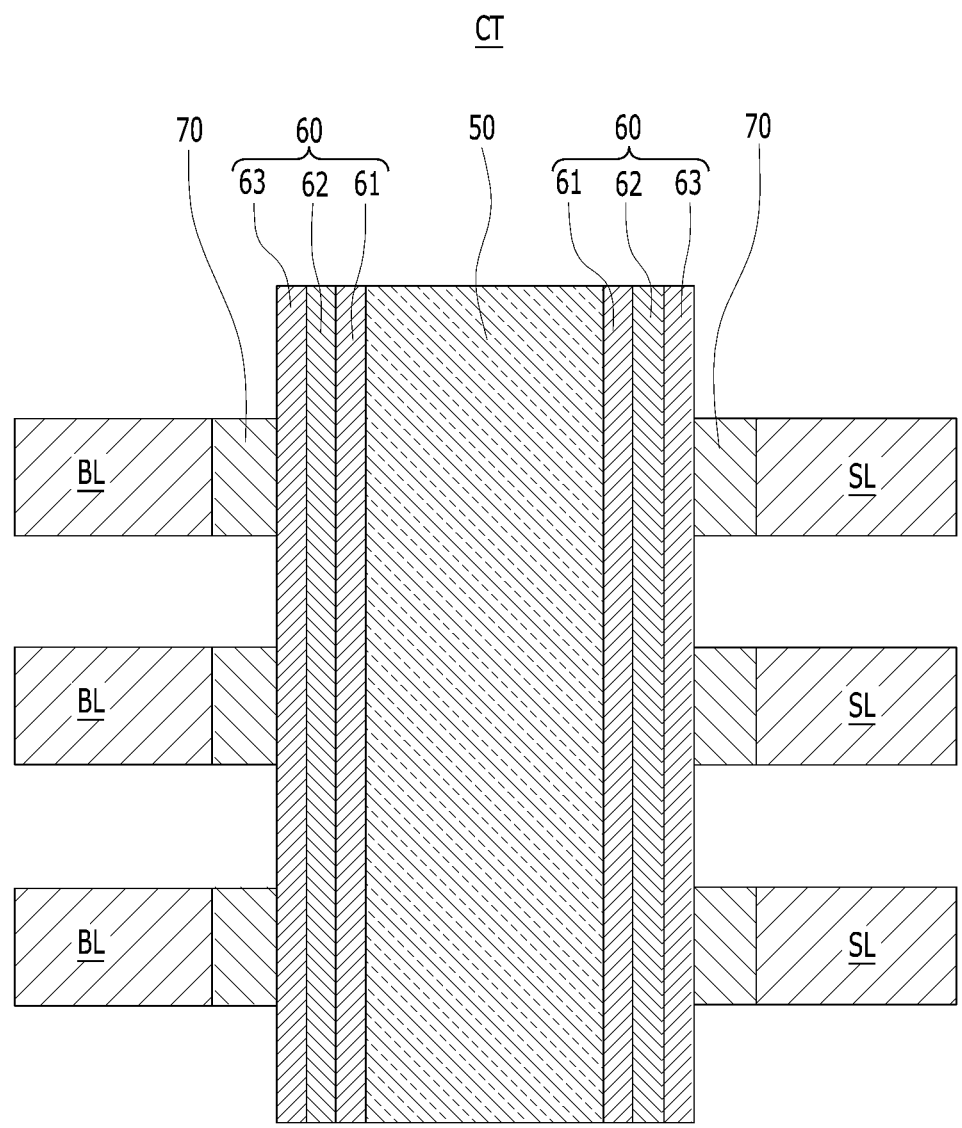
FIG. 3B is a vertical cross-sectional view illustrating a representation of an example of a stack structure of cell transistors of the nonvolatile memory device in accordance with an embodiment of the disclosure.

FIG. 3A is a horizontal cross-sectional view schematically illustrating a representation of an example of a cell transistor CT of a nonvolatile memory device in accordance with an embodiment of the disclosure, and FIG. 3B is a vertical cross-sectional view illustrating a representation of an example of a stack structure of cell transistors CT of the nonvolatile memory device in accordance with an embodiment of the disclosure. Referring to FIGS. 3A and 3B, the cell transistor CT of the nonvolatile memory device in accordance with this embodiment of the disclosure may include a common gate electrode 50, a common gate dielectric layer 60 which surrounds the common gate electrode 50, an individual channel layer 70 which surrounds the common gate electrode 50 and the common gate dielectric layer 60, and an individual bit line BL and an individual source line SL which extend in parallel in a horizontal direction at both sides of the individual channel layer 70. The common gate electrode 50 may have a rod-like or pillar-like shape. The common gate electrode 50 may be disposed between the individual bit line BL and the individual source line SL to extend vertically. The common gate electrode 50 may include at least one among a conductive N-doped polysilicon doped with N-type ions, a metal, a metal silicide, a metal nitride, a metal alloy and a combination thereof. When referring to FIG. 3A, the common gate electrode 50 may be a portion of the sub gate line GC.

The common gate dielectric layer 60 may have the shape of a tube or a cylinder which entirely surrounds the outer surface of the common gate electrode 50. The common gate dielectric layer 60 may include a first gate dielectric layer 61 which surrounds the outer side surface of the common gate electrode 50, a second gate dielectric layer 62 which surrounds the outer side surface of the first gate dielectric layer 61, and a third gate dielectric layer 63 which surrounds the outer side surface of the second gate dielectric layer 62. Thus, the common gate dielectric layer 60 may also be disposed between the individual bit line BL and the individual source line SL to extend vertically. In an embodiment of the disclosure, the first gate dielectric layer 61 may be a blocking gate dielectric layer, the second gate dielectric layer 62 may be a charge trap gate dielectric layer, and the third gate dielectric layer 63 may be a tunneling gate dielectric layer. For example, the first gate dielectric layer 61 may include a metal oxide, the second gate dielectric layer 62 may include a silicon nitride, and the third gate dielectric layer 63 may include a silicon oxide. In this embodiment, the third gate dielectric layer 63 may provide a path through which electrons may tunnel from the individual channel layer 70 to the second gate dielectric layer 62 or from the second gate dielectric layer 62 to the individual channel layer 70. The second gate dielectric layer 62 may trap electrons which have tunneled through the third gate dielectric layer 63 from the individual channel layer 70. The first gate dielectric layer 61 may block electrons from tunneling or leaking from the second gate dielectric layer 62 to the common gate electrode 50.

In another embodiment of the disclosure, the first gate dielectric layer 61 may be a tunneling gate dielectric layer, the second gate dielectric layer 62 may be a charge trap gate dielectric layer, and the third gate dielectric layer 63 may be a blocking gate dielectric layer. For example, the first gate dielectric layer 61 may include a silicon oxide, the second gate dielectric layer 62 may include a silicon nitride, and the third gate dielectric layer 63 may include a metal oxide. In this embodiment, the third gate dielectric layer 63 may block electrons from tunneling or leaking from the second gate dielectric layer 62 to the individual channel layer 70. The second gate dielectric layer 62 may trap electrons which have tunneled through the first gate dielectric layer 61 from the common gate electrode 50. The first gate dielectric layer 61 may provide a path through which electrons may tunnel from the common gate electrode 50 to the second gate dielectric layer 62 or from the second gate dielectric layer 62 to the common gate electrode 50.

The individual channel layer 70 may have the shape of a ring or a disc which surrounds the outer surfaces of the common gate electrode 50 and the common gate dielectric layer 60. The channel layer 70 may be substantially annular. The individual channel layer 70 may be coupled with the individual bit line BL and the individual source line SL while surrounding the common gate electrode 50 and the common gate dielectric layer 60. For example, a first side surface or first portion of the individual channel layer 70 may be brought into contact with or coupled with the individual bit line BL, and a second side surface or second portion of the individual channel layer 70 may be brought into contact with or coupled with the individual source line SL.

The individual channel layer 70 may include a semiconductor layer. For example, the individual channel layer 70 may include an intrinsic semiconductor layer such as an undoped polysilicon or a P-doped polysilicon layer doped with P-type ions. The individual bit line BL and the individual source line SL may include at least one among a conductive N-doped polysilicon doped with N-type ions, a metal, a metal silicide, a metal nitride, a metal alloy and a combination thereof. In the case where the individual channel layer 70 includes an intrinsic semiconductor layer and the individual bit line BL and the individual source line SL include an N-doped polysilicon, N-type ions in the individual bit line BL and the individual source line SL may diffuse to the individual channel layer 70 by an out-diffusion phenomenon. Therefore, the ion concentrations of the individual bit line BL and the individual source line SL may be higher than the ion concentration of the individual channel layer 70.

Stacked cell transistors CT in accordance with this embodiment of the disclosure may share the common gate electrode 50 and the common gate dielectric layer 60, may have individual channel layers 70, respectively, may use individual bit lines BL as drain electrodes, respectively, and may use individual source lines SL as source electrodes, respectively. The individual bit lines BL and the individual source lines SL are interchangeable, that is to say, the individual bit lines BL may be used as source electrodes, and the individual source lines SL may be used as drain electrodes.

Figure 4A:
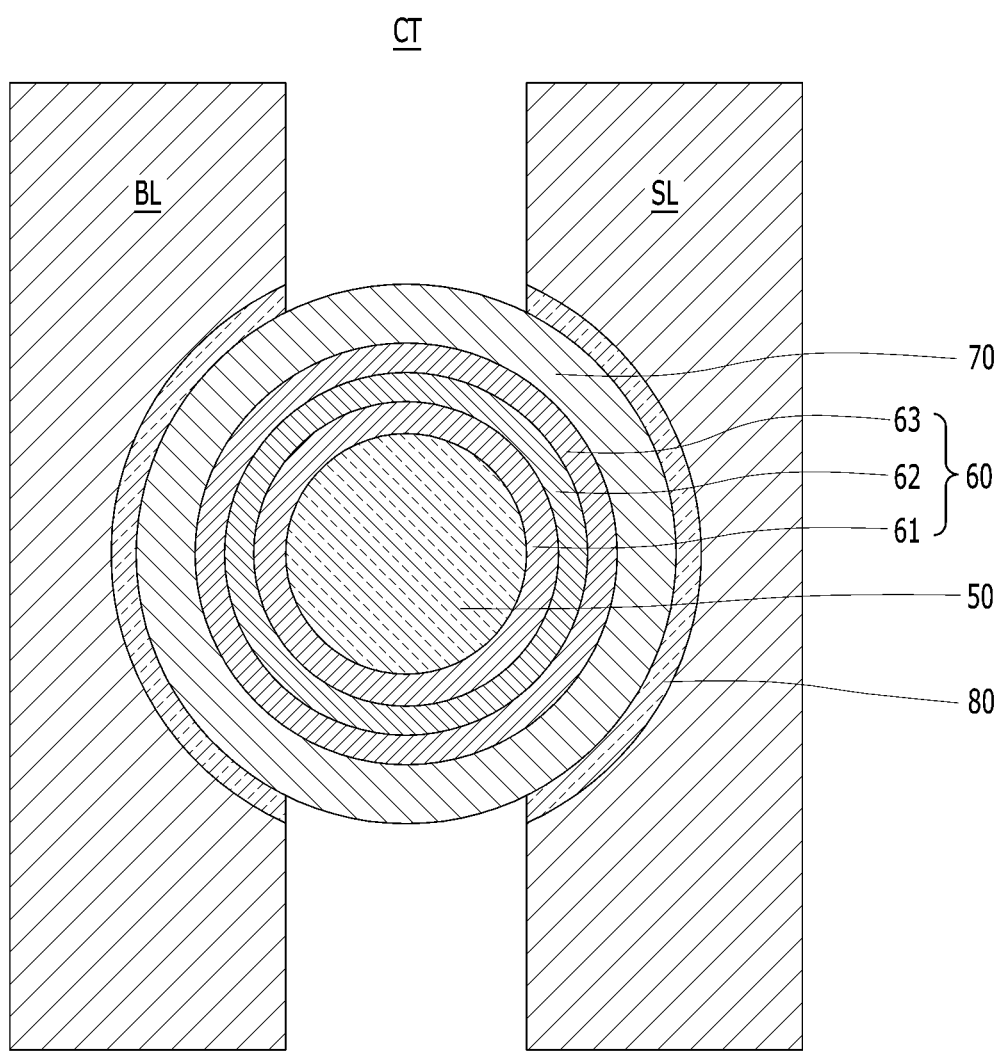
FIG. 4A is a horizontal cross-sectional view schematically illustrating a representation of an example of a cell transistor of a nonvolatile memory device in accordance with an embodiment of the disclosure.
Figure 4B:
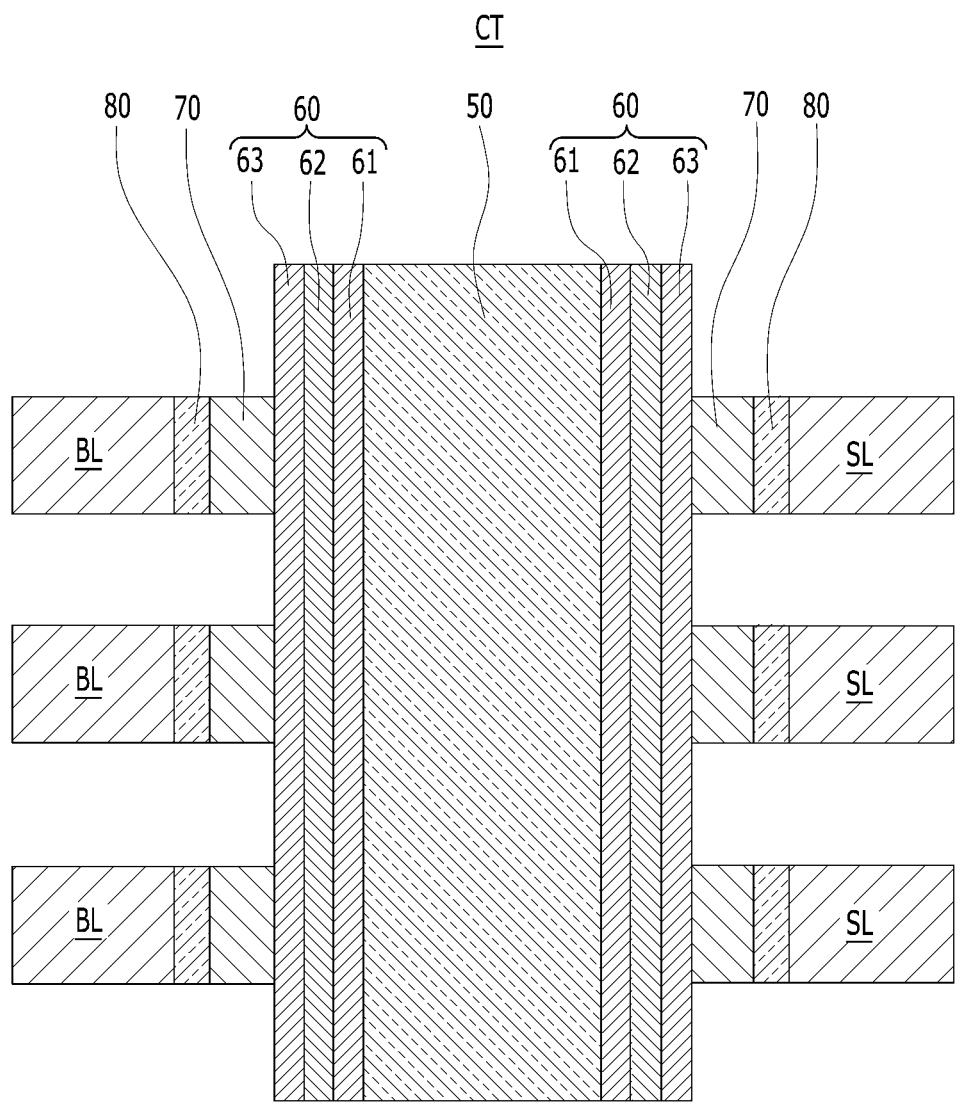
FIG. 4B is a vertical cross-sectional view illustrating a representation of an example of a stack structure of cell transistors of the nonvolatile memory device in accordance with an embodiment of the disclosure.

FIG. 4A is a horizontal cross-sectional view schematically illustrating a representation of an example of a cell transistor CT of a nonvolatile memory device in accordance with an embodiment of the disclosure, and FIG. 4B is a vertical cross-sectional view illustrating a representation of an example of a stack structure of cell transistors CT of the nonvolatile memory device in accordance with this embodiment of the disclosure. Referring to FIGS. 4A and 4B, the cell transistor CT of the nonvolatile memory device in accordance with this embodiment of the disclosure may include a common gate electrode 50 of a pillar shape, a common gate dielectric layer 60 of a tube shape or a cylinder shape which surrounds the outer side surface of the common gate electrode 50, an individual channel layer 70 of a ring or annular shape which surrounds the outer side surface of the common gate dielectric layer 60, an individual bit line BL and an individual source line SL which are positioned to be brought into contact with both sides of the individual channel layer 70 and to extend parallel to each other, and an individual buffer layer 80 which is formed between the individual channel layer 70 and the individual bit line BL and between the individual channel layer 70 and the individual source line SL. When viewed in a top view or a horizontal cross-sectional view, the individual buffer layer 80 may surround portions of the outer surface of the individual channel layer 70 in the shape of a semi-disc shaped meniscus. The individual buffer layer 80 may include a metal silicide or a barrier layer such as a metal nitride. For example, the individual buffer layer 80 may include a tungsten silicide (WSi), a titanium silicide (TiSi), a tantalum silicide (TaSi), a nickel silicide (NiSi), a cobalt silicide (CoSi) or any other metal silicide. Alternatively, the individual buffer layer 80 may include a conductive barrier layer including a titanium nitride (TiN), a tantalum nitride (TaN), a tungsten nitride (WN) or any other metal nitride. Components which are not described herein may be understood by referring to FIGS. 3A and 3B.

Figure 5A:
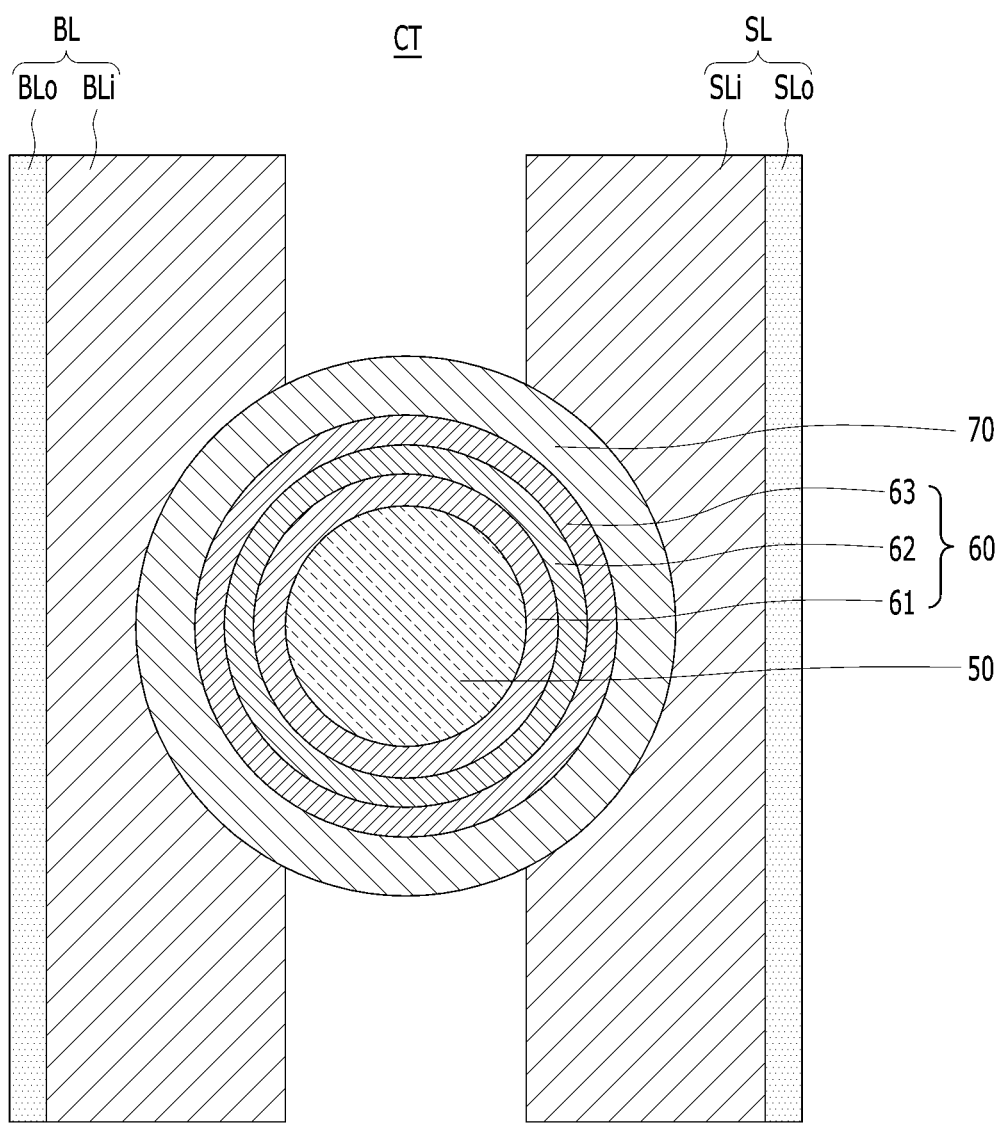
FIG. 5A is a horizontal cross-sectional view schematically illustrating a representation of an example of a cell transistor of a nonvolatile memory device in accordance with an embodiment of the disclosure.
Figure 5B:
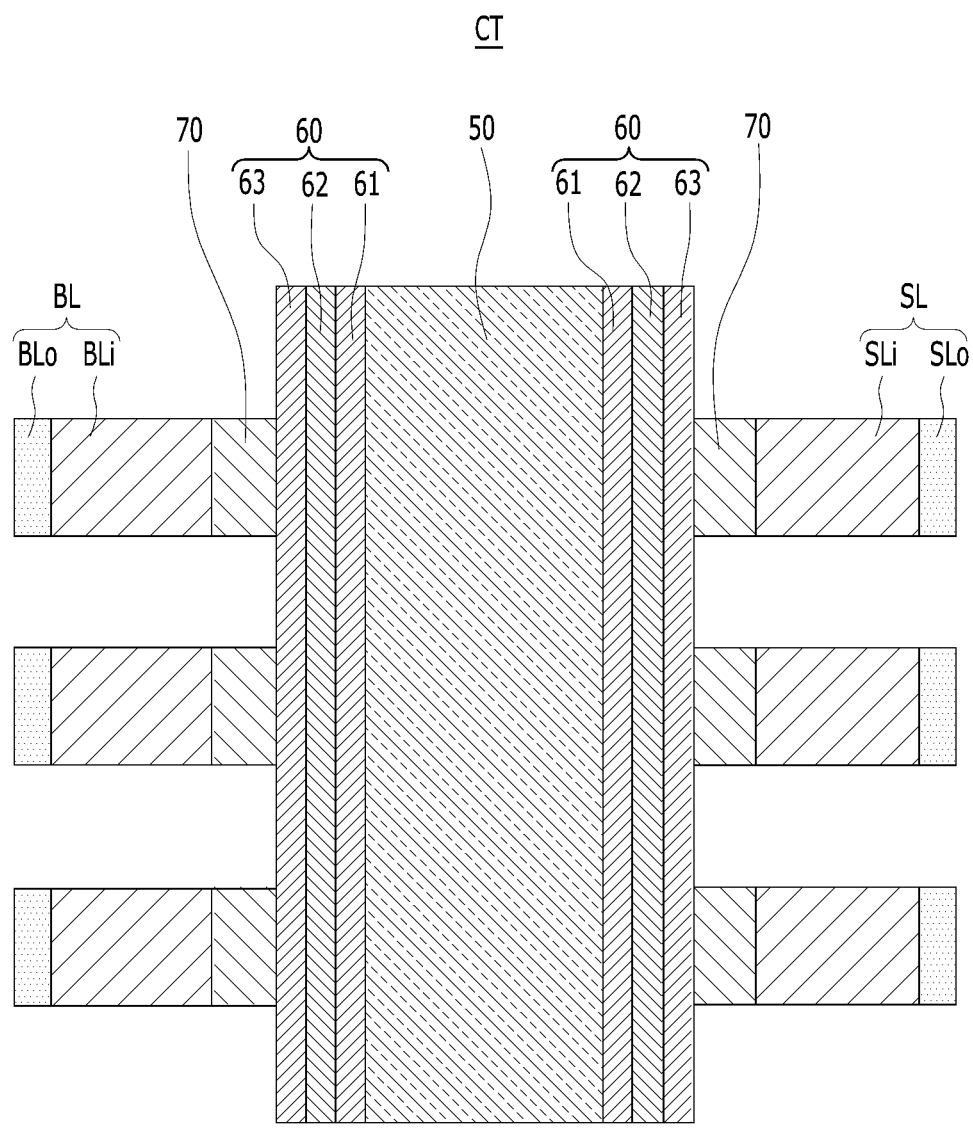
FIG. 5B is a vertical cross-sectional view illustrating a representation of an example of a stack structure of cell transistors of the nonvolatile memory device in accordance with an embodiment of the disclosure.

FIG. 5A is a horizontal cross-sectional view schematically illustrating a representation of an example of a cell transistor CT of a nonvolatile memory device in accordance with an embodiment of the disclosure, and FIG. 5B is a vertical cross-sectional view illustrating a representation of an example of a stack structure of cell transistors CT of the nonvolatile memory device in accordance with this embodiment of the disclosure. Referring to FIGS. 5A and 5B, the cell transistor CT of the nonvolatile memory device in accordance with this embodiment of the disclosure may include a common gate electrode 50 of a pillar shape, a common gate dielectric layer 60 of a tube shape or a cylinder shape which surrounds the outer side surface of the common gate electrode 50, an individual channel layer 70 of a ring shape which surrounds the outer side surface of the common gate dielectric layer 60, and an individual bit line BL and an individual source line SL which are positioned to be brought into contact with both sides of the individual channel layer 70 and to extend parallel to each other. The individual bit line BL may include an inner bit line BLi which is brought into direct contact with the individual channel layer 70 on one side and an outer bit line BLo on the opposite side. The individual source line SL may include an inner source line SLi which is brought into direct contact with the individual channel layer 70 on one side and an outer source line SLo on the opposite side. The inner bit line BLi and the inner source line SLi may include a conductive N-doped polysilicon which is doped with N-type ions. Therefore, since the inner bit line BLi and the inner source line SLi include a polysilicon, they may be brought into stable contact with the individual channel layer 70. The outer bit line BLo and the outer source line SLo may include a metal silicide, a metal nitride or a metal. Therefore, the outer bit line BLo and the outer source line SLo may have an electrical resistance value lower than that of the inner bit line BLi and the inner source line SLi.

Figure 6A:
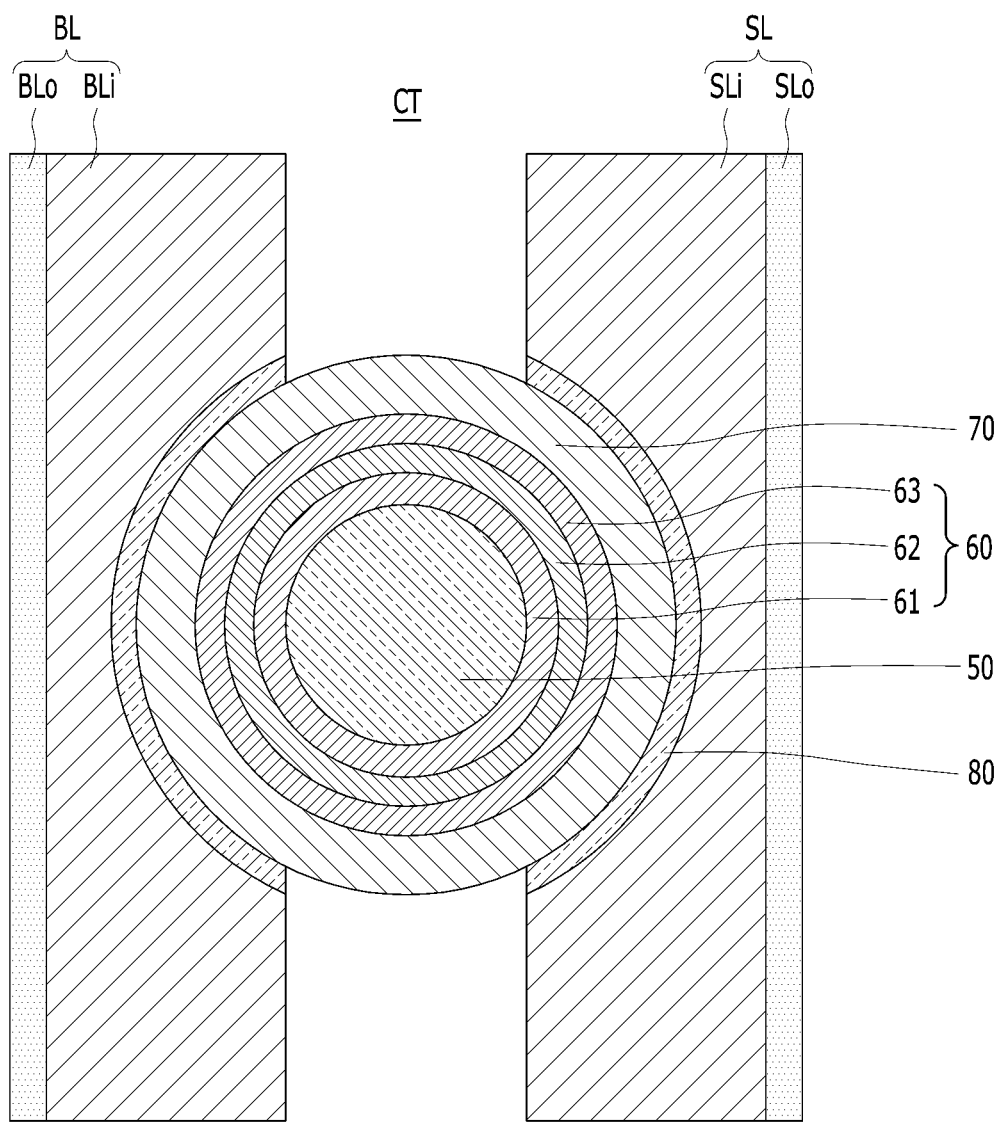
FIG. 6A is a horizontal cross-sectional view schematically illustrating a representation of an example of a cell transistor of a nonvolatile memory device in accordance with an embodiment of the disclosure.
Figure 6B:
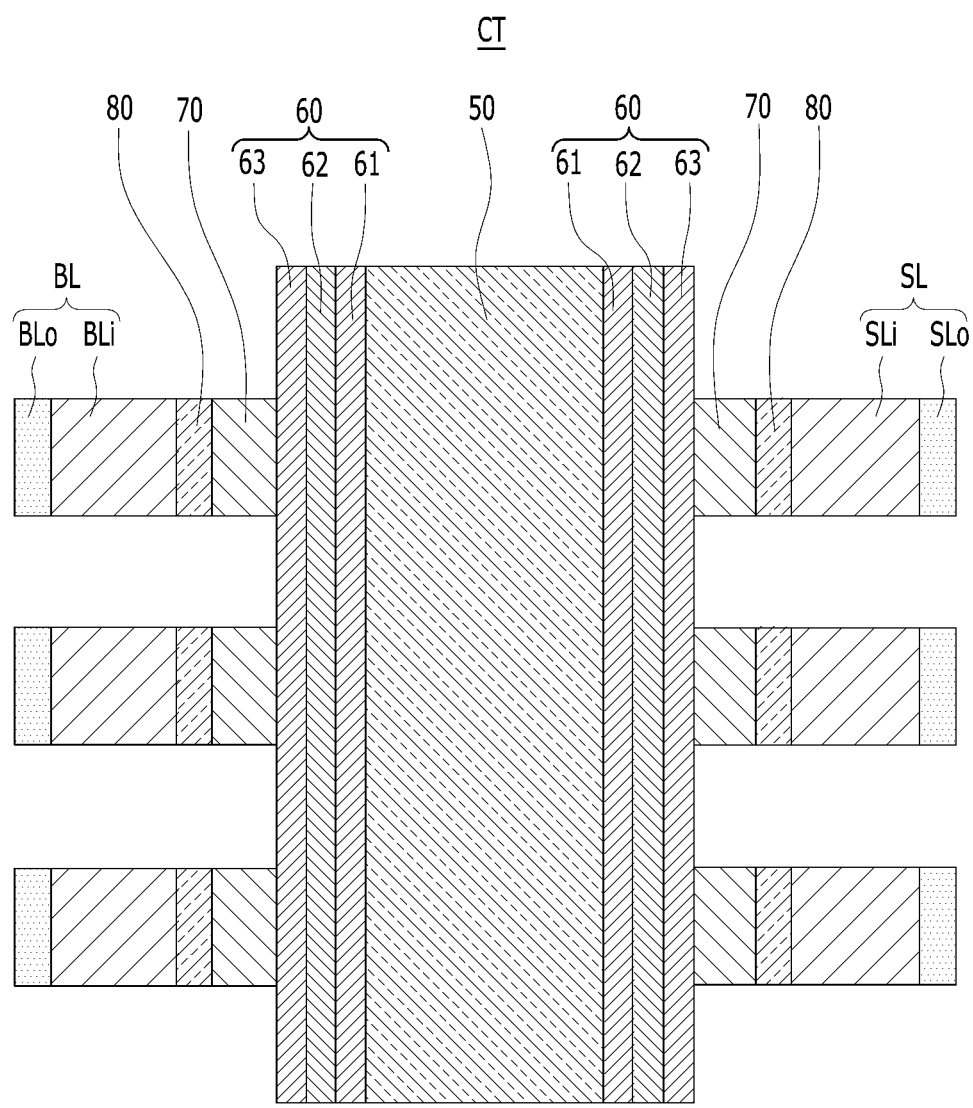
FIG. 6B is a vertical cross-sectional view illustrating a representation of an example of a stack structure of cell transistors of the nonvolatile memory device in accordance with an embodiment of the disclosure.

FIG. 6A is a horizontal cross-sectional view schematically illustrating a representation of an example of a cell transistor CT of a nonvolatile memory device in accordance with an embodiment of the disclosure, and FIG. 6B is a vertical cross-sectional view illustrating a representation of an example of a stack structure of cell transistors CT of the nonvolatile memory device in accordance with this embodiment of the disclosure. Referring to FIGS. 6A and 6B, the cell transistor CT of the nonvolatile memory device in accordance with this embodiment of the disclosure may include a common gate electrode 50 of a pillar-like shape, a common gate dielectric layer 60 of a tube-like shape or a cylinder-like shape which surrounds the outer side surface of the common gate electrode 50, an individual channel layer 70 of a ring shape which surrounds the outer side surface of the common gate dielectric layer 60, an individual bit line BL and an individual source line SL which are positioned to be brought into contact with the individual channel layer 70 and to extend parallel to each other, and an individual buffer layer 80 which is formed between the individual channel layer 70 and the individual bit line BL and between the individual channel layer 70 and the individual source line SL. The individual bit line BL may include an inner bit line BLi which is brought into direct contact with the individual channel layer 70 on one side and an outer bit line BLo on the opposite side. The individual source line SL may include an inner source line SLi which is brought into direct contact with the individual channel layer 70 on one side and an outer source line SLo on the opposite side. The cell transistor CT illustrated in FIGS. 6A and 6B may be understood by referring to the cell transistors CT illustrated in FIGS. 4A, 4B, 5A and 5B, in a combined manner.

Figure 7A:
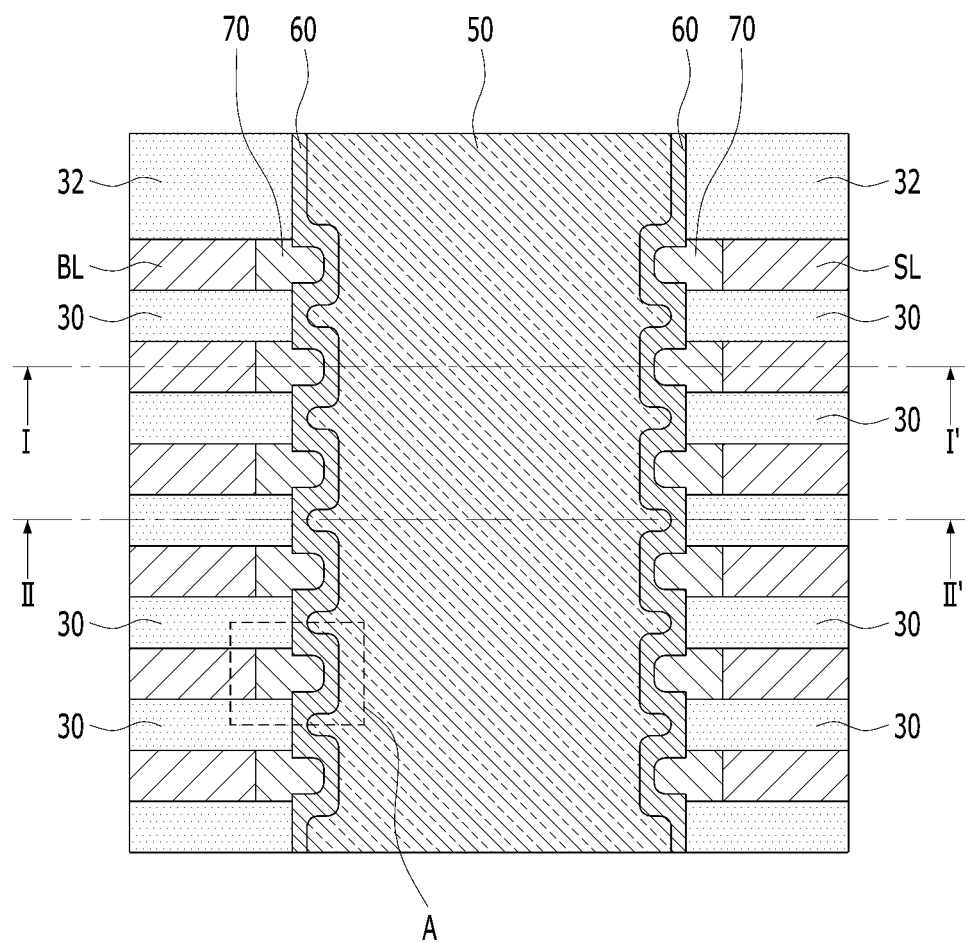
FIG. 7A is a vertical cross-sectional view schematically illustrating a representation of an example of a stack structure of a nonvolatile memory device in accordance with an embodiment of the disclosure.
Figure 7B:
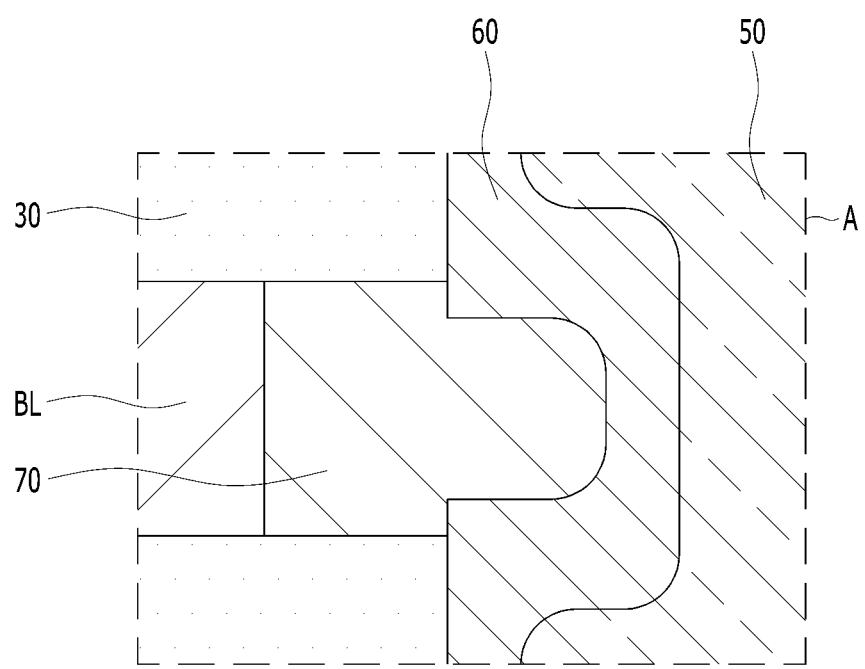
FIG. 7B is an enlarged view of a region A in FIG. 7A.
Figure 7C:
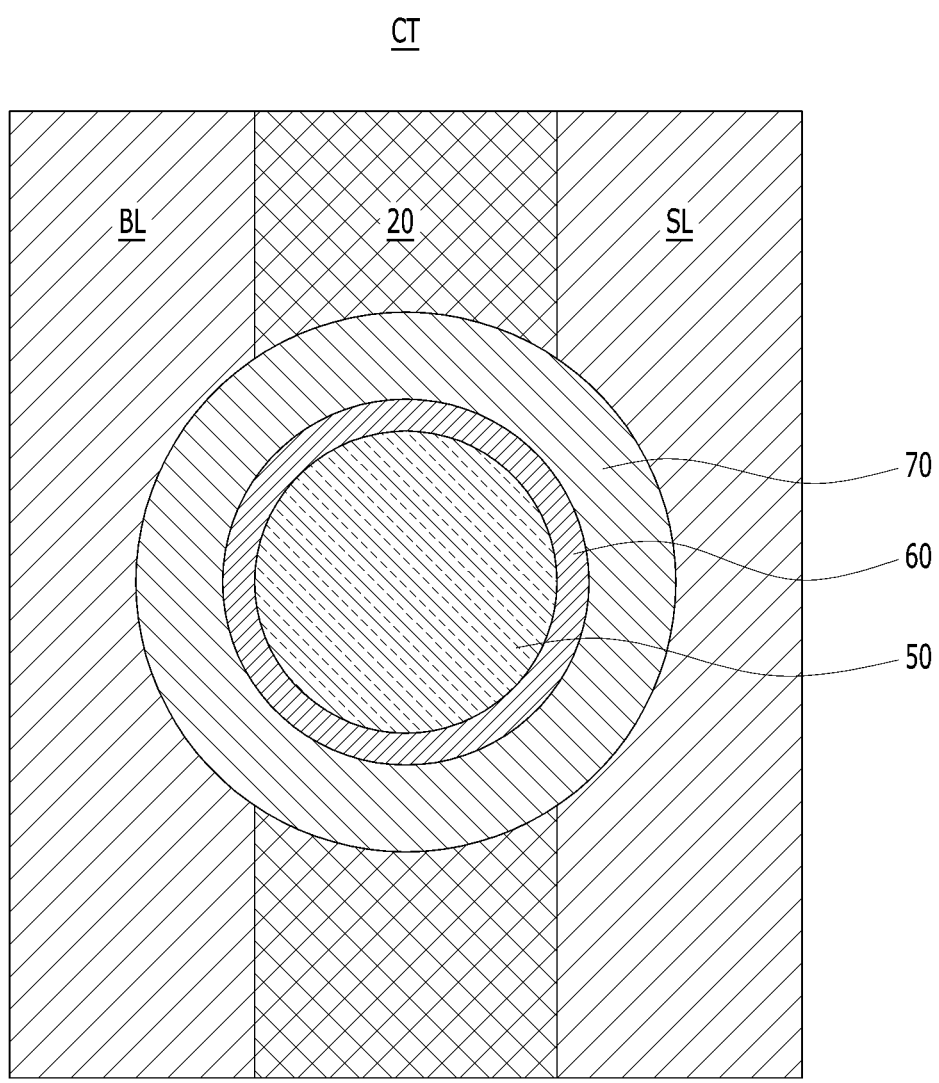
FIG. 7C is a horizontal cross-sectional view taken along the line I-I' of FIG. 7A.
Figure 7D:
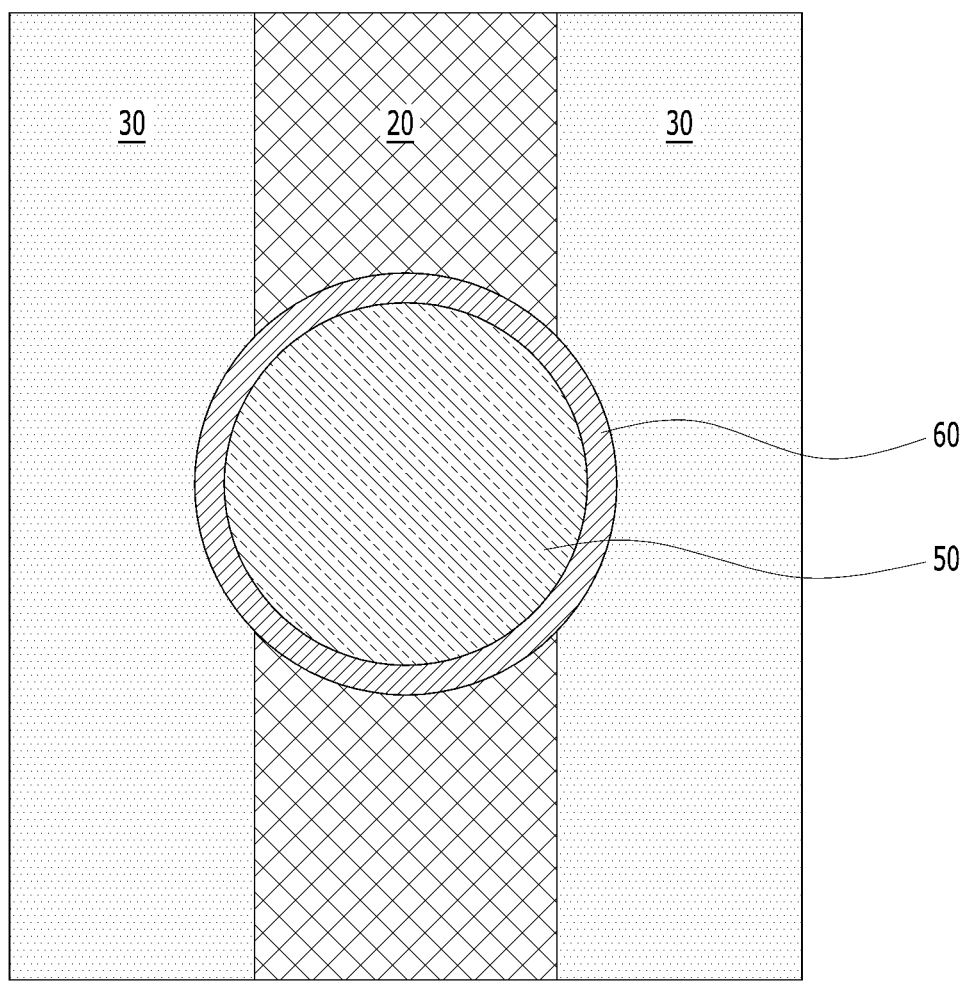
FIG. 7D is a horizontal cross-sectional view taken along the line II-II' of FIG. 7A.

FIG. 7A is a vertical cross-sectional view schematically illustrating a representation of an example of a stack structure of a nonvolatile memory device in accordance with an embodiment of the disclosure, FIG. 7B is an enlarged view of a region A in FIG. 7A, FIG. 7C is a horizontal cross-sectional view taken along the line I-I' of FIG. 7A, and FIG. 7D is a horizontal cross-sectional view taken along the line II-II' of FIG. 7A. Referring to FIGS. 7A to 7D, the nonvolatile memory device in accordance with this embodiment of the disclosure may include a reversed-fin shaped gate electrode 50 and gate dielectric layer 60. In detail, the outer side surface of the common gate electrode 50 of cell transistors CT may have convexes and concaves, or substantially annular grooves. For example, the common gate electrode 50 of the cell transistors CT may have portions which are concavely recessed in a horizontal direction where the common gate electrode 50 is adjacent to individual channel layers 70. The convexes and the concaves may have a circular shape when viewed in a top view.

The gate dielectric layer 60 may be conformally formed on the outer side surface of the common gate electrode 50 along the profile of the outer side surface of the common gate electrode 50. The common gate electrode 50 may have a wave shape, a concavo-convex shape or a zigzag shape when viewed on a vertical cross-sectional view. Referring to FIGS. 3A through 6B, the gate dielectric layer 60 in FIG. 7A may include a first gate dielectric layer 61, a second gate dielectric layer 62 and a third gate dielectric layer 63 in such embodiments.

Portions of the individual channel layers 70 may be formed to be embedded in the recessed concaves, or groove recesses, of the common gate electrode 50. In other words, a portion of the upper surface, a portion of the lower surface and an entire one side surface of each individual channel layer 70 may be brought into contact with the gate dielectric layer 60 in each recessed portion of the common gate electrode 50.

Channel regions may be formed at three positions including the portion of the upper surface, the portion of the lower surface and the one side surface of each individual channel layer 70 which are adjacent to the gate dielectric layer 60.

Figure 8:
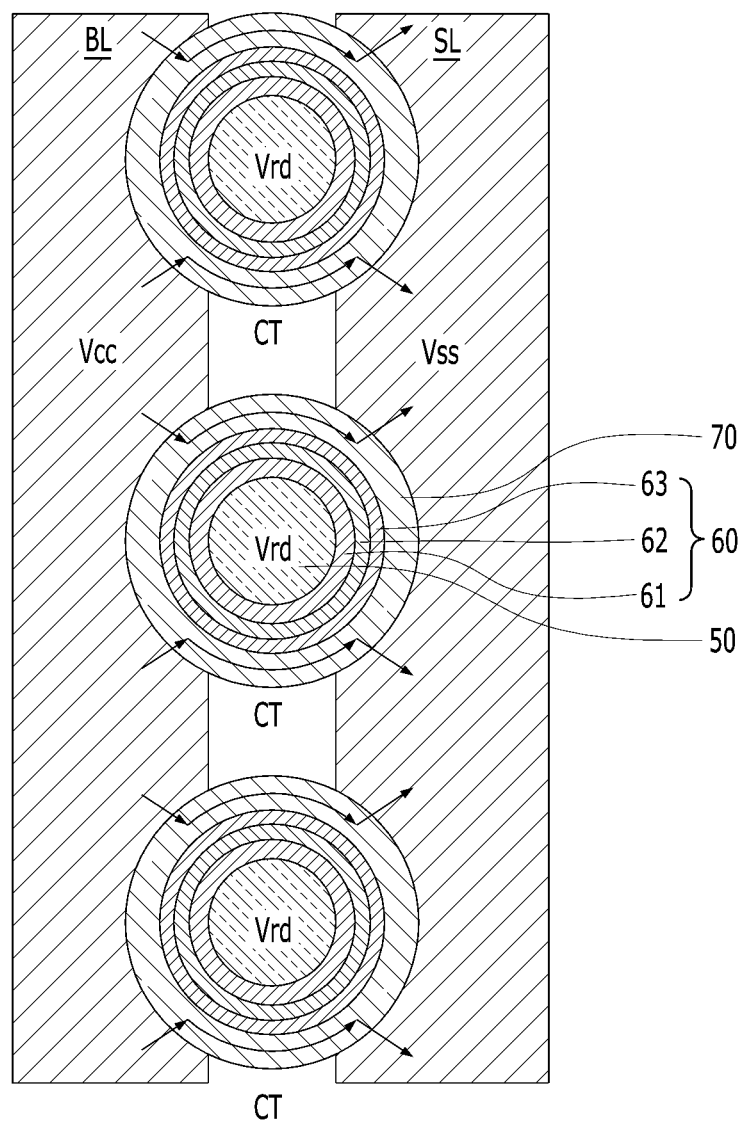
FIG. 8 is a representation of an example of a view to assist in the explanation of the flow of cell currents in a read mode, by using arrows, in cell transistors of a nonvolatile memory device in accordance with an embodiment of the disclosure.

FIG. 8 is a representation of an example of a view to assist in the explanation of the flow of cell currents in a read mode, by using arrows, in cell transistors CT of a nonvolatile memory device in accordance with an embodiment of the disclosure. Referring to FIG. 8, in the read mode, a supply voltage Vcc may be applied to an individual bit line BL, an extraction voltage Vss may be applied to an individual source line SL, and a read voltage Vrd may be applied to common gate electrodes 50 of the cell transistors CT. The supply voltage Vcc may be a relatively high voltage, the extraction voltage Vss may be a relatively low voltage (for example, 0V), and the read voltage Vrd may be a voltage which allows a channel to be formed in a channel layer 70. The supply voltage Vcc may be higher than the read voltage Vrd, but conversely, the read voltage Vrd may be higher than the supply voltage Vcc.

As the read voltage Vrd is applied to the common gate electrodes 50, channels may be formed in individual channel layers 70. Due to this fact, a cell current may flow to the individual source line SL through the channel formed in the individual channel layer 70, from the individual bit line BL. In an embodiment of the disclosure, the cell current may vary depending on an amount of electrons which are trapped in a second gate dielectric layer 62 of a common gate dielectric layer 60 of each cell transistor CT. The electrons which are trapped in the second gate dielectric layer 62 may offset the electric field between the read voltage Vrd and the individual channel layer 70. Therefore, the size of a channel which is generated by the read voltage Vrd may be reduced.

Namely, a channel resistance or a threshold voltage for a channel to be generated may be increased, and the cell current may be reduced.

For example, in the case where the cell transistor CT is strongly programmed, a relatively small amount of electrons may be trapped in the second gate dielectric layer 62. Thus, if the read voltage Vrd is applied to the common gate electrode 50, since an electric field offset effect by trapped electrons is small, a channel may be formed that is relatively wide and large and an amount of a cell current may be relatively large. Conversely, in the case where the cell transistor CT is weakly learned or not programmed, a relatively large amount of electrons may be trapped in the second gate dielectric layer 62. Thus, even though the read voltage Vrd is applied to the common gate electrode 50, since an electric field offset effect by trapped electrons is large, a channel may be formed that is relatively narrow and small and an amount of a cell current may be relatively small. The cell current may be transferred to a logic circuit such as a sense amplifier, an output buffer, an adder or a comparator by the source line SL to be summed or compared. In the present embodiment, the positions and functions of the individual bit line BL and the individual source line SL may be changed with each other, i.e, interchangeable. Also, the supply voltage Vcc and the extraction voltage Vss may be changed with each other.

In the following descriptions, for the sake of convenience in explanation, the common gate electrode 50, the common gate dielectric layer 60, the individual channel layer 70, the individual bit line BL and the individual source line SL will be referred to as a gate electrode 50, a gate dielectric layer 60, a channel layer 70, a bit line BL and a source line SL, respectively.

Figure 9A:
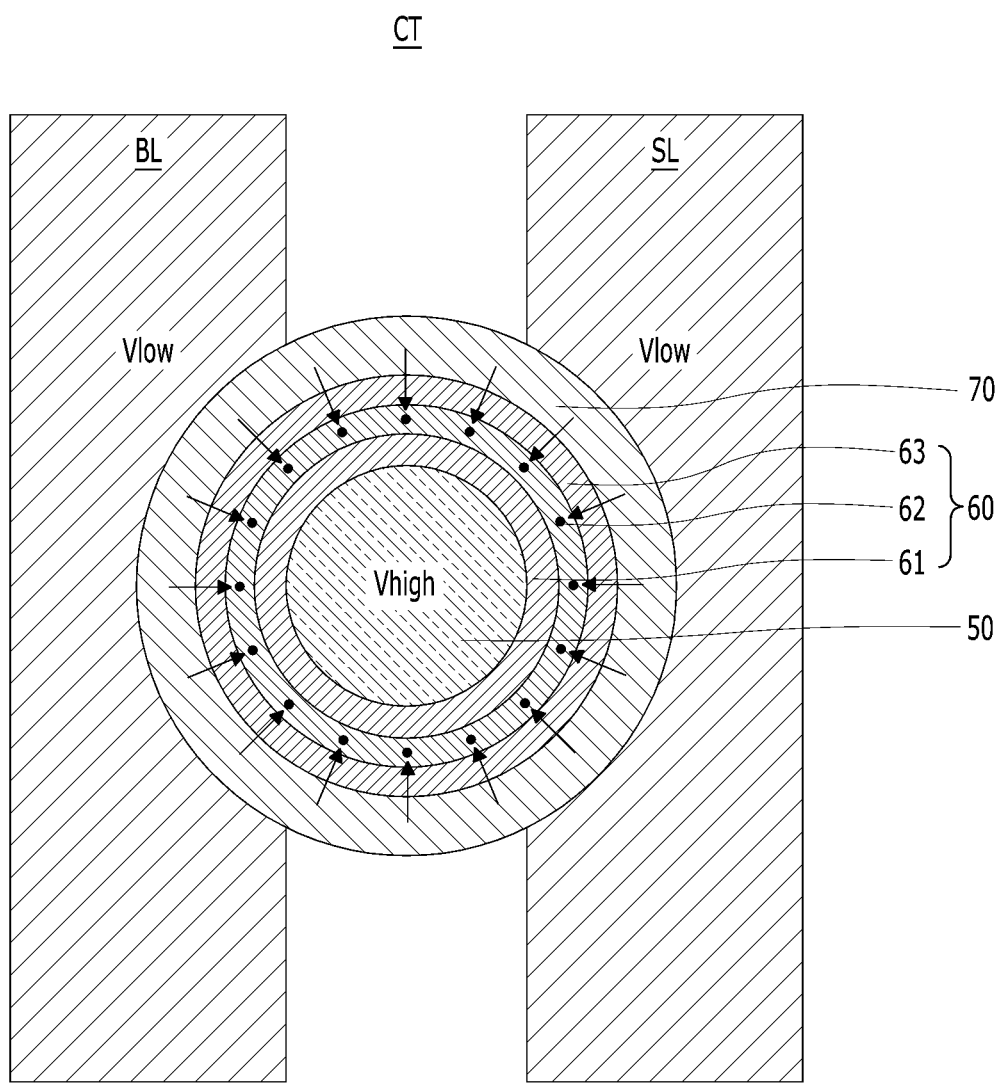
FIGS. 9A and 9B are representations of examples of views to assist in the conceptual explanation of methods of increasing the channel resistance of a cell transistor in a nonvolatile memory device in accordance with embodiments of the disclosure.

FIG. 9A is a representation of an example of a view to assist in the conceptual explanation of a method of increasing the channel resistance of a cell transistor CT in a nonvolatile memory device in accordance with an embodiment of the disclosure (the method may be understood as a method of depressing the synapse of a neuromorphic device). A method of increasing the channel resistance of the cell transistor CT in the case where a first gate dielectric layer 61 is a blocking gate dielectric layer and a third gate dielectric layer 63 is a tunneling gate dielectric layer will be described. The channel resistance of the cell transistor CT may be increased as electrons are stored in a second gate dielectric layer 62. Referring to FIG. 9A, by applying a relatively high voltage Vhigh to a gate electrode 50 of the cell transistor CT and applying a relatively low voltage Vlow to a bit line BL and a source line SL of the cell transistor CT, the channel resistance of the cell transistor CT may be increased. The voltage difference between the high voltage Vhigh and the low voltage Vlow may be larger than a tunneling voltage at which electrons may tunnel through the third gate dielectric layer 63. The same voltage, for example, the low voltage Vlow, may be applied to the bit line BL and the source line SL such that an electric field is not formed between the bit line BL and the source line SL and a current does not flow through a channel layer 70. By the electric field formed between the gate electrode 50 and the bit line BL and the electric field formed between the gate electrode 50 and the source line SL, electrons may tunnel the third gate dielectric layer 63 from the channel layer 70 and may be trapped in the second gate dielectric layer 62. In detail, by the electric field formed between the gate electrode 50 and the channel layer 70, electrons may tunnel the third gate dielectric layer 63 from the channel layer 70 and may be trapped in the second gate dielectric layer 62. The more electrons that are trapped in the second gate dielectric layer 62, the higher the threshold voltage of the channel layer 70 may be. Thus, because it is difficult for a channel to be formed in the channel layer 70, the channel resistance of the cell transistor CT may be increased (that is, the synapse of a neuromorphic device may be depressed).

Figure 9B:
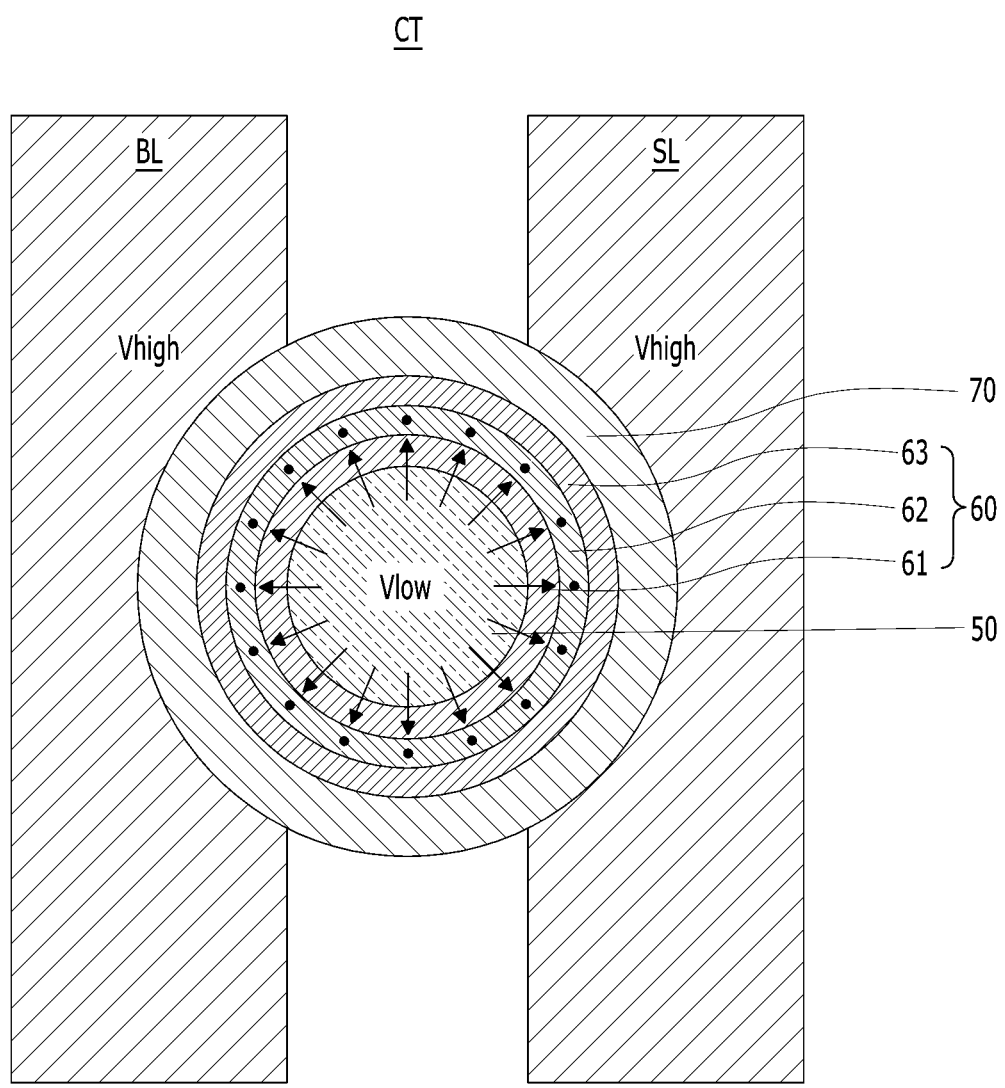

FIG. 9B is a representation of an example of a view to assist in the conceptual explanation of a method of increasing the channel resistance of a cell transistor CT in a nonvolatile memory device in accordance with another embodiment of the disclosure. A method of increasing the channel resistance of the cell transistor CT in the case where a first gate dielectric layer 61 is a tunneling gate dielectric layer and a third gate dielectric layer 63 is a blocking gate dielectric layer will be described. Referring to FIG. 9B, by applying a relatively low voltage Vlow to a gate electrode 50 of the cell transistor CT and applying a relatively high voltage Vhigh to a bit line BL and a source line SL of the cell transistor CT, the channel resistance of the cell transistor CT may be increased. The same voltage Vhigh may be applied to the bit line BL and the source line SL such that a current does not flow between the bit line BL and the source line SL. That is to say, the voltage difference between the relatively high voltage Vhigh and the relatively low voltage Vlow may be higher than a tunneling voltage such that a tunneling operation may occur. By the electric fields formed between the bit line BL and the gate electrode 50, and between the source line SL and the gate electrode 50, that is, by the electric field formed between a channel layer 70 and the gate electrode 50, electrons may tunnel through the first gate dielectric layer 61 from the gate electrode 50 and may be trapped in the second gate dielectric layer 62.

Figure 10A:
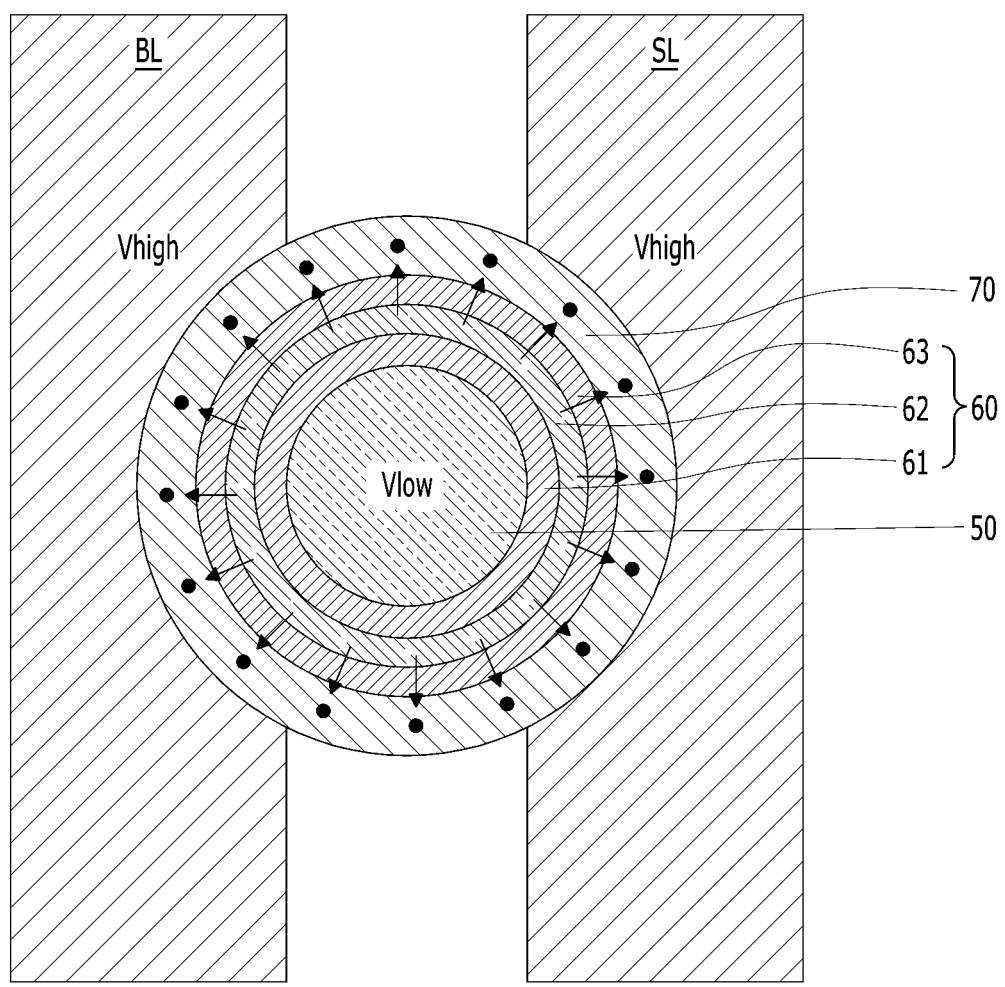
FIGS. 10A and 10B are representations of examples of views to assist in the conceptual explanation of methods of reducing the channel resistance of a cell transistor in a nonvolatile memory device in accordance with embodiments of the disclosure.

FIG. 10A is a representation of an example of a view to assist in the conceptual explanation of a method of reducing the channel resistance of a cell transistor CT in a nonvolatile memory device in accordance with an embodiment of the disclosure (the method may be understood as a method of potentiating the synapse of a neuromorphic device). A method of reducing the channel resistance of the cell transistor CT in the case where a first gate dielectric layer 61 is a blocking gate dielectric layer and a third gate dielectric layer 63 is a tunneling gate dielectric layer will be described. Referring to FIG. 10A, by applying a relatively low voltage Vlow to a gate electrode 50 of the cell transistor CT and applying a relatively high voltage Vhigh to a bit line BL and a source line SL of the cell transistor CT, the channel resistance of the cell transistor CT may be reduced. The same voltage, for example, the high voltage Vhigh, may be applied to the bit line BL and the source line SL such that a current does not flow through a channel layer 70 between the bit line BL and the source line SL. By the electric field formed between the bit line BL and the gate electrode 50, and the electric field formed between the source line SL and the gate electrode 50, electrons which are trapped in a second gate dielectric layer 62 may tunnel the third gate dielectric layer 63 and may be discharged to the channel layer 70. In detail, by the electric field formed between the channel layer 70 and the gate electrode 50, electrons which are trapped in the second gate dielectric layer 62 may tunnel through the third gate dielectric layer 63 and may be discharged to the channel layer 70. The fewer electrons that are in the second gate dielectric layer 62, the lower the threshold voltage of the channel layer 70. Thus, because it is easy for a channel to be formed and widened in the channel layer 70, the channel resistance of the cell transistor CT may be reduced (that is, the synapse of a neuromorphic device may be potentiated).

Figure 10B:
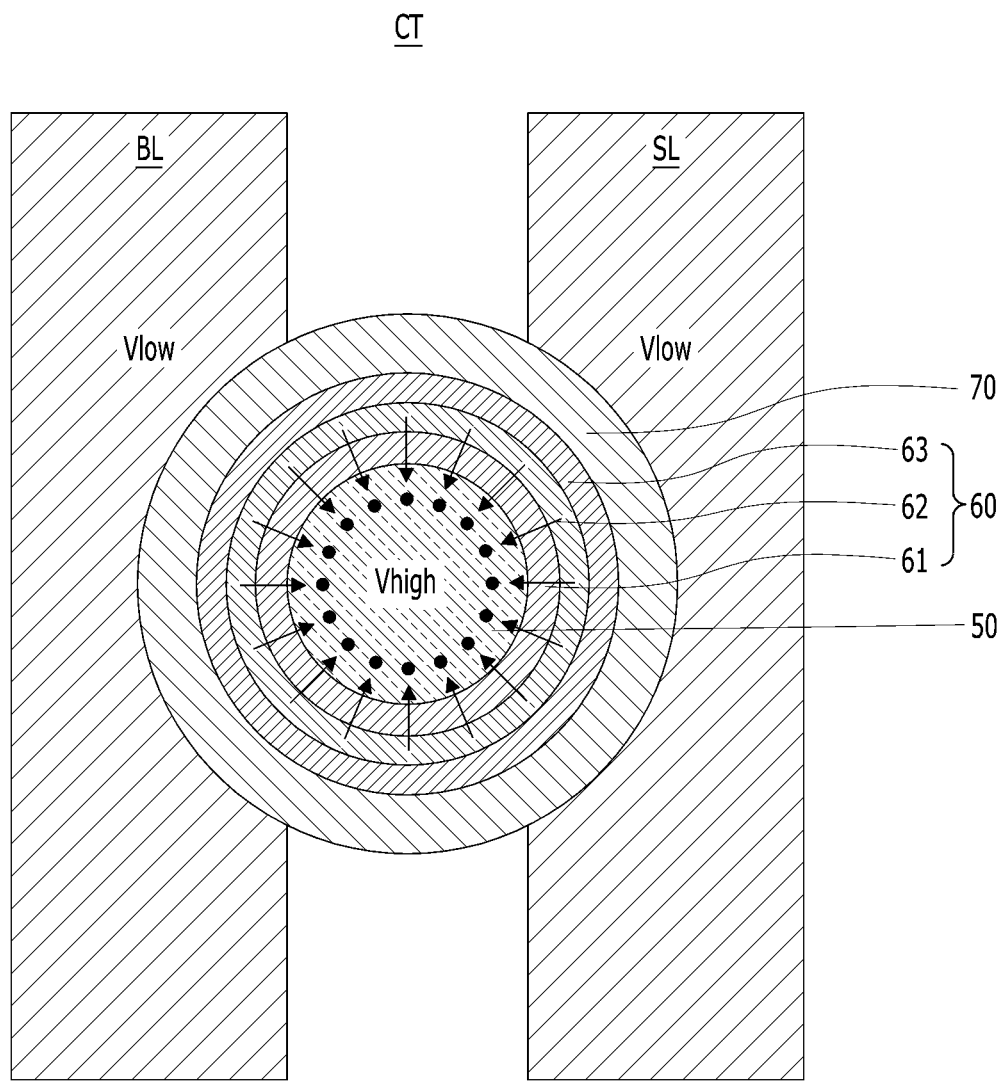

FIG. 10B is a representation of an example of a view to assist in the conceptual explanation of a method of reducing the channel resistance of a cell transistor CT in a nonvolatile memory device in accordance with another embodiment of the disclosure. A method of reducing the channel resistance of the cell transistor CT in the case where a first gate dielectric layer 61 is a tunneling gate dielectric layer and a third gate dielectric layer 63 is a blocking gate dielectric layer will be described. Referring to FIG. 10B, by applying a relatively high voltage Vhigh to a gate electrode 50 of the cell transistor CT and applying a relatively low voltage Vlow to a bit line BL and a source line SL of the cell transistor CT, the channel resistance of the cell transistor CT may be reduced. The same voltage Vlow may be applied to the bit line BL and the source line SL such that a current does not flow through a channel layer 70 between the bit line BL and the source line SL. That is to say, the voltage difference between the relatively high voltage Vhigh and the relatively low voltage Vlow may be higher than a tunneling voltage such that a tunneling operation may occur. By the electric field formed between the gate electrode 50 and the bit line BL, and the electric field formed between the gate electrode 50 and the source line SL, electrons may tunnel the first gate dielectric layer 61 from a second gate dielectric layer 62 and may be discharged to the gate electrode 50. In other words, by the electric field formed between the gate electrode 50 and the channel layer 70, electrons may tunnel through the first gate dielectric layer 61 from the second gate dielectric layer 62 and may be discharged into the gate electrode 50.

In the following descriptions, changing the channel resistance of a cell transistor CT will be expressed as "programming the cell transistor CT," and not changing the channel resistance of a cell transistor CT will be expressed as "inhibiting the cell transistor CT." Namely, a programmed cell transistor CT refers to a cell transistor CT in which the channel resistance is changed, and an inhibited cell transistor CT refers to a cell transistor CT in which the channel resistance is not changed. Moreover, in detail, in some embodiments, implanting electrons into a second gate dielectric layer 62 may be termed as "program," and discharging electrons from a second gate dielectric layer 62 may be termed as "erase."

Figure 11A:
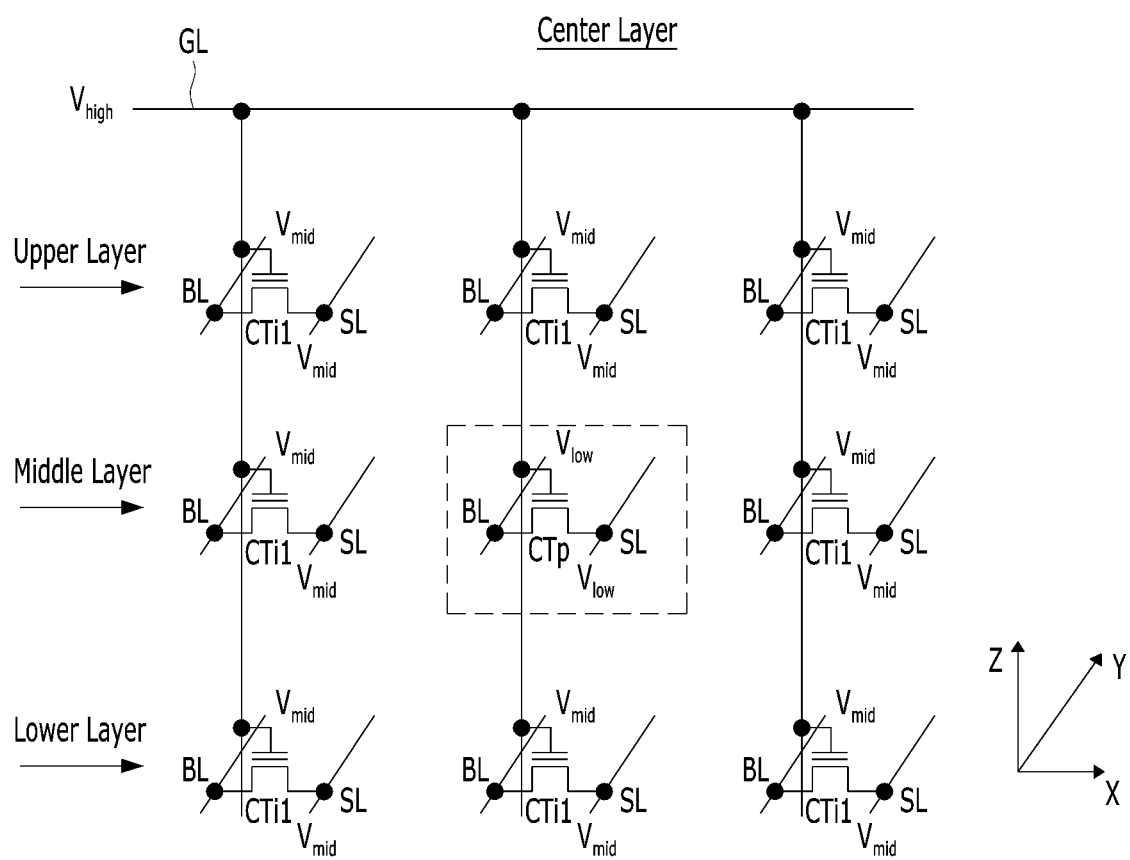
FIGS. 11A and 11B are representations of examples of schematic circuit diagrams of a cell array of a nonvolatile memory device to assist in the conceptual explanation of a method of programming a specific one-cell transistor in accordance with an embodiment of the disclosure.
Figure 11B:
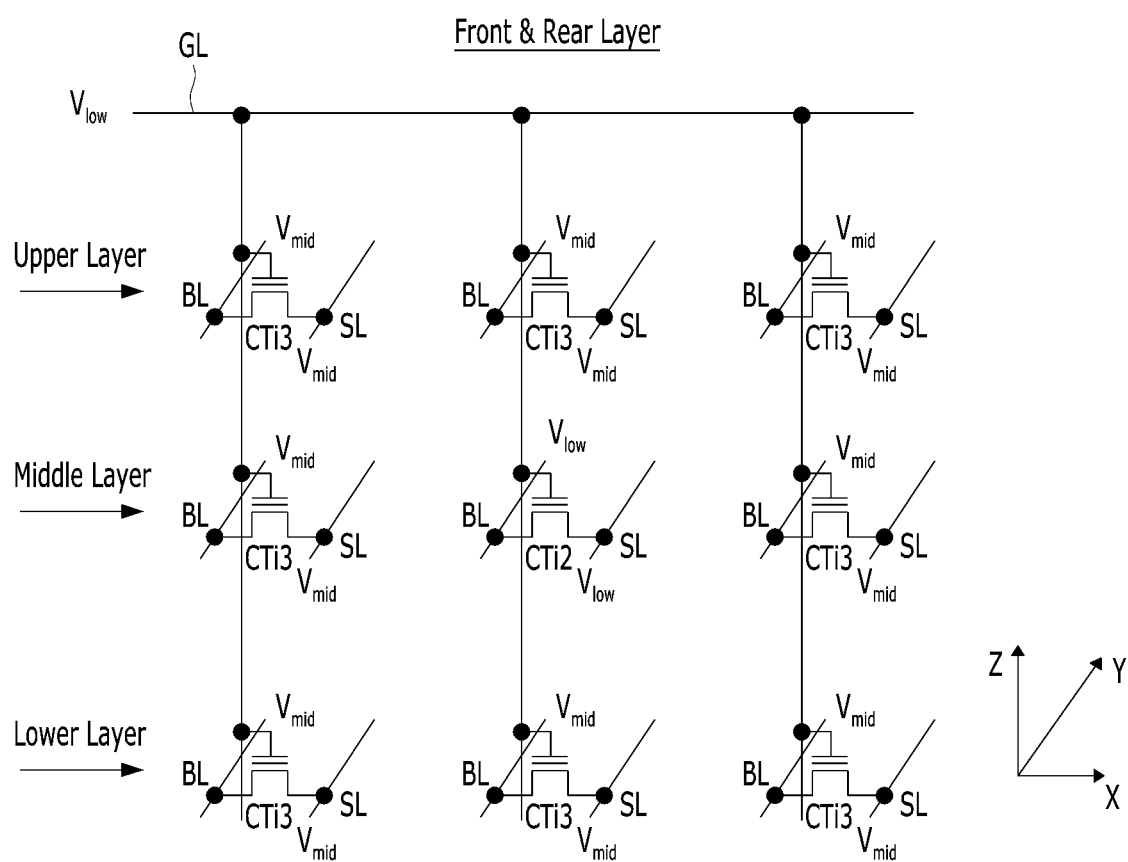
Figure 12A:
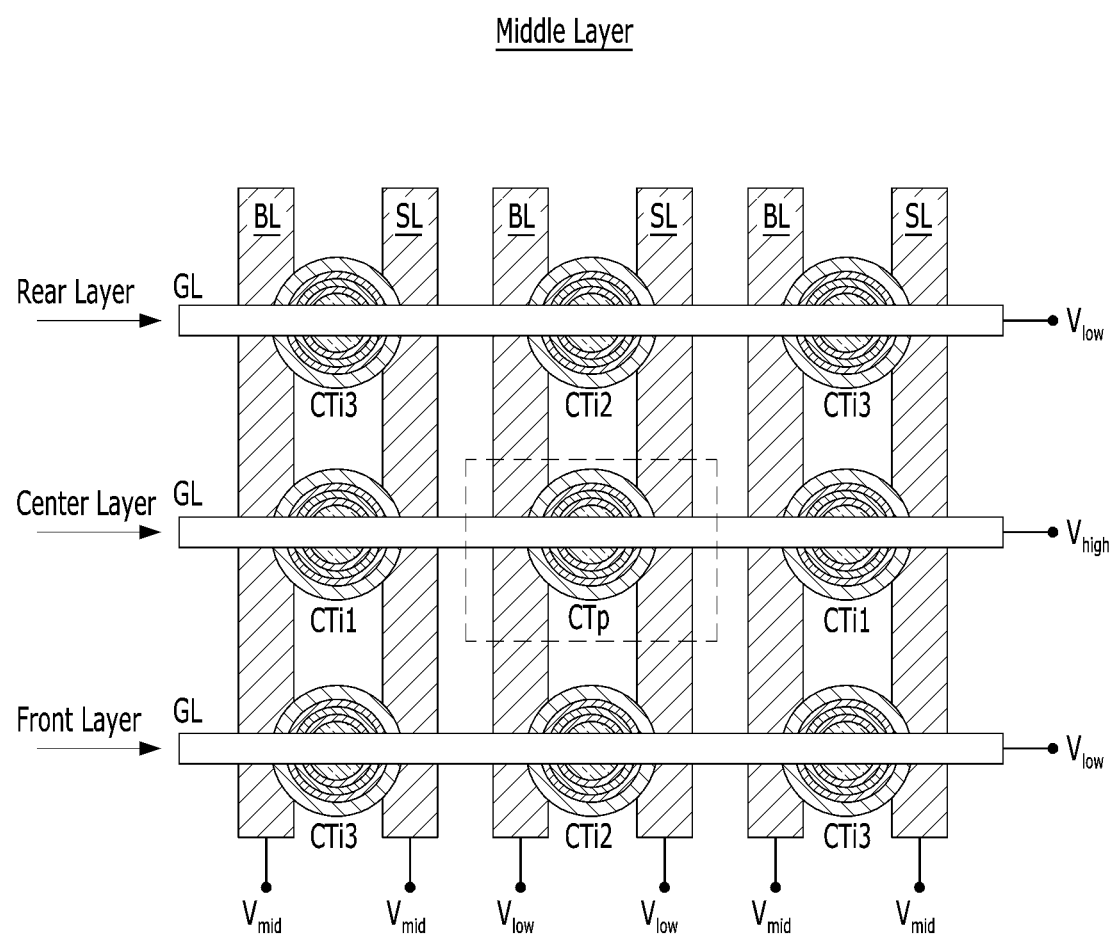
FIGS. 12A and 12B are schematic horizontal cross-sectional views of the cell array of the nonvolatile memory device.
Figure 12B:
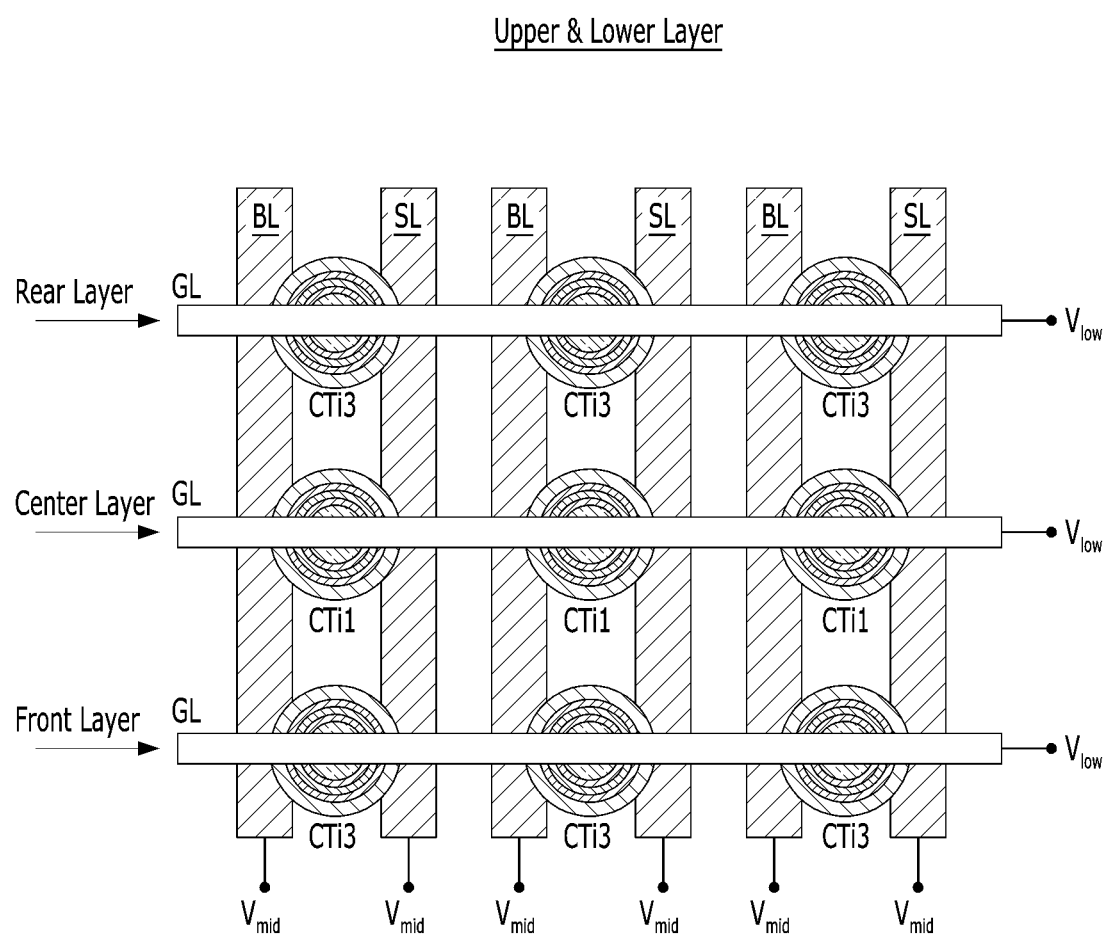

FIGS. 11A and 11B are representations of examples of schematic circuit diagrams of a cell array of a nonvolatile memory device to assist in the conceptual explanation of a method of programming a specific cell transistor CTp in accordance with an embodiment of the disclosure, and FIGS. 12A and 12B are schematic horizontal cross-sectional views of the cell array of the nonvolatile memory device. FIG. 11A illustrates a center layer where the cell transistor CTp to be programmed and cell transistors CTi1 to be inhibited are disposed, FIG. 11B illustrates a front layer and a rear layer where cell transistors CTi2 and CTi3 to be inhibited are disposed, FIG. 12A illustrates a middle layer where the cell transistor CTp to be programmed and cell transistors CTi1, CTi2 and CTi3 to be inhibited are disposed, and FIG. 12B illustrates a lower layer and an upper layer where cell transistors CTi1 and CTi3 to be inhibited are disposed. Programming the cell transistor CTp may mean increasing the channel resistance of the cell transistor CTp or the threshold voltage of a channel. For example, and additionally referring to FIG. 9A, the fact that, in the case that will be described in which a first gate dielectric layer 61 of the cell transistor CTp is a blocking gate dielectric layer and a third gate dielectric layer 63 of the cell transistor CTp is a tunneling gate dielectric layer, and in which electrons tunnel through the third gate dielectric layer 63 from a channel layer 70 and are trapped in a second gate dielectric layer 62. The channel resistance or the threshold voltage of the channel layer 70 may be increased. In other words, depression of a synapse of a neuromorphic device will be described.

Referring to FIGS. 11A, 11B, 12A and 12B, the method of programming the specific one-cell transistor CTp in accordance with an embodiment of the disclosure may include applying a relatively high voltage Vhigh to a gate line GL which is coupled with a gate electrode 50 of the cell transistor CTp to be programmed and applying a relatively low voltage Vlow to a bit line BL and a source line SL of the cell transistor CTp to be programmed. The voltage difference between the high voltage Vhigh and the low voltage Vlow may be larger than a minimum voltage difference that may cause a tunneling phenomenon of electrons to occur at the third gate dielectric layer 63 as the tunneling gate dielectric layer of a gate dielectric layer 60 of the cell transistor CTp to be programmed. That is to say, by the voltage difference between the high voltage Vhigh and the low voltage Vlow, a tunneling phenomenon of electrons may occur at the third gate dielectric layer 63 of the gate dielectric layer 60 of the cell transistor CTp to be programmed.

Referring to FIGS. 11A and 12A, among the cell transistors CTi1, CTi2 and CTi3 to be inhibited which are disposed in the center layer and the middle layer, a middle voltage Vmid may be applied to bit lines BL and source lines SL of the cell transistors CTi1 to be inhibited, which have gate electrodes 50 coupled with the gate line GL, which in turn is coupled with the gate electrode 50 of the cell transistor CTp to be programmed. In other words, among the cell transistors CTp and CTi1 which share the same gate line GL, the low voltage Vlow may be applied to the bit line BL and the source line SL of the cell transistor CTp to be programmed, and the middle voltage Vmid may be applied to the bit lines BL and the source lines SL of the cell transistors CTi1 to be inhibited. The voltage difference between the high voltage Vhigh and the middle voltage Vmid may be sufficiently smaller than a voltage difference that may cause tunneling of electrons.

Referring to FIGS. 11B and 12B, the low voltage Vlow may be applied to gate electrodes 50 of the cell transistors CTi2 to be inhibited, which share the bit line BL and the source line SL with the cell transistor CTp to be programmed. In succession, the low voltage Vlow may be applied to gate electrodes 50 (or gate lines GL) of the cell transistors CTi3 to be inhibited, which do not share any one among a gate line GL, a bit line BL and a source line SL with the cell transistor CTp to be programmed, and the middle voltage Vmid may be applied to bit lines BL and source lines SL of the cell transistors CTi3 to be inhibited. The voltage difference between the gate electrodes 50 and the bit lines BL of the cell transistors CTi3 to be inhibited, or between the gate electrodes 50 and the source lines SL of the cell transistors CTi3 to be inhibited, may be sufficiently smaller than the voltage difference between the high voltage Vhigh and the low voltage Vlow. Consequently, a tunneling phenomenon does not occur at the gate dielectric layers 60 of the cell transistors CTi3 to be inhibited.

In this embodiment, and additionally referring to FIG. 10B, in another case in which the first gate dielectric layer 61 of the cell transistor CTp is a tunneling gate dielectric layer and the third gate dielectric layer 63 of the cell transistor CTp is a blocking gate dielectric layer, electrons may tunnel the first gate dielectric layer 61 from the second gate dielectric layer 62 to the gate electrode 50. In this case, the channel resistance or the threshold voltage of the channel layer 70 may be reduced. Namely, in the case where the first gate dielectric layer 61 of the cell transistor CTp is a tunneling gate dielectric layer and the third gate dielectric layer 63 of the cell transistor CTp is a blocking gate dielectric layer, the synapse of a neuromorphic device may be potentiated.

Figure 13A:
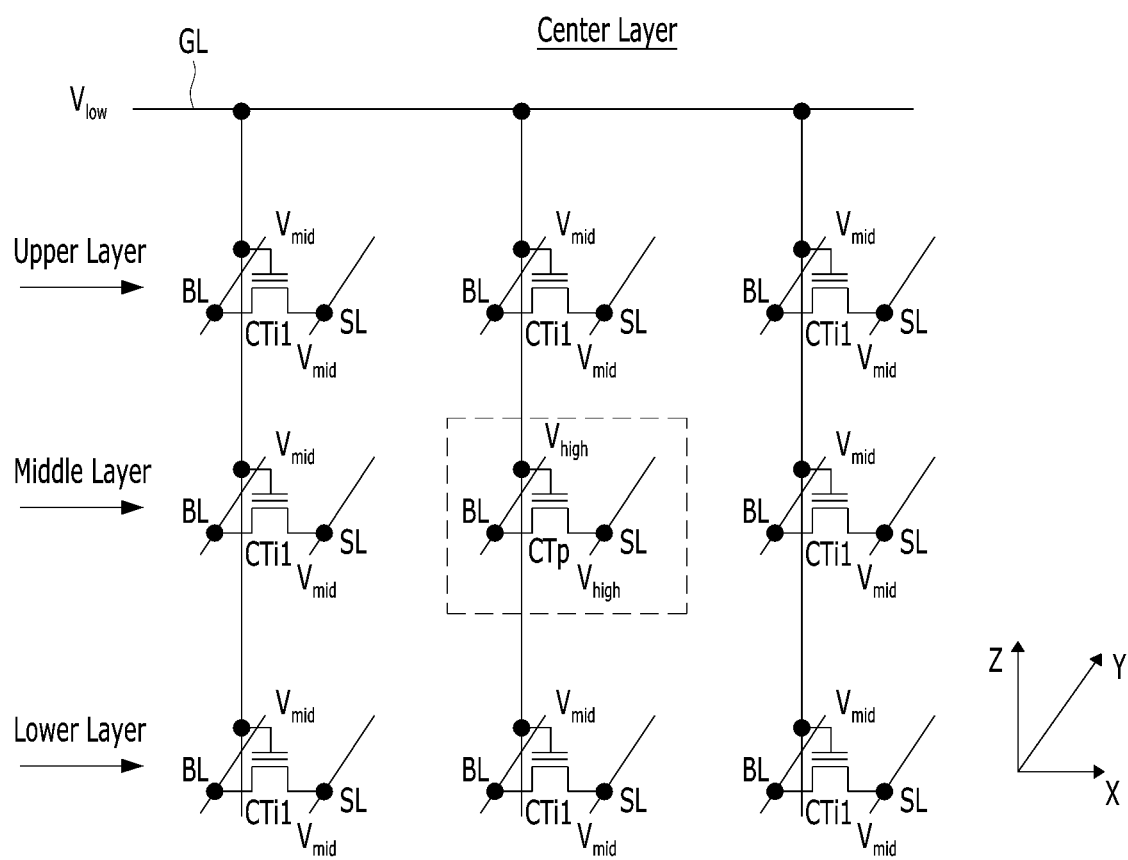
FIGS. 13A and 13B are representations of examples of schematic circuit diagrams of a cell array of a nonvolatile memory device to assist in the conceptual explanation of a method of programming a specific one-cell transistor in accordance with an embodiment of the disclosure.
Figure 13B:
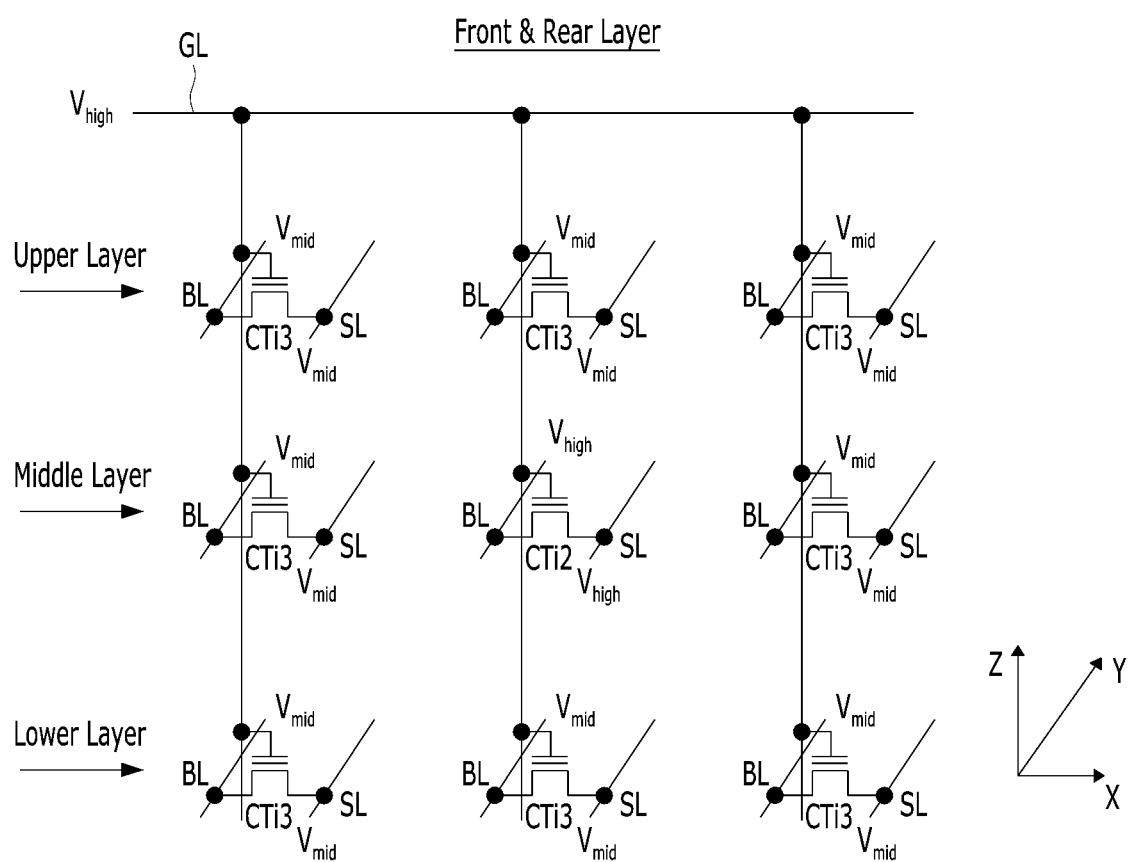
Figure 14A:
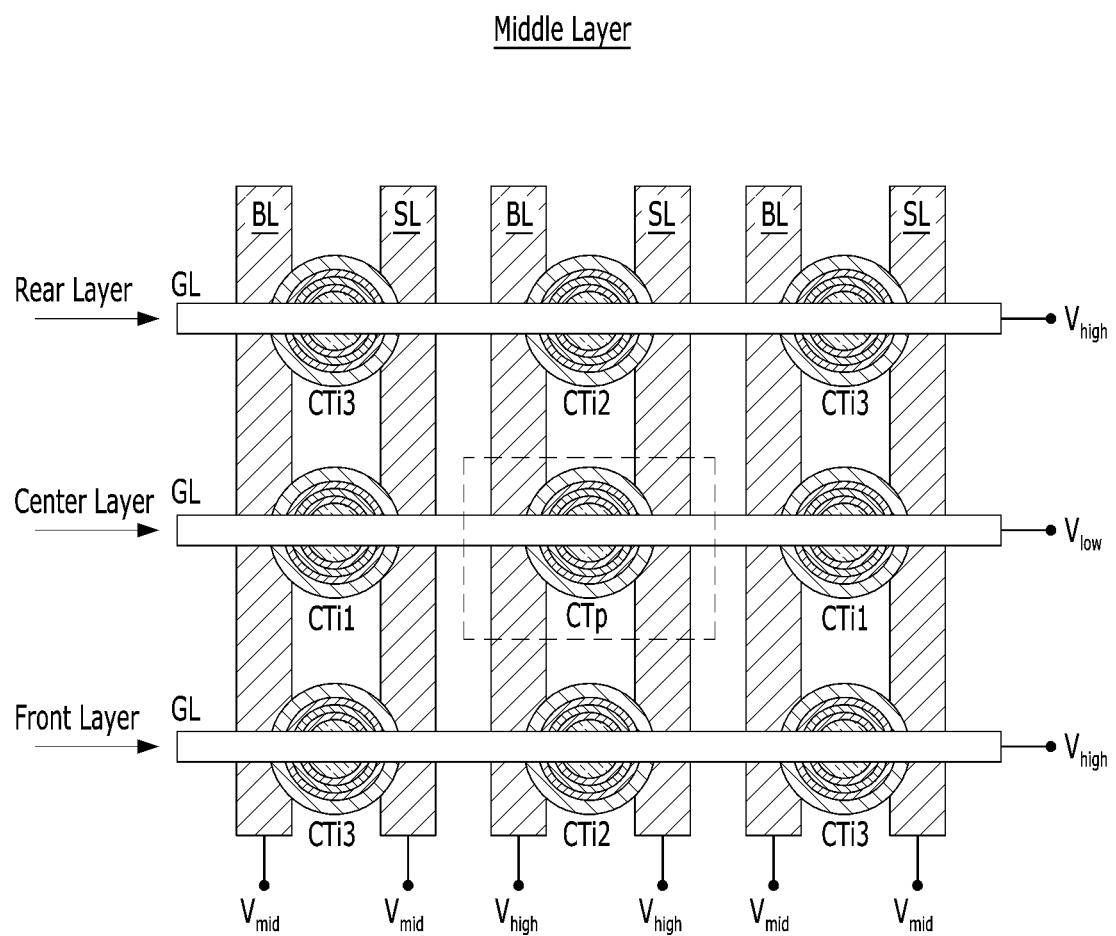
FIGS. 14A and 14B are schematic horizontal cross-sectional views of the cell array of the nonvolatile memory device.
Figure 14B:
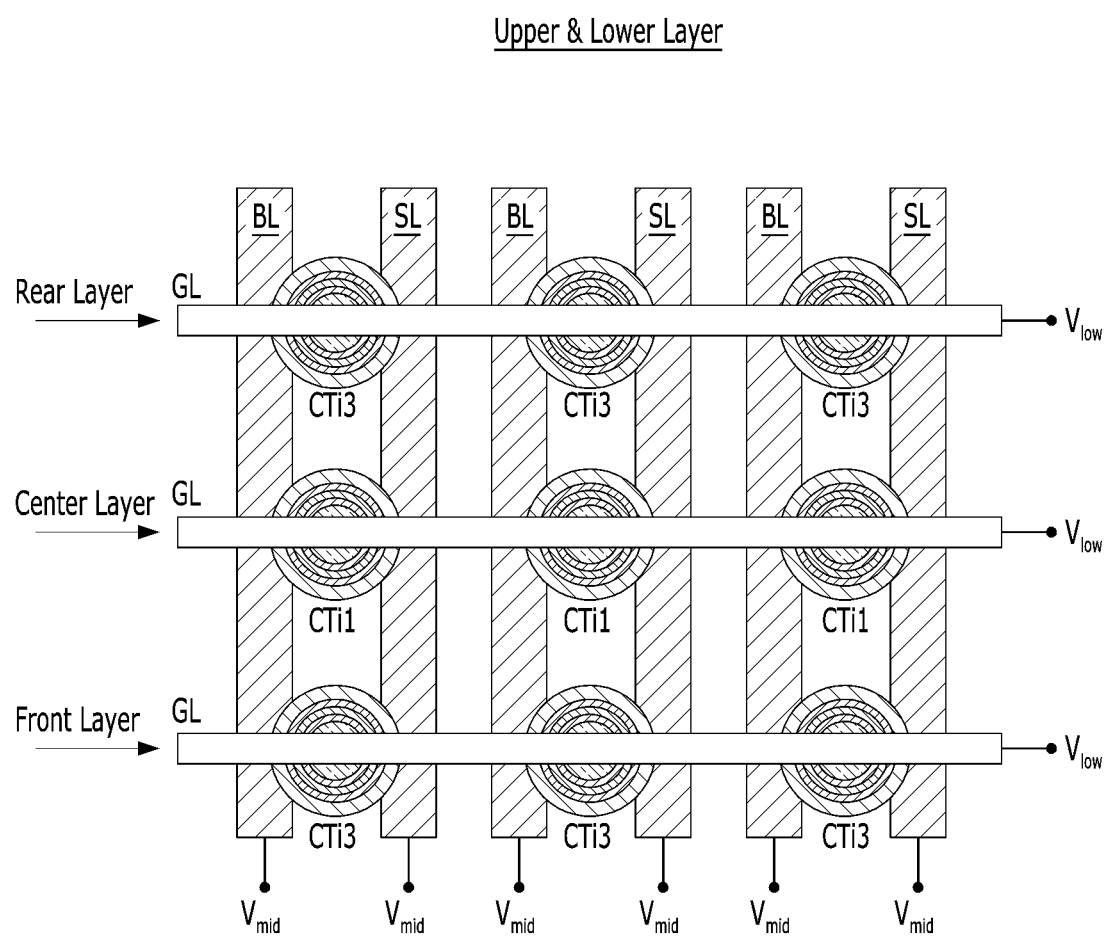

FIGS. 13A and 13B are representations of examples of schematic circuit diagrams of a cell array of a nonvolatile memory device to assist in the conceptual explanation of a method of programming a specific one-cell transistor CTp in accordance with an embodiment of the disclosure, and FIGS. 14A and 14B are schematic horizontal cross-sectional views of the cell array of the nonvolatile memory device. FIG. 13A illustrates a center layer where the cell transistor CTp to be programmed and cell transistors CTi1 to be inhibited are disposed, FIG. 13B illustrates a front layer and a rear layer where cell transistors CTi2 and CTi3 to be inhibited are disposed, FIG. 14A illustrates a middle layer where the cell transistor CTp to be programmed and cell transistors CTi1, CTi2 and CTi3 to be inhibited are disposed, and FIG. 14B illustrates a lower layer and an upper layer where cell transistors CTi1 and CTi3 to be inhibited are disposed. Programming the cell transistor CTp may mean increasing the channel resistance of the cell transistor CTp or the threshold voltage of a channel. For example, and additionally referring to FIG. 9B, an example will be described in which a first gate dielectric layer 61 of the cell transistor CTp is a tunneling gate dielectric layer and a third gate dielectric layer 63 of the cell transistor CTp is a blocking gate dielectric layer, and in which electrons tunnel through the first gate dielectric layer 61 from a gate electrode 50 and are trapped in a second gate dielectric layer 62. The channel resistance or the threshold voltage of a channel layer 70 may be increased. In other words, the fact that the synapse of a neuromorphic device is depressed will be described.

Referring to FIGS. 13A, 13B, 14A and 14B, the method of programming the specific one-cell transistor CTp in accordance with an embodiment of the disclosure may include applying a relatively low voltage Vlow to a gate line GL which is coupled with a gate electrode 50 of the cell transistor CTp to be programmed and applying a relatively high voltage Vhigh to a bit line BL and a source line SL of the cell transistor CTp to be programmed. As aforementioned, the voltage difference between the high voltage Vhigh and the low voltage Vlow may be larger than a minimum voltage difference that may cause a tunneling phenomenon of electrons to occur at the first gate dielectric layer 61 as the tunneling gate dielectric layer of a gate dielectric layer 60 of the cell transistor CTp to be programmed. That is to say, by the voltage difference between the high voltage Vhigh and the low voltage Vlow, a tunneling phenomenon of electrons may occur at the first gate dielectric layer 61 of the gate dielectric layer 60 of the cell transistor CTp to be programmed.

Referring to FIGS. 13A and 14A, among the cell transistors CTi1, CTi2 and CTi3 to be inhibited which are disposed in the center layer and the middle layer, a middle voltage Vmid may be applied to bit lines BL and source lines SL of the cell transistors CTi1 to be inhibited which have gate electrodes 50 coupled with the gate line GL, which in turn is coupled with the gate electrode 50 of the cell transistor CTp to be programmed. In other words, among the cell transistors CTp and CTi1 which share the same gate line GL, the high voltage Vhigh may be applied to the bit line BL and the source line SL of the cell transistor CTp to be programmed, and the middle voltage Vmid may be applied to the bit lines BL and the source lines SL of the cell transistors CTi1 to be inhibited. The voltage difference between the high voltage Vhigh and the middle voltage Vmid may be sufficiently smaller than a voltage difference that may cause tunneling of electrons.

Referring to FIGS. 13B and 14B, the high voltage Vhigh may be applied to gate electrodes 50 of the cell transistors CTi2 to be inhibited, which share the bit line BL and the source line SL with the cell transistor CTp to be programmed. In succession, the high voltage Vhigh may be applied to gate electrodes 50 (or gate lines GL) of the cell transistors CTi3 to be inhibited, which do not share any one among a gate line GL, a bit line BL and a source line SL with the cell transistor CTp to be programmed, and the middle voltage Vmid may be applied to bit lines BL and source lines SL of the cell transistors CTi3 to be inhibited. The voltage difference between the gate electrodes 50 and the bit lines BL of the cell transistors CTi3 to be inhibited or between the gate electrodes 50 and the source lines SL of the cell transistors CTi3 to be inhibited may be sufficiently smaller than the voltage difference between the high voltage Vhigh and the low voltage Vlow. A tunneling phenomenon does not occur at the gate dielectric layers 60 of the cell transistors CTi3 to be inhibited.

In this embodiment, and additionally referring to FIG. 10A, in the case in which the first gate dielectric layer 61 of the cell transistor CTp is a blocking gate dielectric layer and the third gate dielectric layer 63 of the cell transistor CTp is a tunneling gate dielectric layer, electrons may tunnel the third gate dielectric layer 63 from the second gate dielectric layer 62 to the channel layer 70. In this case, the channel resistance or the threshold voltage of the channel layer 70 may be reduced. Namely, in the case where the first gate dielectric layer 61 of the cell transistor CTp is a blocking gate dielectric layer and the third gate dielectric layer 63 of the cell transistor CTp is a tunneling gate dielectric layer, the synapse of a neuromorphic device may be potentiated.

In the present embodiment, the high voltage Vhigh, the middle voltage Vmid and the low voltage Vlow may mean relative voltage levels. For example, in the case where the high voltage Vhigh is 0V or a negative (−) voltage, the middle voltage Vmid and the low voltage Vlow may be further negative (−) voltages. Also, in the case where the middle voltage Vmid is 0V, the high voltage Vhigh may be a positive (+) voltage and the low voltage Vlow may be a negative (−) voltage. Moreover, in the case where the low voltage Vlow is 0V, the middle voltage Vmid and the high voltage Vhigh may be positive (+) voltages.

Figure 15A:
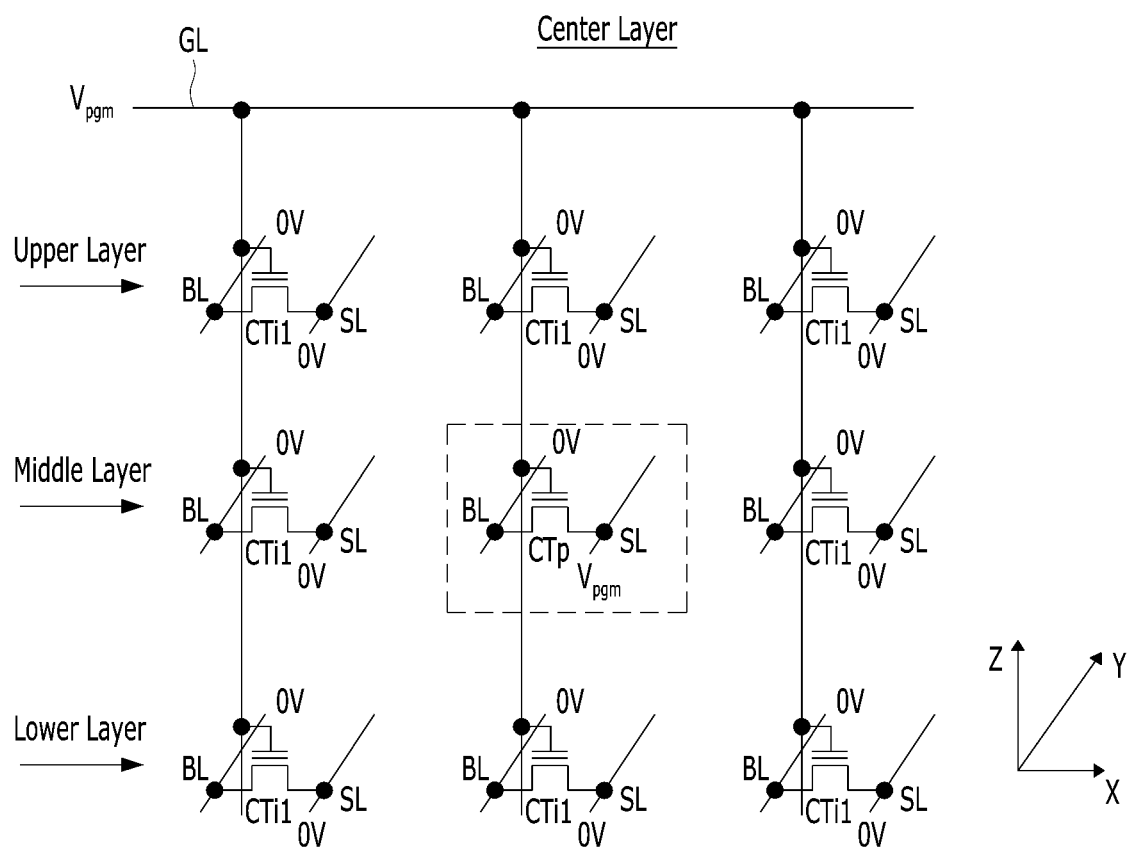
FIGS. 15A and 15B are representations of examples of schematic circuit diagrams of a cell array of a nonvolatile memory device to assist in the conceptual explanation of a method of programming a specific one-cell transistor in accordance with an embodiment of the disclosure.
Figure 15B:
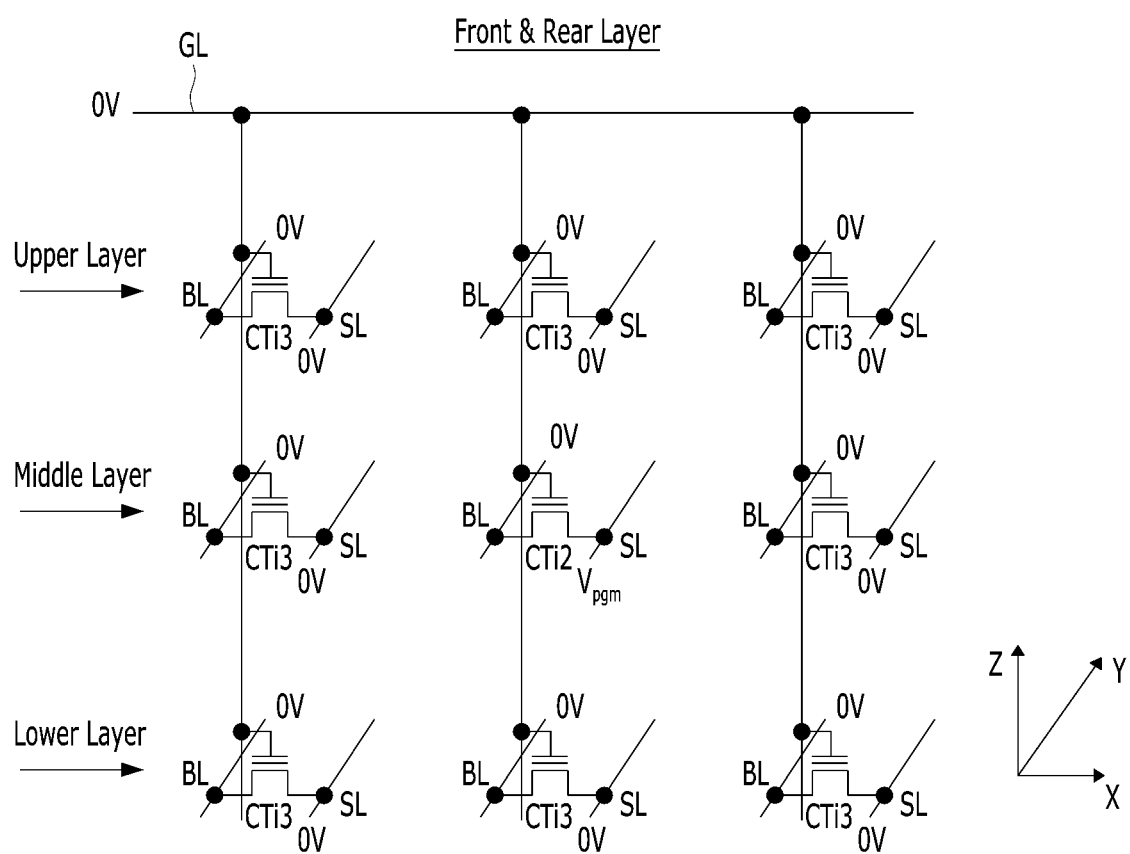
Figure 16A:
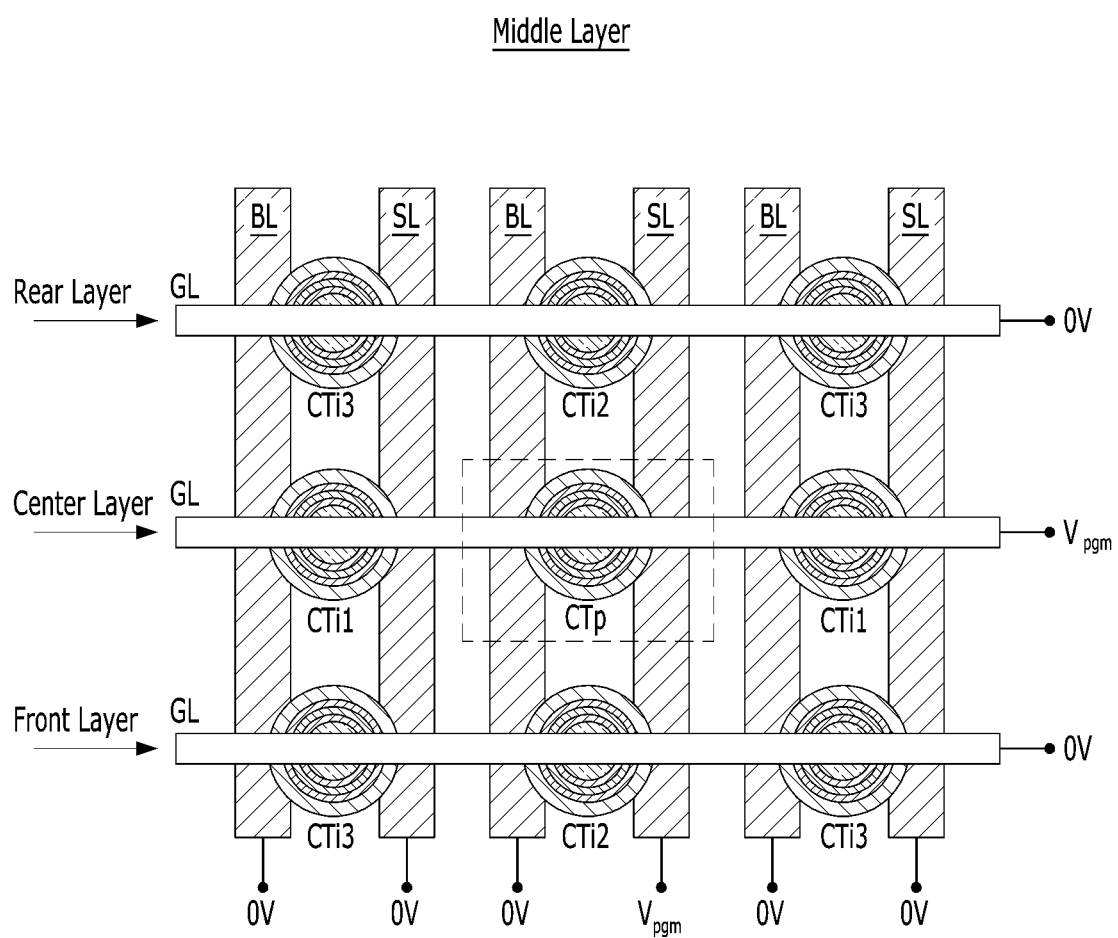
FIGS. 16A and 16B are schematic horizontal cross-sectional views of the cell array of the nonvolatile memory device.
Figure 16B:
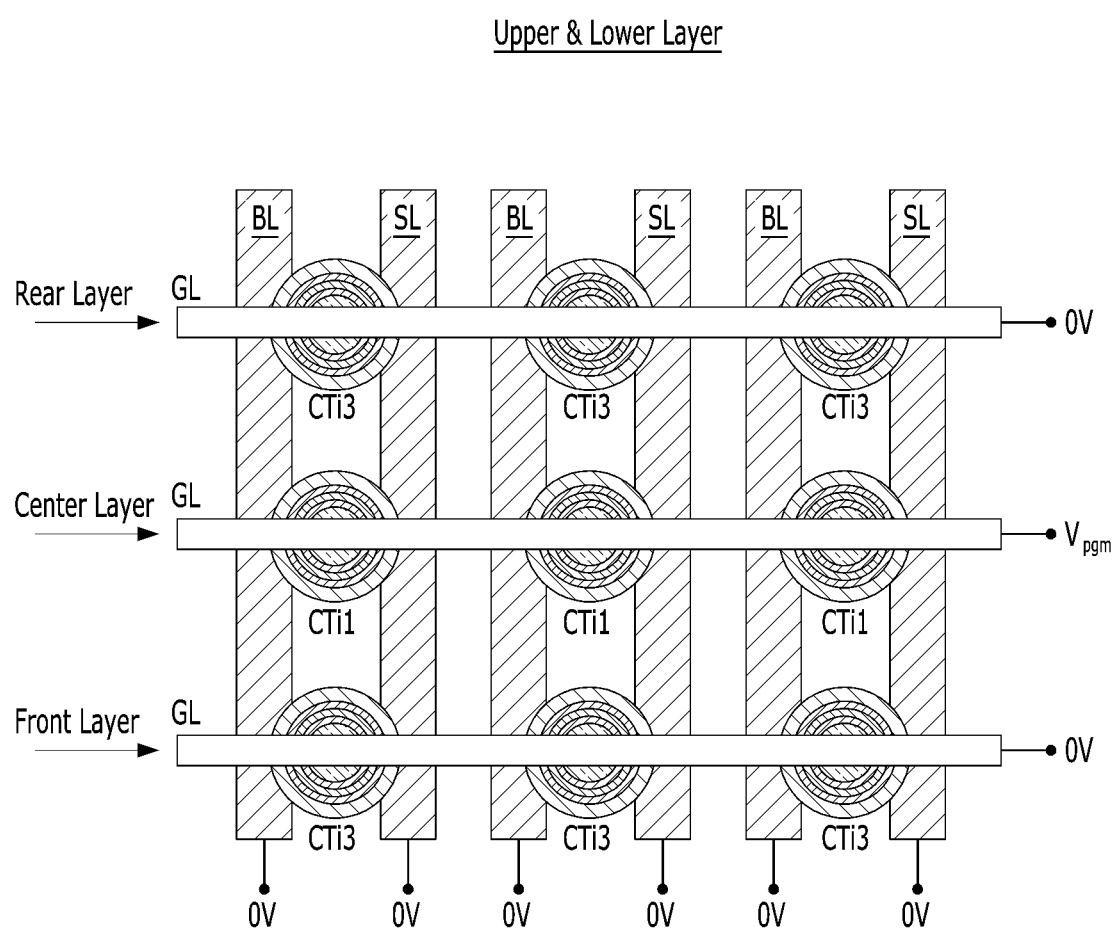

FIGS. 15A and 15B are representations of examples of schematic circuit diagrams of a cell array of a nonvolatile memory device to assist in the conceptual explanation of a method of programming a specific one-cell transistor CTp in accordance with an embodiment of the disclosure, and FIGS. 16A and 16B are schematic horizontal cross-sectional views of the cell array of the nonvolatile memory device. FIG. 15A illustrates a center layer where the cell transistor CTp to be programmed and cell transistors CTi1 to be inhibited are disposed, FIG. 15B illustrates a front layer and a rear layer where cell transistors CTi2 and CTi3 to be inhibited are disposed, FIG. 16A illustrates a middle layer where the cell transistor CTp to be programmed and cell transistors CTi1, CTi2 and CTi3 to be inhibited are disposed, and FIG. 16B illustrates a lower layer and an upper layer where cell transistors CTi1 and CTi3 to be inhibited are disposed. Programming the cell transistor CTp may mean increasing the channel resistance of the cell transistor CTp or the threshold voltage of a channel. Additionally referring to FIGS. 3A and 3B, in the case where a first gate dielectric layer 61 of a gate dielectric layer 60 is a blocking gate dielectric layer and a third gate dielectric layer 63 of the gate dielectric layer 60 is a tunneling gate dielectric layer, electrons may be trapped in a second gate dielectric layer 62.

Referring to FIGS. 15A, 15B, 16A and 16B, the method of programming the specific one-cell transistor CTp in accordance with an embodiment of the disclosure may include applying a program voltage Vpgm to a gate line GL which is coupled with a gate electrode 50 of the cell transistor CTp to be programmed, applying a ground voltage (for example, 0V) to a bit line BL of the cell transistor CTp to be programmed and applying the program voltage Vpgm to a source line SL of the cell transistor CTp to be programmed. The voltage difference between the program voltage Vpgm and the ground voltage 0V may be smaller than a voltage difference that may cause a tunneling phenomenon of electrons to occur at the gate dielectric layer 60 of the cell transistor CTp to be programmed. That is to say, at the gate dielectric layer 60 of the cell transistor CTp, a tunneling phenomenon of electrons by the voltage difference between the program voltage Vpgm and the ground voltage 0V does not occur. However, migration of electrons may occur between the program voltage Vpgm and the ground voltage 0V which are applied to the source line SL and the bit line BL. The electrons may be excited into hot carriers by receiving energy due to the voltage difference between the program voltage Vpgm and the ground voltage 0V. The hot carriers may tunnel the third gate dielectric layer 63 of the gate dielectric layer 60 from a channel layer 70 which is adjacent to the bit line BL or the source line SL, and may be trapped in the second gate dielectric layer 62. In the case where the program voltage Vpgm is higher than the ground voltage 0V, the hot carriers may be excited and migrate from the bit line BL to the source line SL, may tunnel the third gate dielectric layer 63 from the channel layer 70 which is adjacent to the source line SL, and may be trapped in the second gate dielectric layer 62.

Referring to FIGS. 15A and 16A, among the cell transistors CTi1, CTi2 and CTi3 to be inhibited which are disposed in the center layer and the middle layer, the ground voltage 0V may be applied to bit lines BL and source lines SL of the cell transistors CTi1 to be inhibited which have gate electrodes 50 coupled with the gate line GL, which in turn is coupled with the gate electrode 50 of the cell transistor CTp to be programmed. In other words, among the cell transistors CTp and CTi1 which share the same gate line GL, the ground voltage 0V and the program voltage Vpgm may be applied to the bit line BL and the source line SL of the cell transistor CTp to be programmed, and the ground voltage 0V may be applied to the bit lines BL and the source lines SL of the cell transistors CTi1 to be inhibited. As aforementioned, the voltage difference between the program voltage Vpgm and the ground voltage 0V may be sufficiently smaller than a tunneling voltage that may cause tunneling of electrons to occur at the gate dielectric layer 60.

Referring to FIGS. 15B and 16B, the ground voltage 0V may be applied to gate electrodes 50 of the cell transistors CTi2 to be inhibited, which share the bit line BL and the source line SL with the cell transistor CTp to be programmed. In succession, the ground voltage 0V may be applied to gate electrodes 50 (or gate lines GL), bit lines BL and source lines SL of the cell transistors CTi3 to be inhibited, which do not share any one among a gate line GL, a bit line BL and a source line SL, with the cell transistor CTp to be programmed. Namely, the same voltage or a similar voltage may be applied between the bit lines BL and the source lines SL of the cell transistors CTi3 to be inhibited.

Figure 17A:
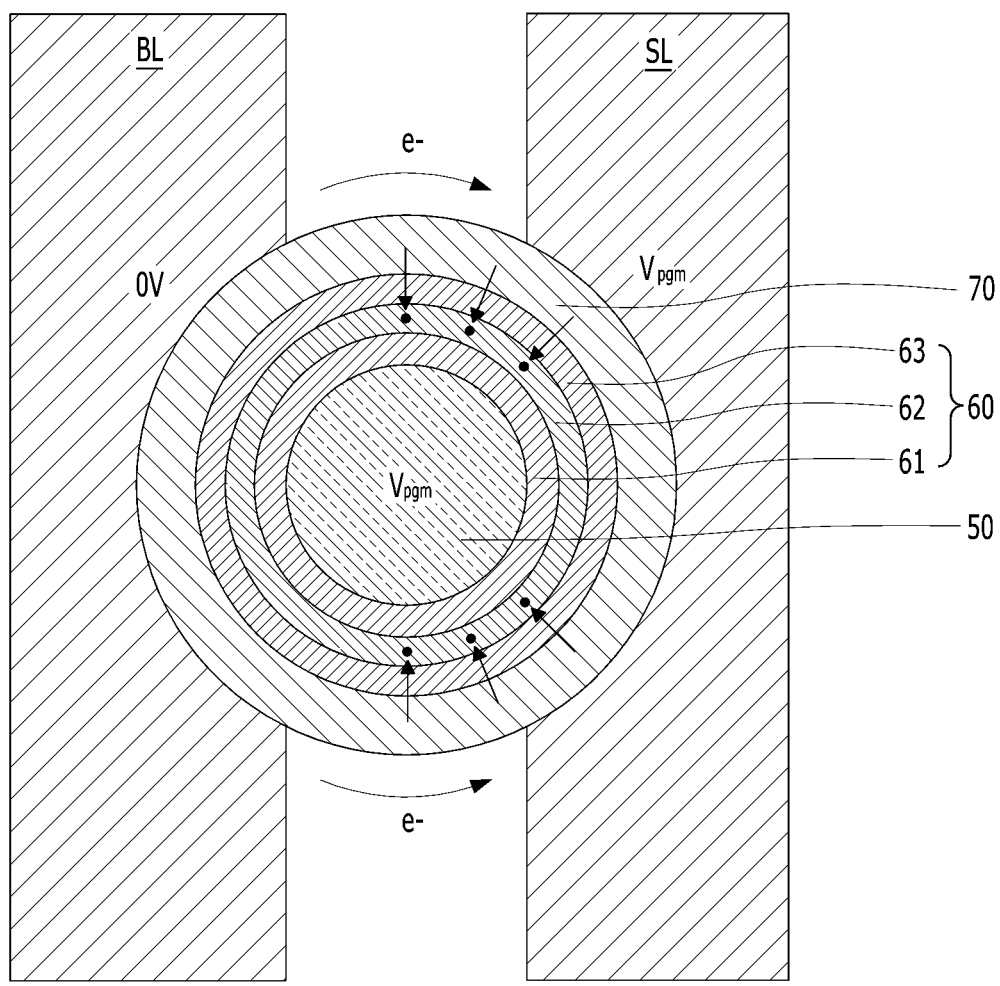
FIG. 17A is a representation of an example of a view to assist in the conceptual explanation of programming the cell transistor illustrated in FIGS. 15A and 16A.

FIG. 17A is a representation of an example of a view to assist in the conceptual explanation of the cell transistor CTp to be programmed, which is illustrated in FIGS. 15A and 16A. The method of programming the cell transistor CTp may include applying the program voltage Vpgm to the gate electrode 50, applying the ground voltage 0V to the bit line BL and applying the program voltage Vpgm to the source line SL. By the electric field between the bit line BL and the source line SL, electrons e- may migrate from the bit line BL to the source line SL through the channel layer 70. The electrons e- may be excited to hot carriers by receiving energy, and the hot carriers may tunnel the gate dielectric layer 60 which is adjacent to the source line SL. In other words, the hot carriers may tunnel the third gate dielectric layer 63 which is adjacent to or near the source line SL, and may be trapped in the second gate dielectric layer 62. In the present embodiment, the bit line BL and the source line SL may be interchanged with each other.

Figure 17B:
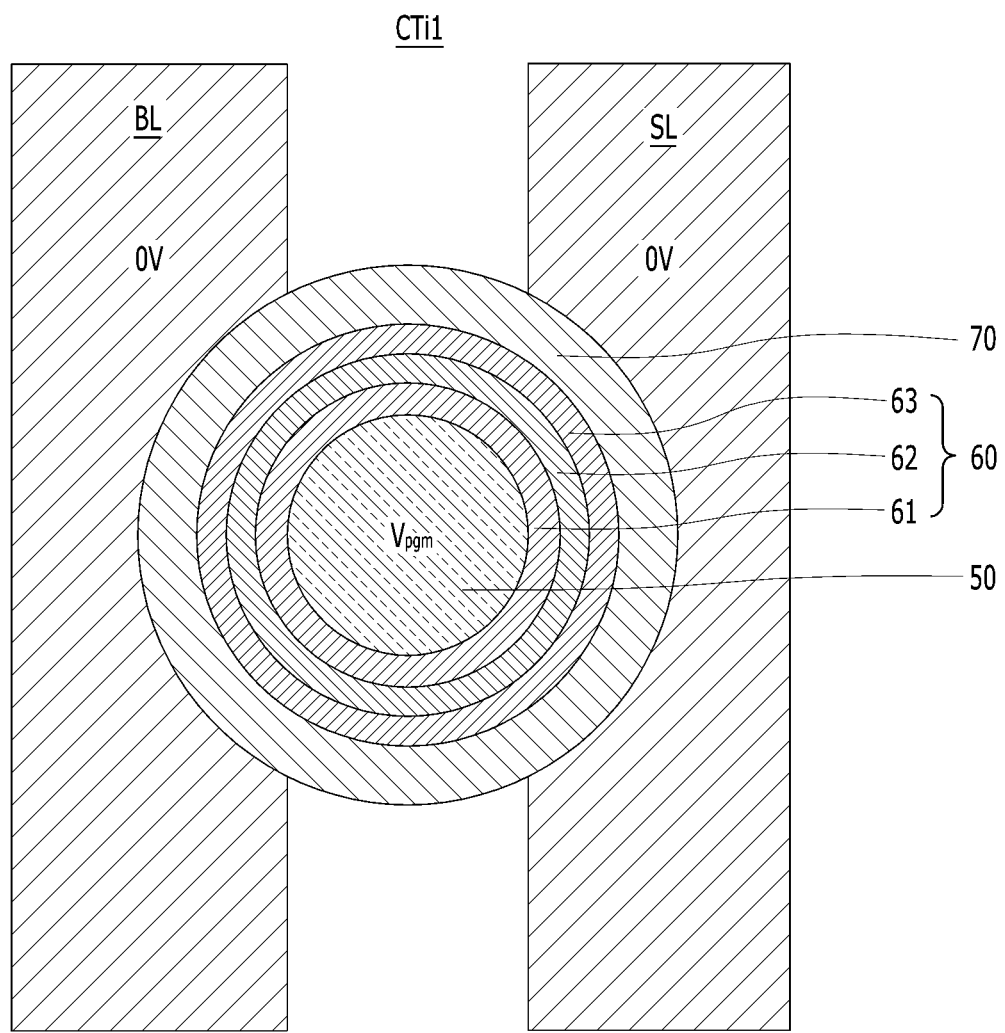
FIG. 17B is a representation of an example of a view to assist in the conceptual explanation of inhibiting the programming of the cell transistor illustrated in FIGS. 15A and 16A.

FIG. 17B is a representation of an example of a view to assist in the conceptual explanation of the cell transistor CTi1 to be inhibited and not programmed, which is illustrated in FIGS. 15A and 16A. The method of inhibiting the cell transistor CTi1 may include applying the program voltage Vpgm to the gate electrode 50 and applying the ground voltage 0V to the bit line BL and the source line SL. As aforementioned, since the voltage difference between the program voltage Vpgm and the ground voltage 0V is smaller than a tunneling voltage, no operation occurs in the cell transistor CTi1.

Figure 17C:
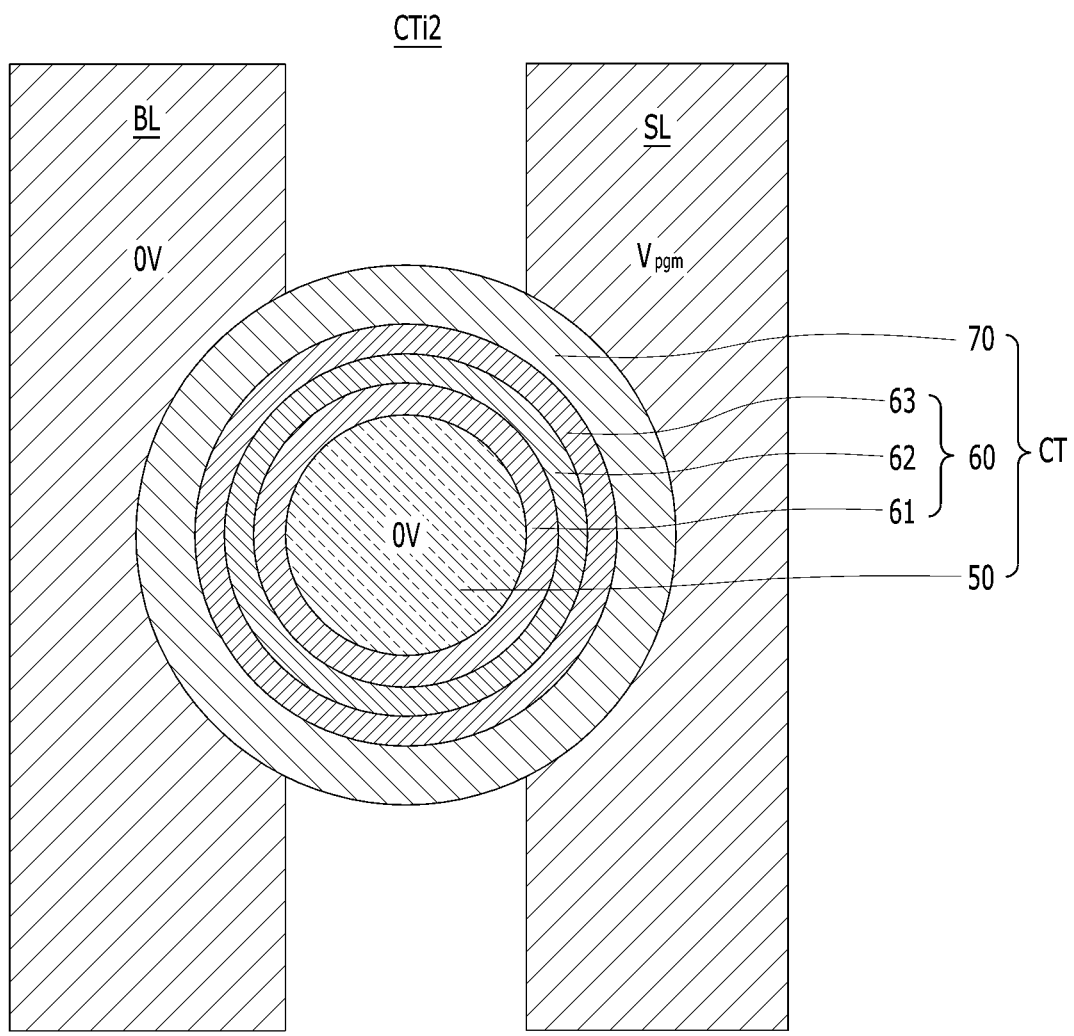
FIGS. 17C and 17D are representations of examples of views to assist in the conceptual explanation of inhibiting the programming of the cell transistors illustrated in FIGS. 15B and 16B.
Figure 17D:
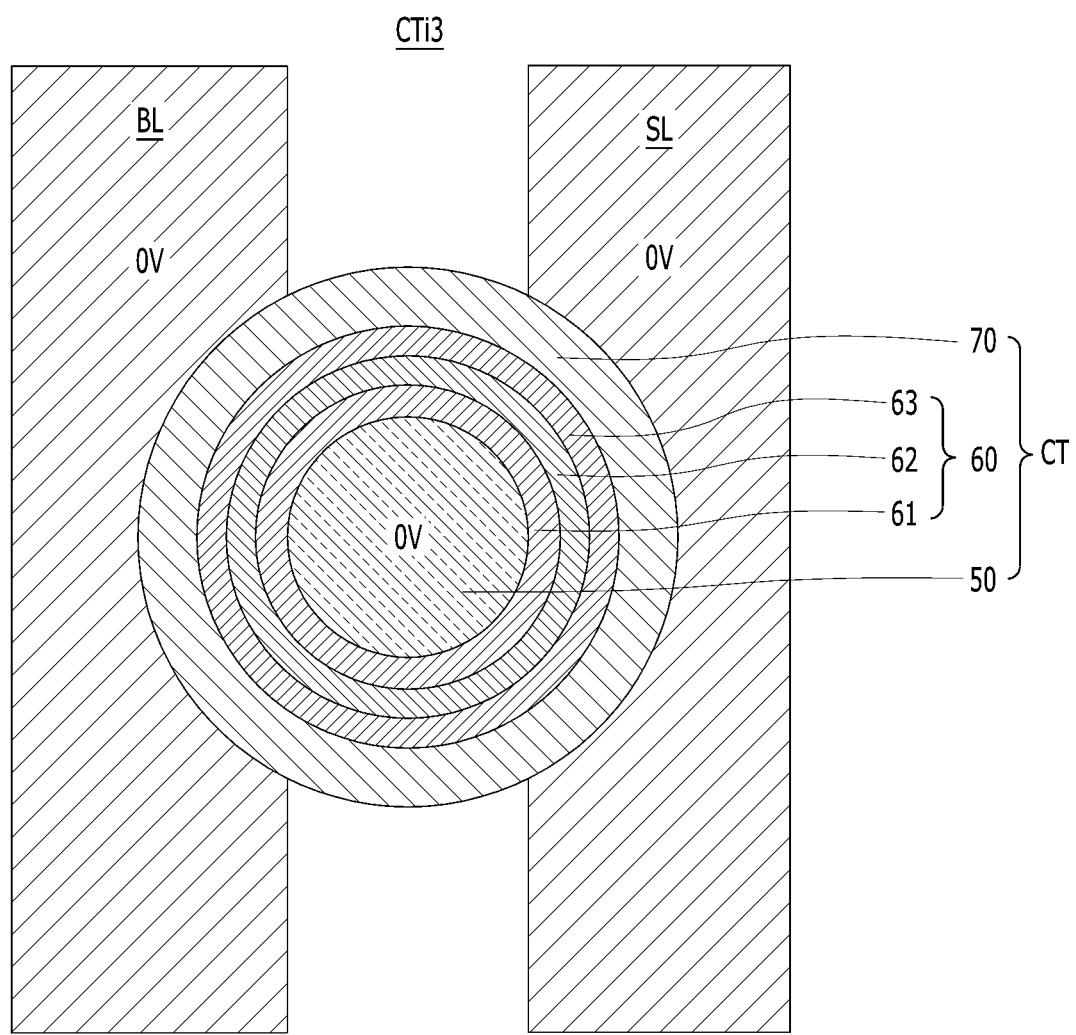

FIGS. 17C and 17D are representations of examples of views to assist in the conceptual explanation of the cell transistors CTi2 and CTi3 to be inhibited and not programmed, which are illustrated in FIGS. 15B and 16B. Referring to FIG. 17C, the method of inhibiting the cell transistor CTi2 may include applying the ground voltage 0V to the gate electrode 50 and the bit line BL and applying the program voltage Vpgm to the source line SL. As aforementioned, since the voltage difference between the program voltage Vpgm and the ground voltage 0V is smaller than a tunneling voltage, no operation occurs in the cell transistor CTi2. Referring to FIG. 17D, the method of inhibiting the cell transistor CTi3 may include applying the ground voltage 0V in common to the gate electrode 50, the bit line BL and the source line SL. Since an electric field is not formed among the gate electrode 50, the bit line BL and the source line SL, no operation occurs in the cell transistor CTi3.

It was described with reference to FIGS. 15A through 17D that the cell transistor CTp is programmed in a state in which the ground voltage 0V is applied to the bit lines BL. The bit lines BL and the source lines SL may be interchangeable. Therefore, while it was described that the ground voltage 0V is applied to the bit lines BL, it may be understood that the cell transistor CTp may be programmed in a state in which the ground voltage 0V is applied to the source lines SL.

Figure 18A:
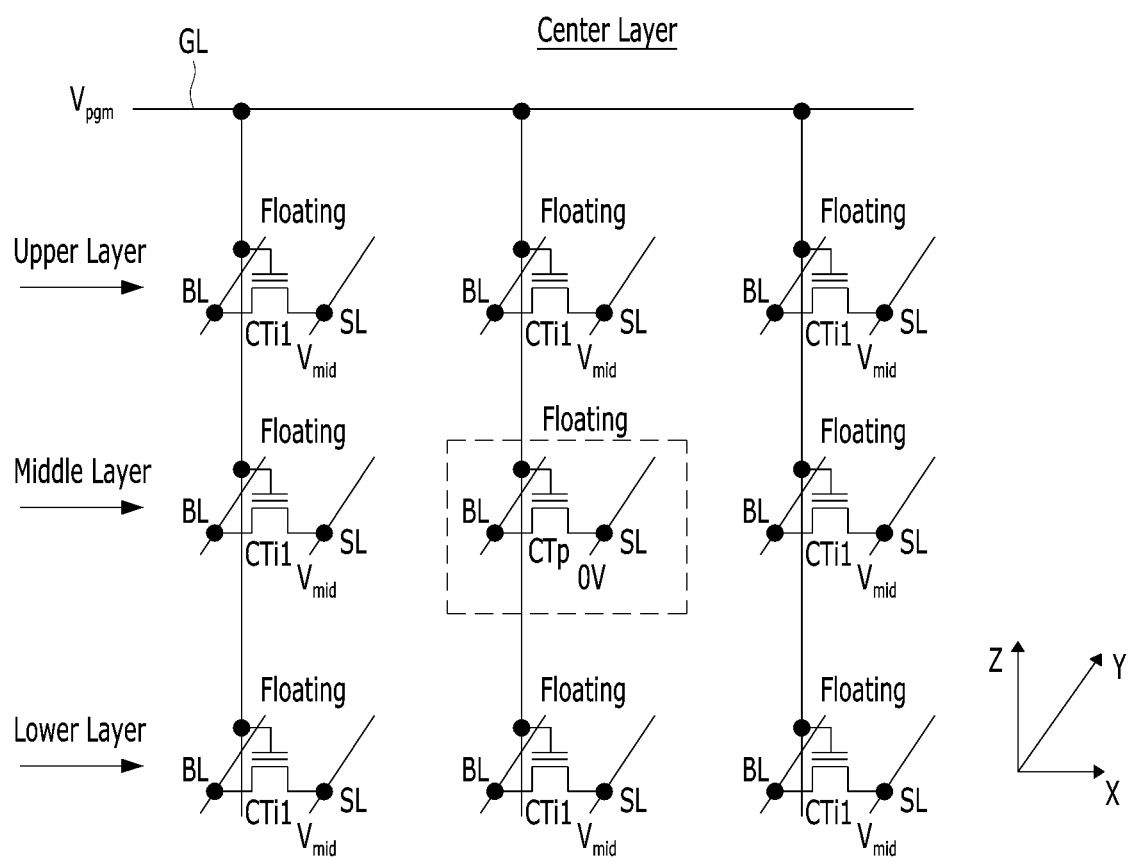
FIGS. 18A and 18B are representations of examples of schematic circuit diagrams of a cell array of a nonvolatile memory device to assist in the conceptual explanation of a method of programming a specific one-cell transistor in accordance with an embodiment of the disclosure.
Figure 18B:
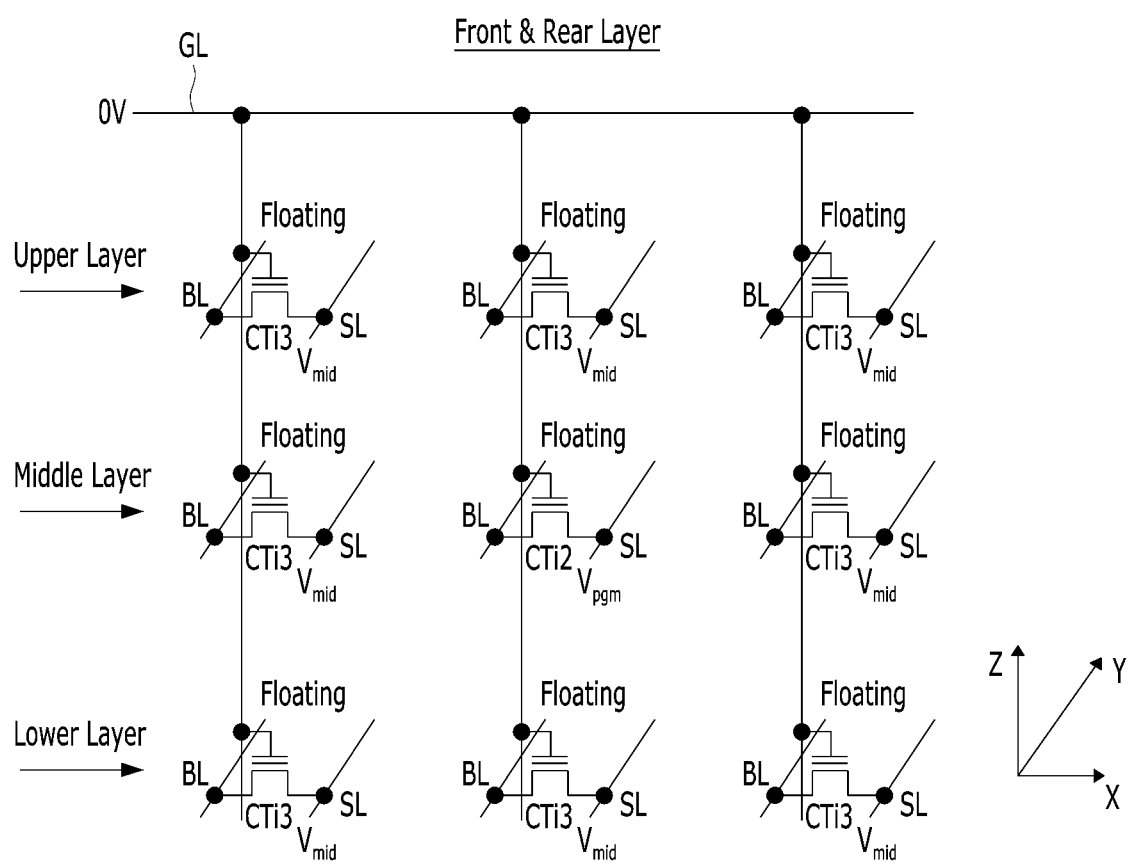
Figure 19A:
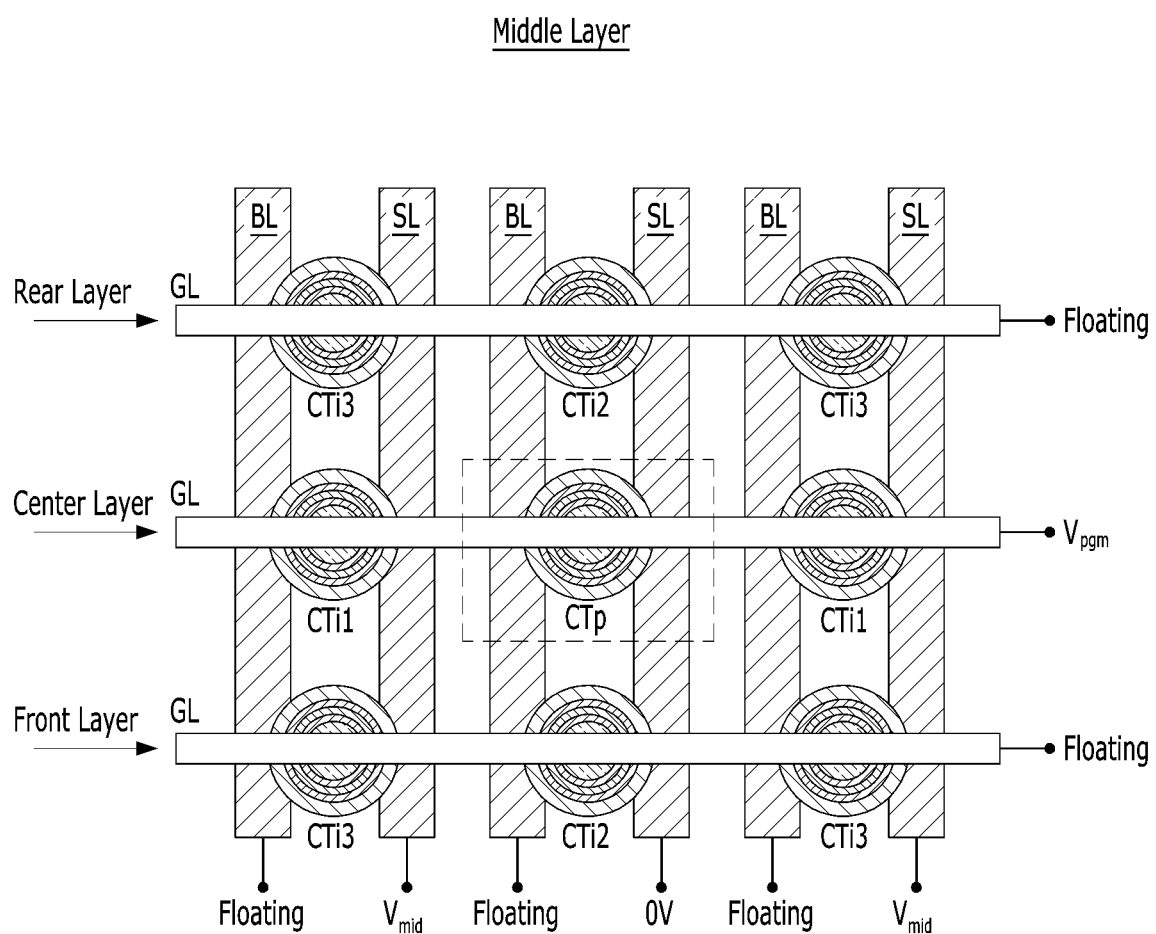
FIGS. 19A and 19B are schematic horizontal cross-sectional views of the cell array of the nonvolatile memory device.
Figure 19B:
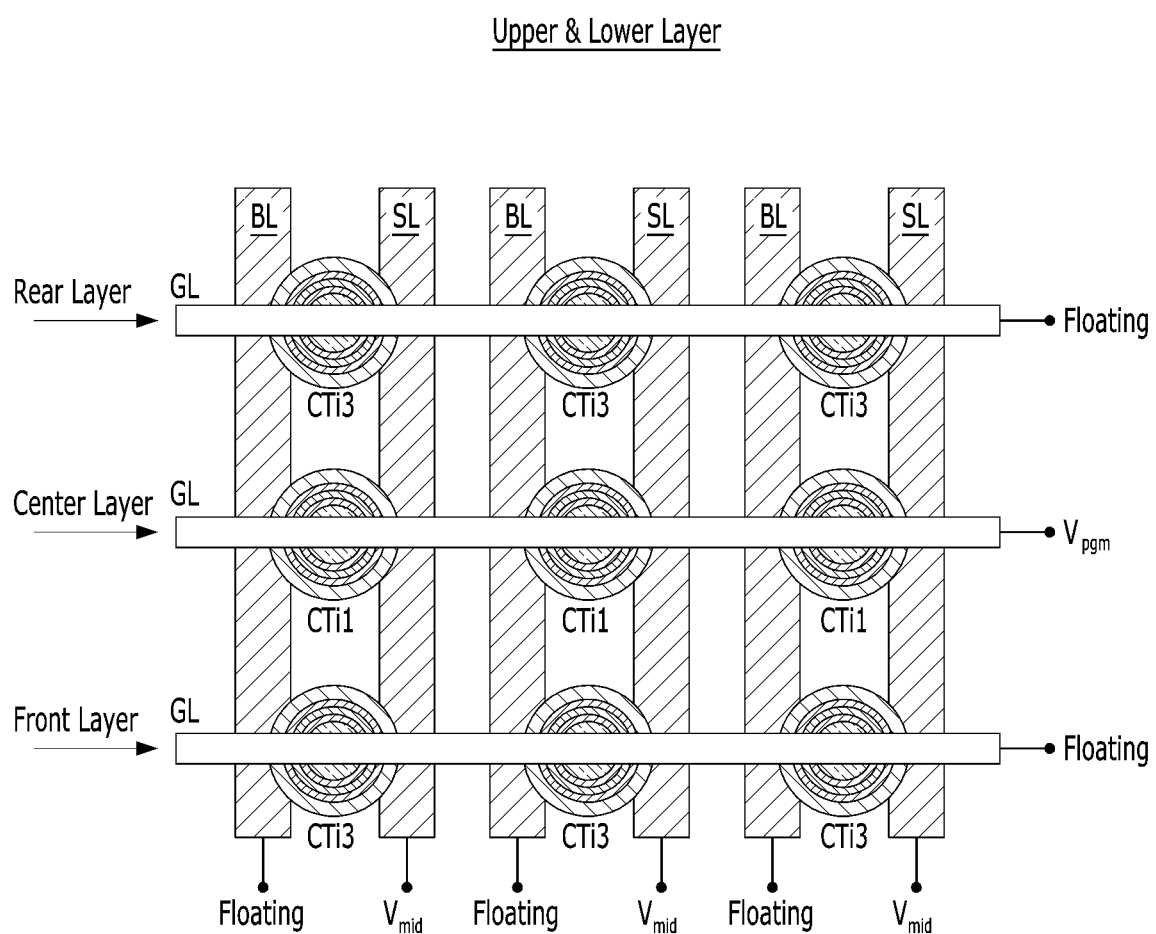

FIGS. 18A and 18B are representations of examples of schematic circuit diagrams of a cell array of a nonvolatile memory device to assist in the conceptual explanation of a method of programming a specific one-cell transistor CTp in accordance with an embodiment of the disclosure, and FIGS. 19A and 19B are schematic horizontal cross-sectional views of the cell array of the nonvolatile memory device. FIG. 18A illustrates a center layer where the cell transistor CTp to be programmed and cell transistors CTi1 to be inhibited are disposed, FIG. 18B illustrates a front layer and a rear layer where cell transistors CTi2 and CTi3 to be inhibited are disposed, FIG. 19A illustrates a middle layer where the cell transistor CTp to be programmed and cell transistors CTi1, CTi2 and CTi3 to be inhibited are disposed, and FIG. 19B illustrates a lower layer and an upper layer where cell transistors CTi1 and CTi3 to be inhibited are disposed. Programming the cell transistor CTp may mean increasing the channel resistance of the cell transistor CTp or the threshold voltage of a channel. For example, additionally referring to FIG. 9A, in the case where a first gate dielectric layer 61 of the cell transistor CTp is a blocking gate dielectric layer and a third gate dielectric layer 63 of the cell transistor CTp is a tunneling gate dielectric layer, electrons tunnel the third gate dielectric layer 63 from a channel layer 70 and may be trapped in a second gate dielectric layer 62. The channel resistance or the threshold voltage of a channel layer 70 may be increased. In other words, the fact that the synapse of a neuromorphic device is depressed will be described.

Referring to FIGS. 18A, 18B, 19A and 19B, the method of programming the specific one-cell transistor CTp in accordance with an embodiment of the disclosure may include applying a program voltage Vpgm to a gate line GL which is coupled with a gate electrode 50 of the cell transistor CTp to be programmed, floating a bit line BL of the cell transistor CTp to be programmed and applying a ground voltage 0V to a source line SL of the cell transistor CTp to be programmed. The voltage difference between the program voltage Vpgm and the ground voltage 0V may be larger than a minimum voltage difference that may cause a tunneling phenomenon of electrons to occur at the third gate dielectric layer 63 as the tunneling gate dielectric layer of a gate dielectric layer 60 of the cell transistor CTp to be programmed. That is to say, by the voltage difference between the program voltage Vpgm and the ground voltage 0V, a tunneling phenomenon of electrons may occur at the third gate dielectric layer 63 of the gate dielectric layer 60 of the cell transistor CTp to be programmed.

Referring to FIGS. 18A and 19A, among the cell transistors CTi1, CTi2 and CTi3 to be inhibited which are disposed at the center layer and the middle layer, bit lines BL of the cell transistors CTi1 to be inhibited which have gate electrodes 50 coupled with the gate line GL, which in turn is coupled with the gate electrode 50 of the cell transistor CTp to be programmed may be floated, and a middle voltage Vmid may be applied to source lines SL of the cell transistors CTi1 to be inhibited. In other words, among the cell transistors CTp and CTi1 which share the same gate line GL, the bit lines BL of the cell transistors CTi1 to be inhibited may be floated, and the middle voltage Vmid may be applied to the source lines SL of the cell transistors CTi1 to be inhibited. The voltage difference between the program voltage Vpgm and the middle voltage Vmid may be sufficiently smaller than a voltage difference that may cause tunneling of electrons.

Referring to FIGS. 18B and 19B, the ground voltage 0V may be applied to gate electrodes 50 of the cell transistors CTi2 to be inhibited, which share the bit line BL and the source line SL with the cell transistor CTp to be programmed. In succession, the ground voltage 0V may be applied to gate electrodes 50 (or gate lines GL) of the cell transistors CTi3 to be inhibited, which do not share any one among a gate line GL, a bit line BL and a source line SL, with the cell transistor CTp to be programmed, bit lines BL of the cell transistors CTi3 to be inhibited may be floated, and the middle voltage Vmid may be applied to source lines SL of the cell transistors CTi3 to be inhibited.

Figure 20A:
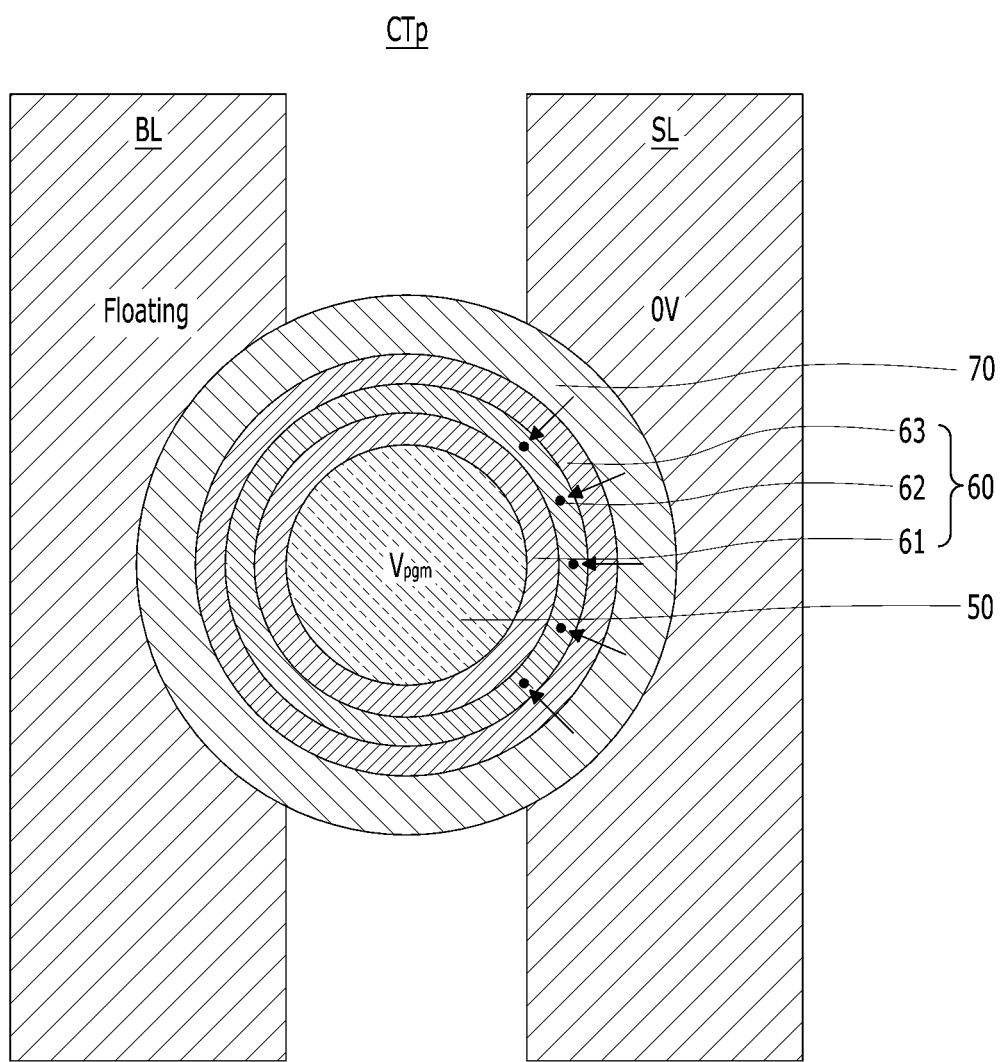
FIG. 20A is a representation of an example of a view to assist in the conceptual explanation of programming the cell transistor illustrated in FIGS. 18A and 19A.

FIG. 20A is a representation of an example of a view to assist in the conceptual explanation of the cell transistor CTp to be programmed, which is illustrated in FIGS. 18A and 19A. The method of programming the cell transistor CTp may include applying the program voltage Vpgm to the gate electrode 50, floating the bit line BL and applying the ground voltage 0V to the source line SL. Since the voltage difference between the program voltage Vpgm and the ground voltage 0V is larger than a tunneling voltage of electrons, electrons may tunnel the third gate dielectric layer 63 from the channel layer 70 which is adjacent to the source line SL, and may be trapped in the second gate dielectric layer 62. That is to say, the channel resistance or the threshold voltage of the channel layer 70 may be increased (i.e., the synapse of a neuromorphic device may be depressed).

Figure 20B:
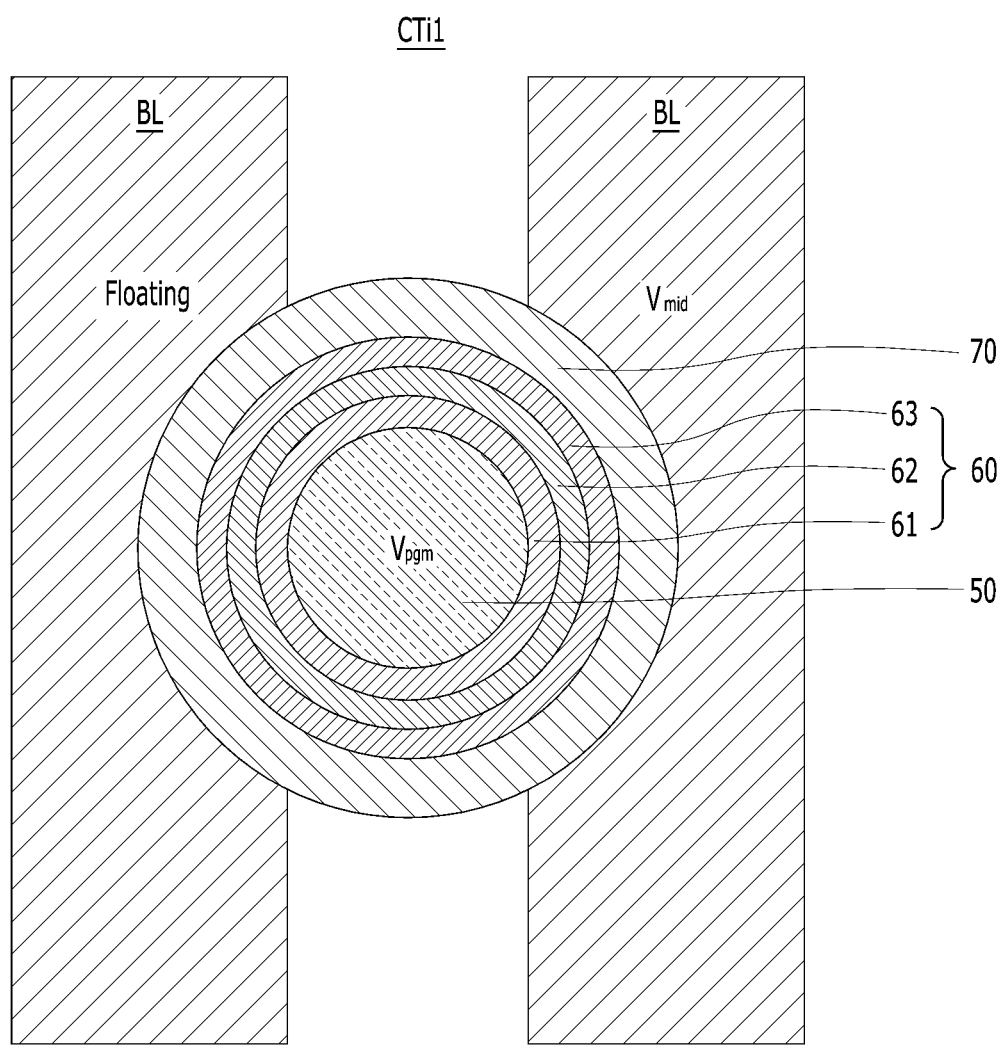
FIG. 20B is a representation of an example of a view to assist in the conceptual explanation of inhibiting the programming of the cell transistor illustrated in FIGS. 18A and 19A, which has a gate electrode sharing a gate line with the cell transistor.

FIG. 20B is a representation of an example of a view to assist in the conceptual explanation of the cell transistor CTi1 to be inhibited and not programmed, which is illustrated in FIGS. 18A and 19A and has the gate electrode 50 sharing the gate line GL with the cell transistor CTp to be programmed. The method of inhibiting the cell transistor CTi1 may include applying the program voltage Vpgm to the gate electrode 50, floating the bit line BL and applying the middle voltage Vmid to the source line SL. As aforementioned, since the voltage difference between the program voltage Vpgm and the middle voltage Vmid is smaller than a tunneling voltage, no operation occurs in the cell transistor CTi1.

Figure 20C:
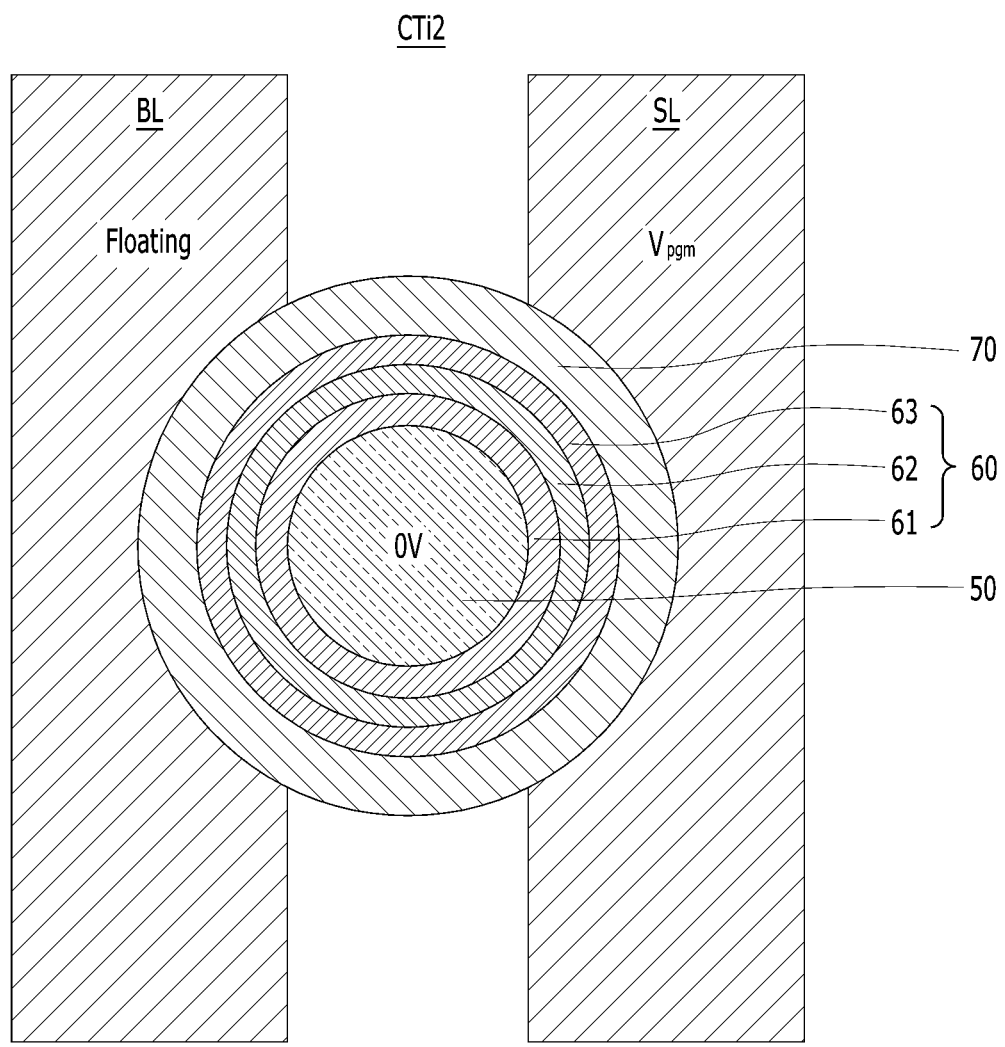
FIGS. 20C and 20D are representations of examples of views to assist in the conceptual explanation of inhibiting the programming of the cell transistors illustrated in FIGS. 18B and 19B.
Figure 20D:
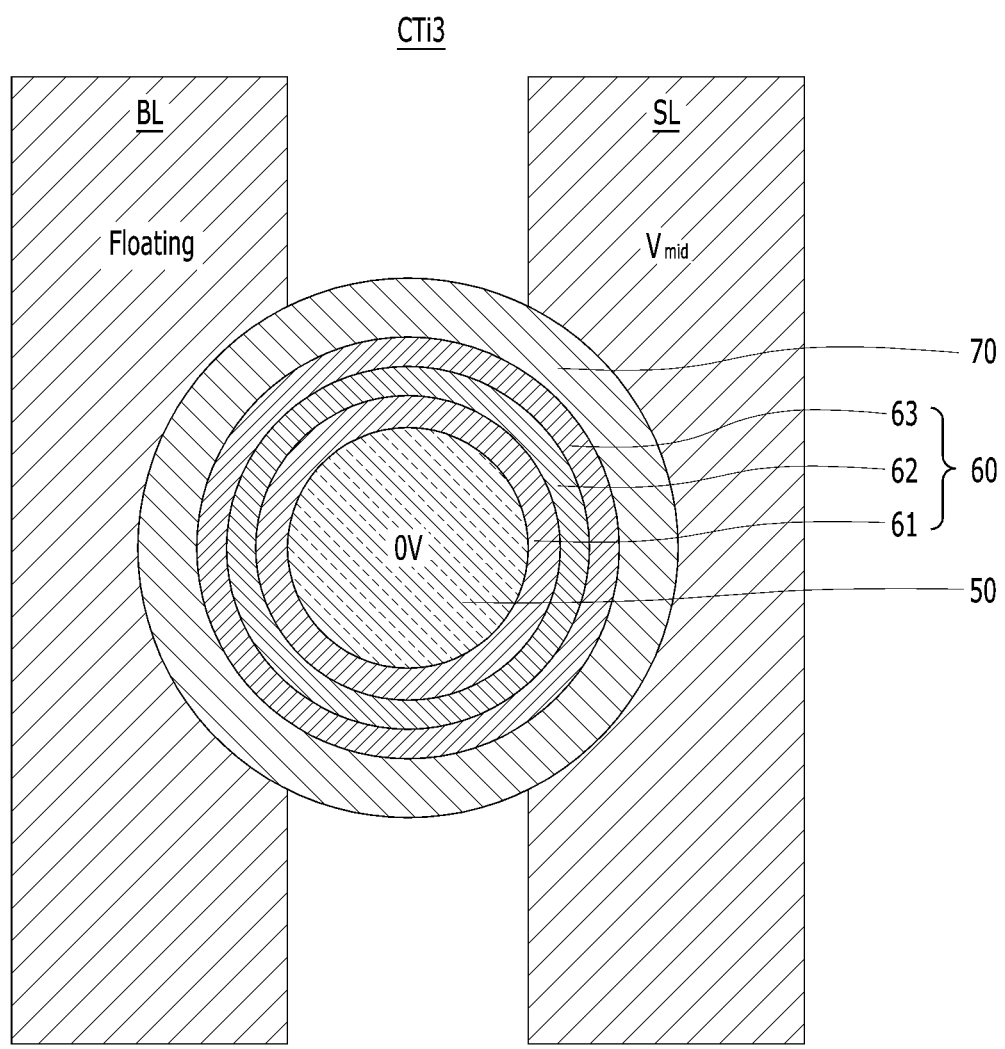

FIGS. 20C and 20D are representations of examples of views to assist in the conceptual explanation of the cell transistors CTi2 and CTi3 to be inhibited and not programmed, which are illustrated in FIGS. 18B and 19B. Referring to FIG. 20C, the method of inhibiting the cell transistor CTi2 may include applying the ground voltage 0V to the gate electrode 50, floating the bit line BL and applying the program voltage Vpgm to the source line SL. Because the first gate dielectric layer 61 is a blocking gate dielectric layer, electrons cannot tunnel from the gate electrode 50 to the second gate dielectric layer 62. In other words, the cell transistor CTi2 may be not programmed.

Referring to FIG. 20D, the method of inhibiting the cell transistor CTi3 may include applying the ground voltage 0V to the gate electrode 50, floating the bit line BL and applying the middle voltage Vmid to the source line SL. Since the voltage difference between the middle voltage Vmid and the ground voltage 0V is smaller than a tunneling voltage, no operation occurs in the cell transistor CTi3.

Figure 21:
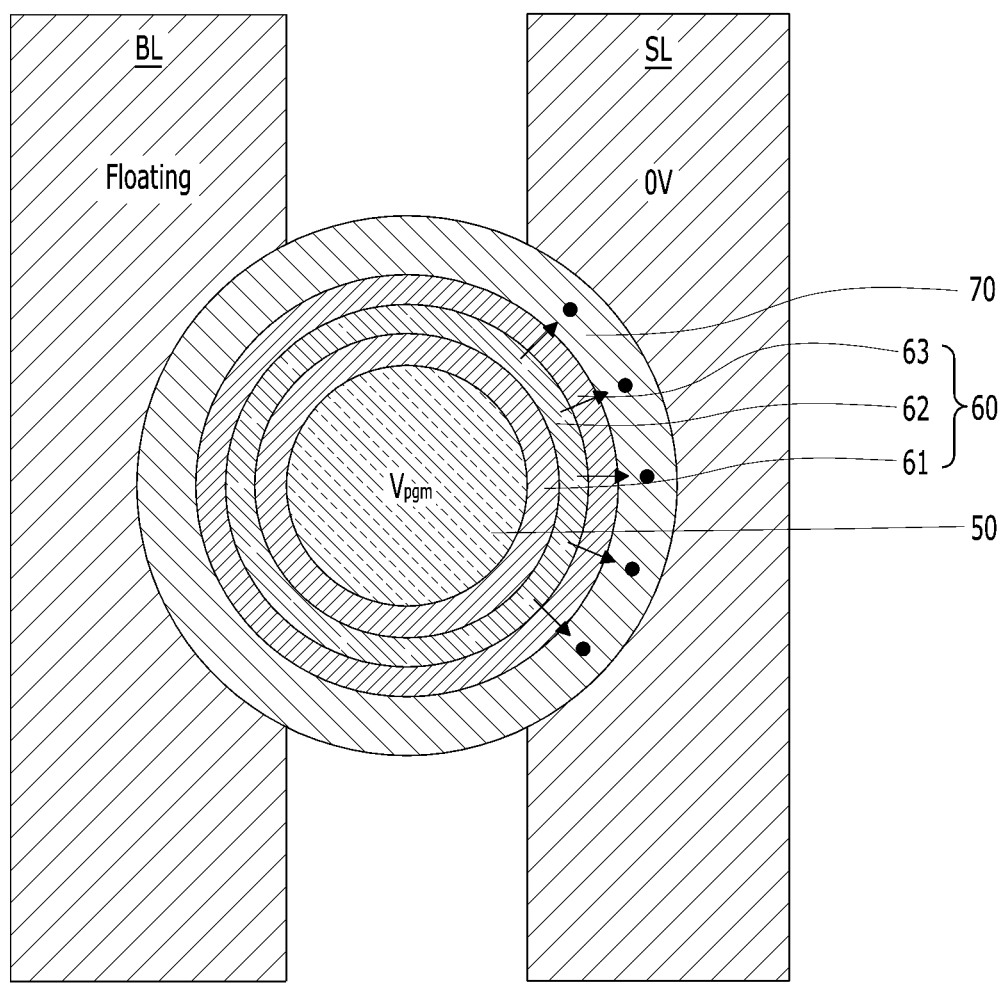
FIG. 21 is a representation of an example of a view to assist in the explanation of erasing a cell transistor in a case in which a program voltage is a negative (−) voltage, a first gate dielectric layer is a blocking gate dielectric layer and a third gate dielectric layer is a tunneling gate dielectric layer.

FIG. 21 is a representation of an example of a view to assist in the explanation of a cell transistor CT that is erased in the case where a program voltage Vpgm is a negative (−) voltage, a first gate dielectric layer 61 is a blocking gate dielectric layer, and a third gate dielectric layer 63 is a tunneling gate dielectric layer. Erasing means discharging electrons from a second gate dielectric layer 62 of a gate electrode 60 of the cell transistor CT. That is to say, the channel resistance or the threshold voltage of a channel layer 70 of the cell transistor CT which is erased may be reduced (the synapse of a neuromorphic device may be potentiated). Referring to FIG. 21, the method of erasing the cell transistor CT may include applying the negative (−) program voltage Vpgm to a gate electrode 50, floating a bit line BL, and applying a ground voltage 0V to a source line SL. By the voltage difference between the ground voltage 0V and the negative (−) program voltage Vpgm, electrons having been trapped in the second gate dielectric layer 62 of the gate dielectric layer 60 may tunnel through the third gate dielectric layer 63 and may be discharged to the channel layer 70.

Figure 22:
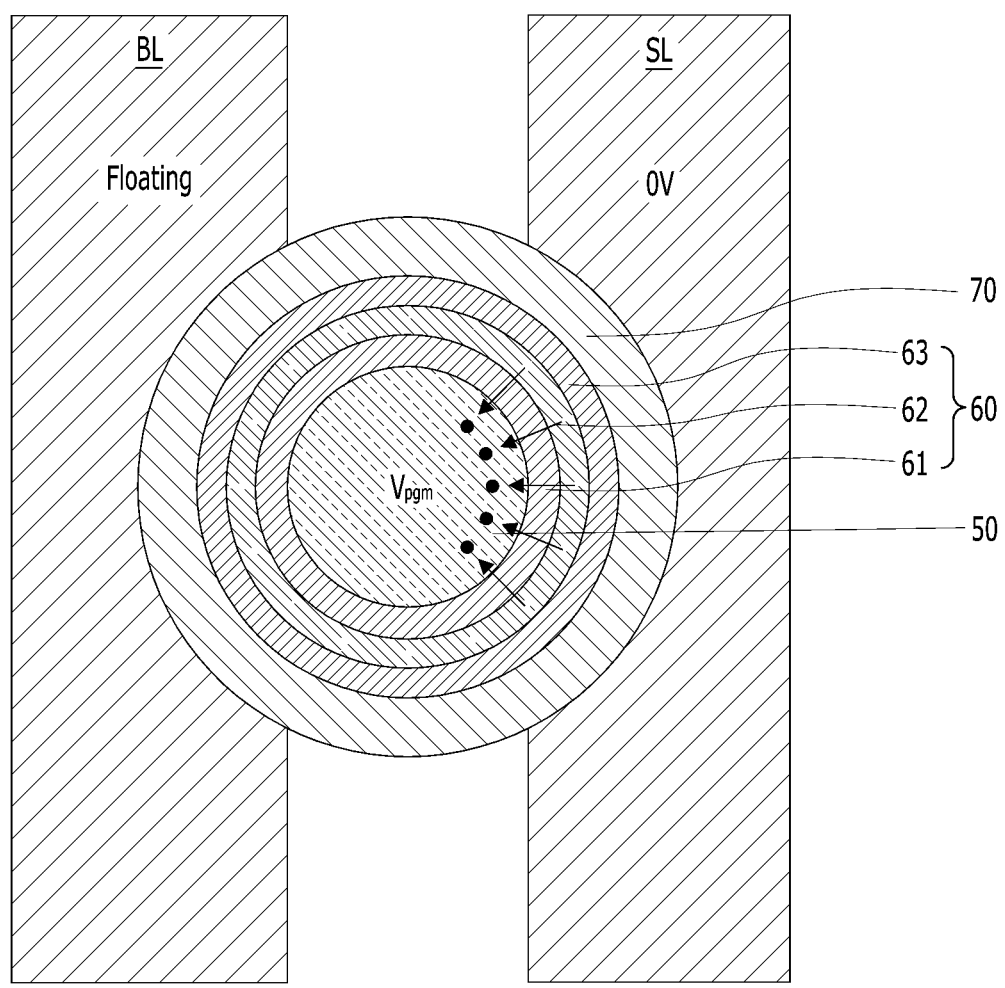
FIG. 22 is a representation of an example of a view to assist in the explanation of erasing a cell transistor in a case in which a program voltage is a positive (+) voltage, a first gate dielectric layer is a tunneling gate dielectric layer and a third gate dielectric layer is a blocking gate dielectric layer.

FIG. 22 is a representation of an example of a view to assist in the explanation of a cell transistor CT that is erased in the case where a program voltage Vpgm is a positive (+) voltage, a first gate dielectric layer 61 is a tunneling gate dielectric layer, and a third gate dielectric layer 63 is a blocking gate dielectric layer. Referring to FIG. 22, the method of erasing the cell transistor CT may include applying the positive (+) program voltage Vpgm to a gate electrode 50, floating a bit line BL, and applying a ground voltage 0V to a source line SL. By the voltage difference between the positive (+) program voltage Vpgm and the ground voltage 0V, electrons having been trapped in a second gate dielectric layer 62 of a gate dielectric layer 60 may be discharged to the gate electrode 50 (i.e., the synapse of a neuromorphic device may be potentiated).

Figure 23:
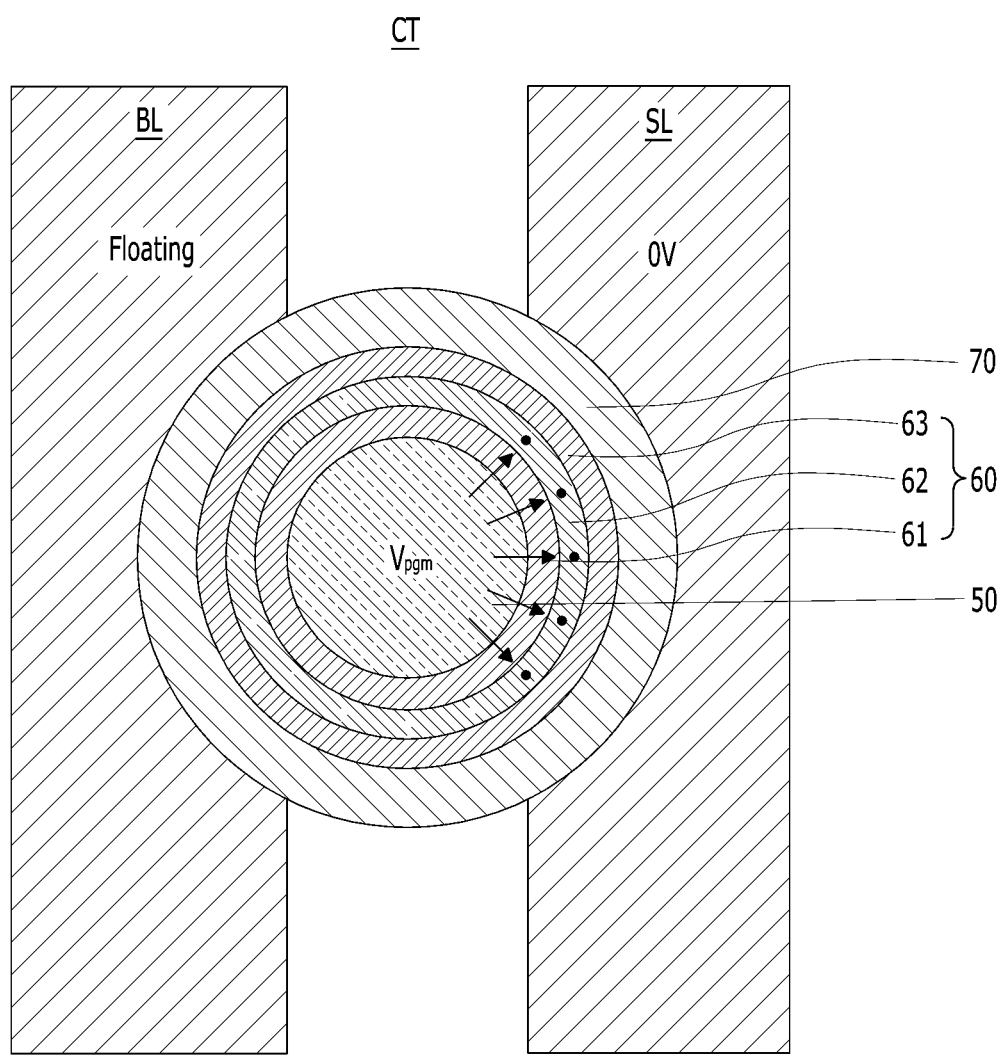
FIG. 23 is a representation of an example of a view to assist in the explanation of programming a cell transistor in a case in which a program voltage is a negative (−) voltage, a first gate dielectric layer is a tunneling gate dielectric layer and a third gate dielectric layer is a blocking gate dielectric layer.

FIG. 23 is a representation of an example of a view to assist in the explanation of a cell transistor CT that is programmed in the case where a program voltage Vpgm is a negative (−) voltage, a first gate dielectric layer 61 is a tunneling gate dielectric layer and a third gate dielectric layer 63 is a blocking gate dielectric layer. Referring to FIG. 23, the method of programming the cell transistor CT may include applying the negative (−) program voltage Vpgm to a gate electrode 50, floating a bit line BL, and applying a ground voltage 0V to a source line SL. By the voltage difference between the ground voltage 0V and the negative (−) program voltage Vpgm, electrons may tunnel the first gate dielectric layer 61 from the gate electrode 50 and may be trapped in a second gate dielectric layer 62 (i.e., the synapse of a neuromorphic device may be depressed).

As aforementioned, the program voltage Vpgm may be a positive (+) voltage or may be a negative (−) voltage. The ground voltage may not be 0V. The reason why the ground voltage is shown as 0V is to facilitate the easy understanding of the technical spirit of the disclosure. In the erasing operation, the program voltage Vpgm may be understood as an erasing voltage.

It was described with reference to FIGS. 18A through 23 that the cell transistor CT is programmed or erased in a state in which the bit line BL is floated. The bit line BL and the source line SL may be changed with each other. Therefore, while it was described that the bit line BL is floated, it may be understood that the cell transistor CT may be programmed or erased in a state in which the source line SL is floated.

The voltages Vhigh, Vmid, Vlow, Vpgm and 0V were described as having relative sizes. Since a tunneling voltage varies depending on the materials and thicknesses of the first to third gate dielectric layers 61, 62 and 63, exact dimensions were not provided and only relative relationships were mentioned. The voltages Vhigh, Vmid, Vlow, Vpgm and 0V may be applied in the form of a plurality of pulses. Therefore, in a cell transistor CT to be programmed or a cell transistor CT to be erased, a tunneling phenomenon may occur stepwise and gradually depending on a time during which a plurality of pulse-shaped voltages are applied, a duration time, an application count, an application cycle, a size and combinations thereof. Thus, the channel resistance or the threshold voltage of the channel layer 70 may vary stepwise and gradually, and resistances of multiple levels and learning levels of a synapse device may be provided.

Figure 24:
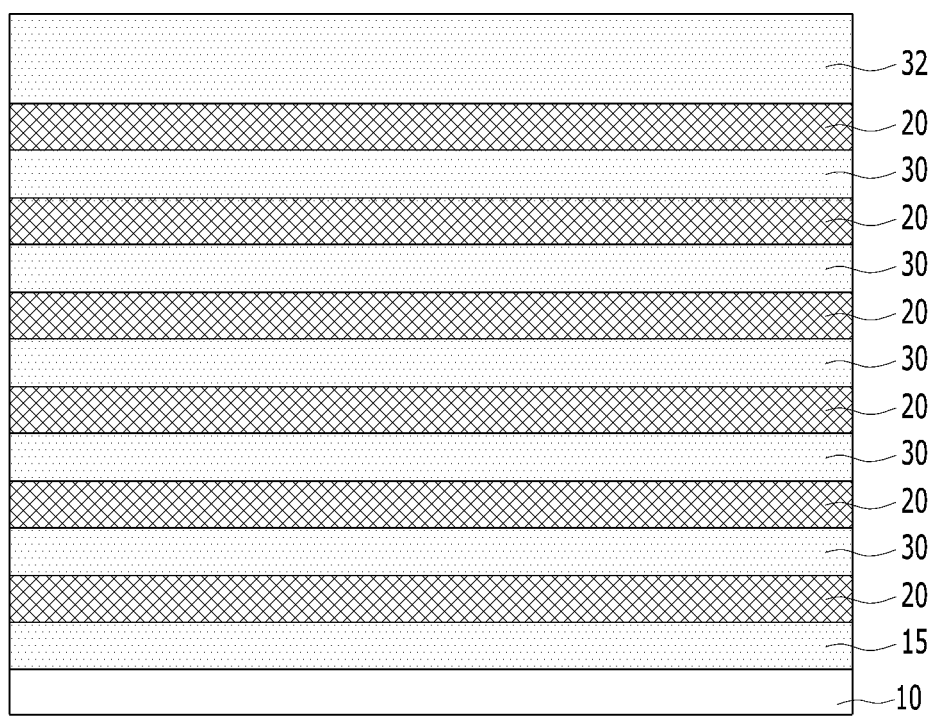
FIGS. 24 to 35 are representations of examples of views to assist in the explanation of a method for forming a nonvolatile memory device in accordance with an embodiment of the disclosure.

FIGS. 24 to 35 are representations of examples of views to assist in the explanation of a method for forming a nonvolatile memory device in accordance with an embodiment of the disclosure. Referring to FIG. 24, the method for forming a nonvolatile memory device may include forming a lowermost interlayer dielectric layer 15 on a substrate 10, alternately stacking sacrificial layers 20 and interlayer dielectric layers 30 on the lowermost interlayer dielectric layer 15, and forming an uppermost interlayer dielectric layer 32. The substrate 10 may include a monocrystalline silicon layer. The lowermost interlayer dielectric layer 15 may include a dielectric layer such as a metal oxide such as a silicon oxide ($SiO_2$), a hafnium oxide ($HfO_2$) or an aluminum oxide ($Al2O_3$). The sacrificial layers 20 may include a silicon nitride (SiN). The interlayer dielectric layers 30 and the uppermost interlayer dielectric layer 32 may include a dielectric layer such as a metal oxide such as a silicon oxide ($SiO_2$), a hafnium oxide ($HfO_2$) or an aluminum oxide ($Al2O_3$).

Figure 25A:
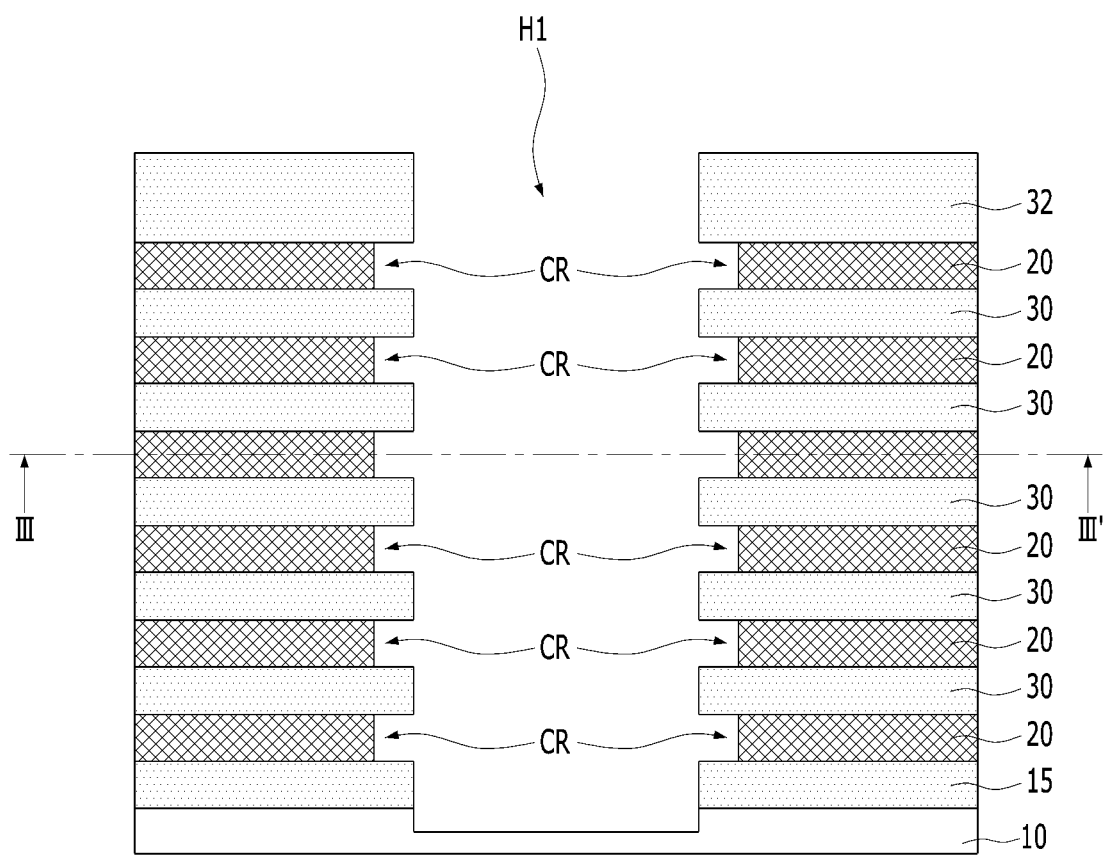
Figure 25B:
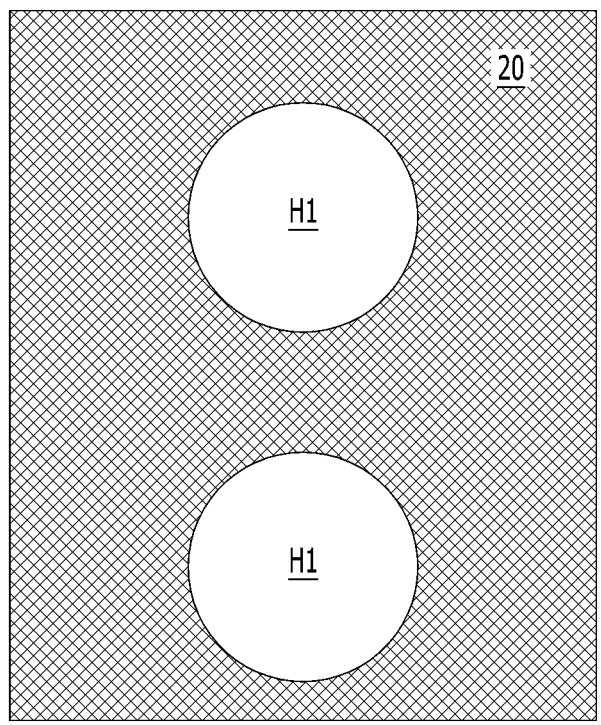

FIG. 25B is a horizontal cross-sectional view taken along the line III-III' of FIG. 25A. Referring to FIGS. 25A and 25B, the method may include forming a channel hole H1 by selectively removing the uppermost interlayer dielectric layer 32, the sacrificial layers 20, the interlayer dielectric layers 30 and the lowermost interlayer dielectric layer 15 through performing an unisotropic and isotropic etching process. The etching process may include performing an isotropic etching process for forming channel recesses CR by partially removing the sacrificial layers 20. The surface of the substrate 10 which is exposed in the channel hole H1 may be recessed.

Figure 26:
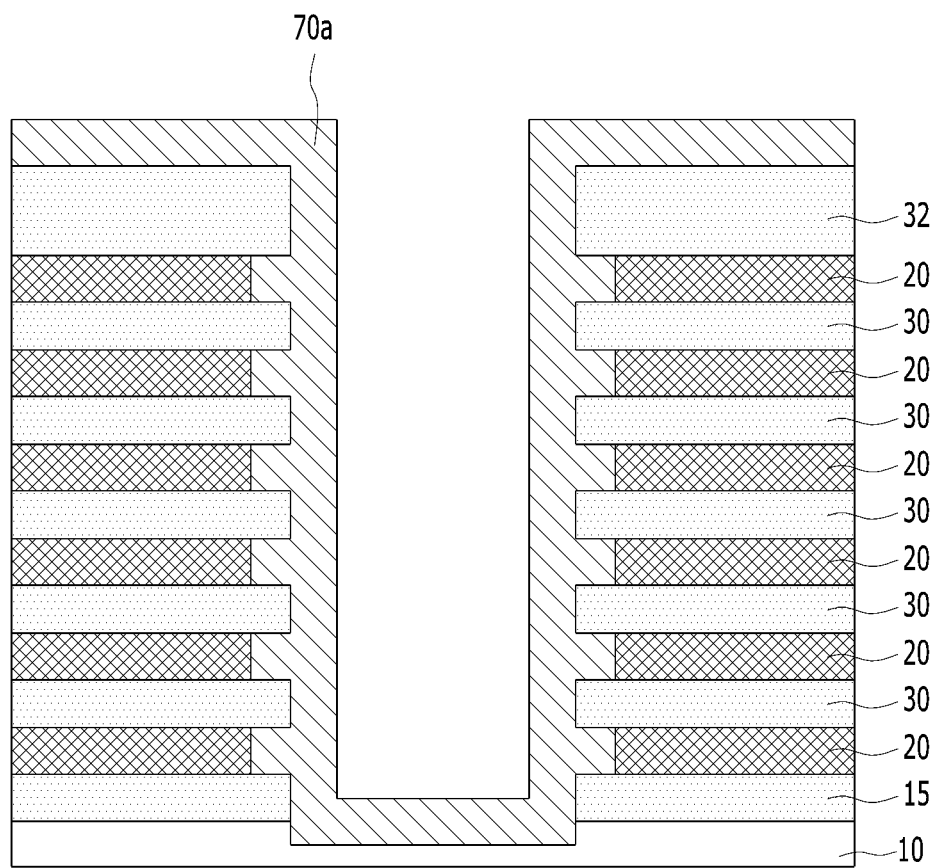

Referring to FIG. 26, the method may include forming a channel material layer 70a which fills the channel recesses CR, in the channel hole H1, by performing a deposition process. The channel material layer 70a may be conformally formed in the channel recesses CR. The channel material layer 70a may include an intrinsic semiconductor material such as an undoped polysilicon or a P-doped semiconductor material containing P-type ions. For example, the channel material layer 70a may include an undoped polysilicon or a P-doped polysilicon. In another embodiment, the channel material layer 70a may sufficiently or completely fill the channel hole H1.

Figure 27A:
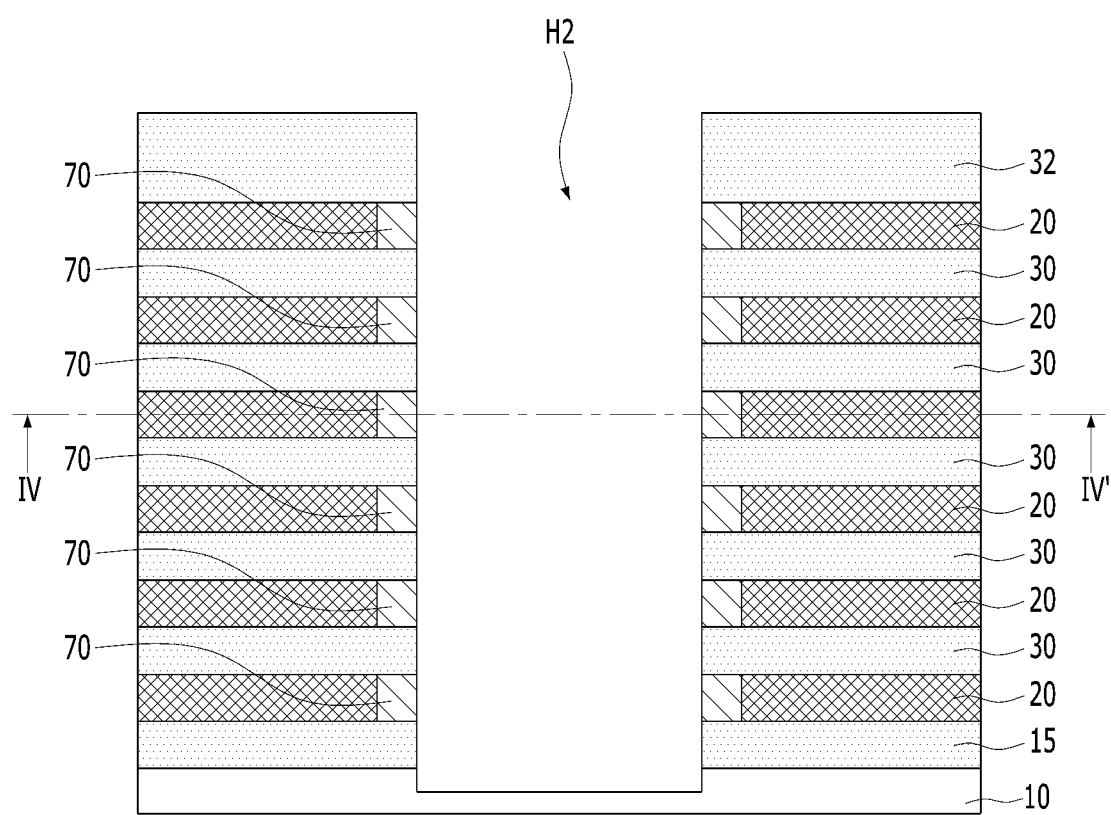
Figure 27B:
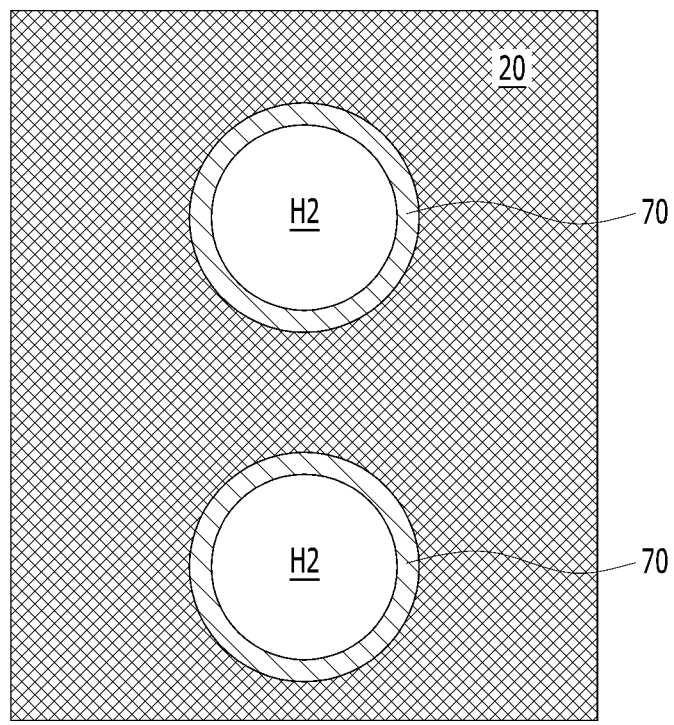

FIG. 27B is a horizontal cross-sectional view taken along the line IV-IV' of FIG. 27A. Referring to FIGS. 27A and 27B, the method may include selectively removing the channel material layer 70a in the channel hole H1 such that channel layers 70 are formed in only the channel recesses CR, by performing an unisotropic etching process. As the channel recesses CR are filled with the channel layers 70, the channel hole H1 may be converted into a gate hole H2.

Figure 28:
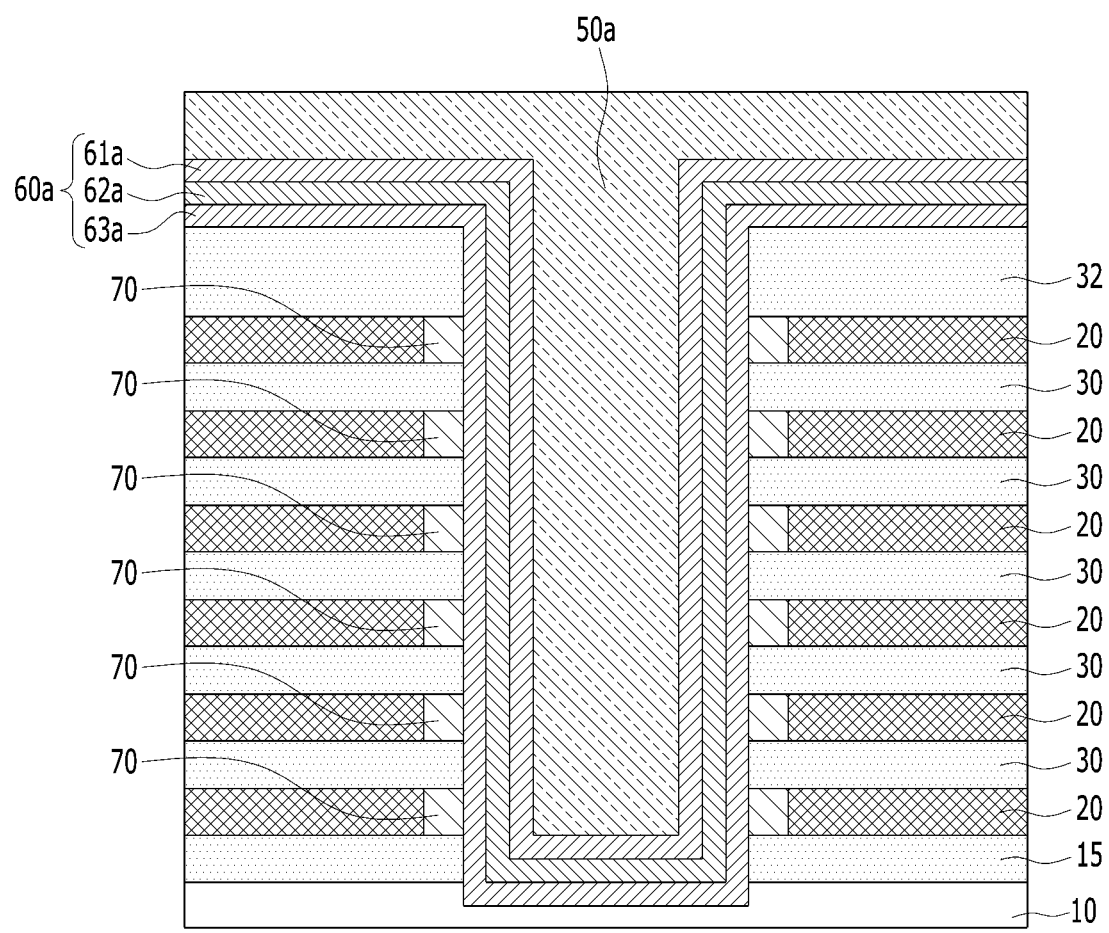

Referring to FIG. 28, the method may include forming a gate dielectric material layer 60a and a gate electrode material 50a in the gate hole H2, by performing deposition processes. The gate dielectric material layer 60a may include a first gate dielectric material layer 61a, a second gate dielectric material layer 62a and a third gate dielectric material layer 63a. In an embodiment of the disclosure, the first gate dielectric material layer 61a may include a silicon oxide ($SiO_2$), the second gate dielectric material layer 62a may include a silicon nitride (SiN), and the third gate dielectric material layer 63a may include a metal oxide such as an aluminum oxide ($Al2O_3$). In another embodiment of the disclosure, the first gate dielectric material layer 61a may include a metal oxide such as an aluminum oxide ($Al2O_3$), the second gate dielectric material layer 62a may include a silicon nitride (SiN), and the third gate dielectric material layer 63a may include a silicon oxide ($SiO_2$). The gate electrode material 50a may include a conductive material such as an N-doped polysilicon, a metal silicide such as a titanium silicide (TiSi) or a tungsten silicide (WSi), a metal such as tungsten (W), a metal compound such as a titanium nitride (TiN) or a tantalum nitride (TaN) or a metal alloy.

The gate dielectric material layer 60a may be conformally formed in the gate hole H2, and the gate electrode material 50a may completely fill the gate hole H2.

Figure 29:
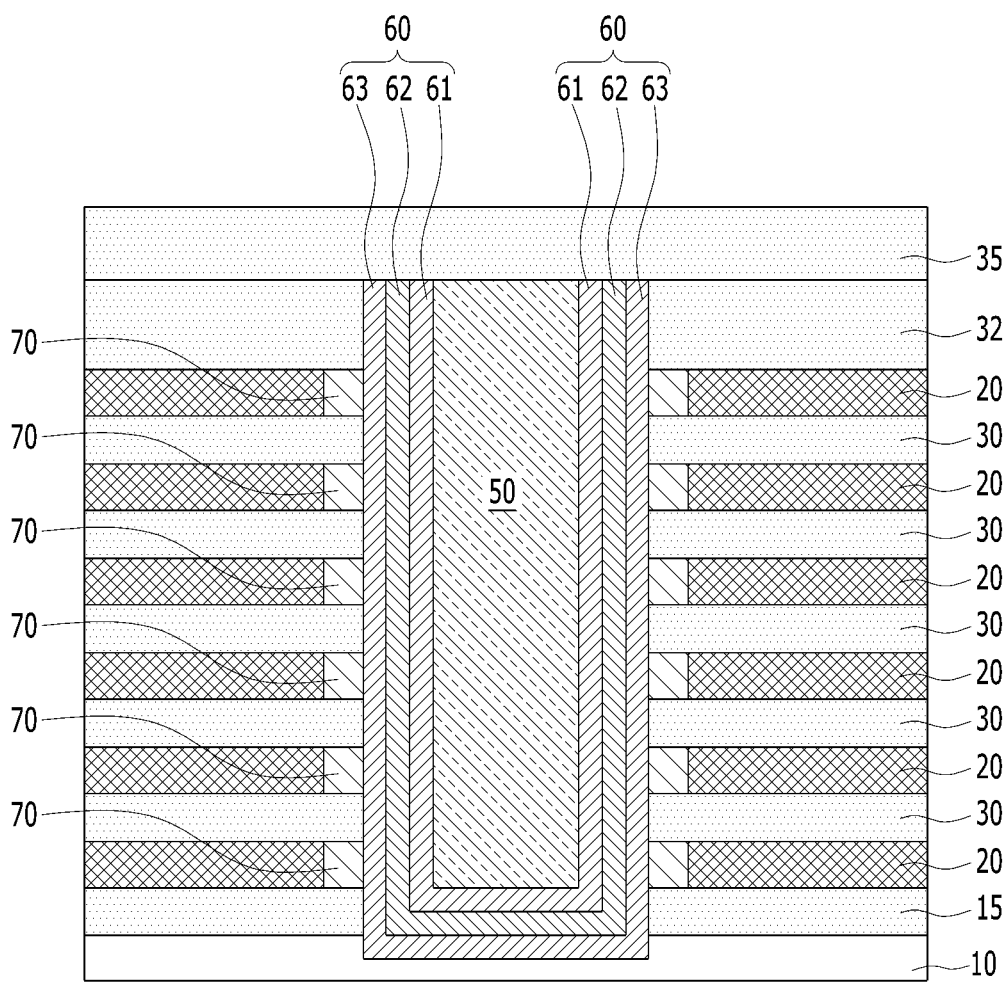

Referring to FIG. 29, the method may include forming a gate electrode 50 and a gate dielectric layer 60 by removing the gate electrode material 50a and the gate dielectric material layer 60a on the uppermost interlayer dielectric layer 32 through performing a planarization process such as CMP (chemical mechanical polishing), and forming a capping dielectric layer 35 on the gate electrode 50, the gate dielectric layer 60 and the uppermost interlayer dielectric layer 32. The gate electrode 50 may have a pillar shape or a plug shape. The gate dielectric layer 60 may include a first gate dielectric layer 61, a second gate dielectric layer 62 and a third gate dielectric layer 63. The first gate dielectric layer 61 may conformally surround the side surface and bottom surface of the gate electrode 50. The second gate dielectric layer 62 may conformally surround the side surface and bottom surface of the first gate dielectric layer 61. The third gate dielectric layer 63 may conformally surround the side surface and bottom surface of the second gate dielectric layer 62. The lower end of the gate electrode 50 may be insulated from the substrate 10. Accordingly, the gate electrode 50 may be electrically floated.

Figure 30A:
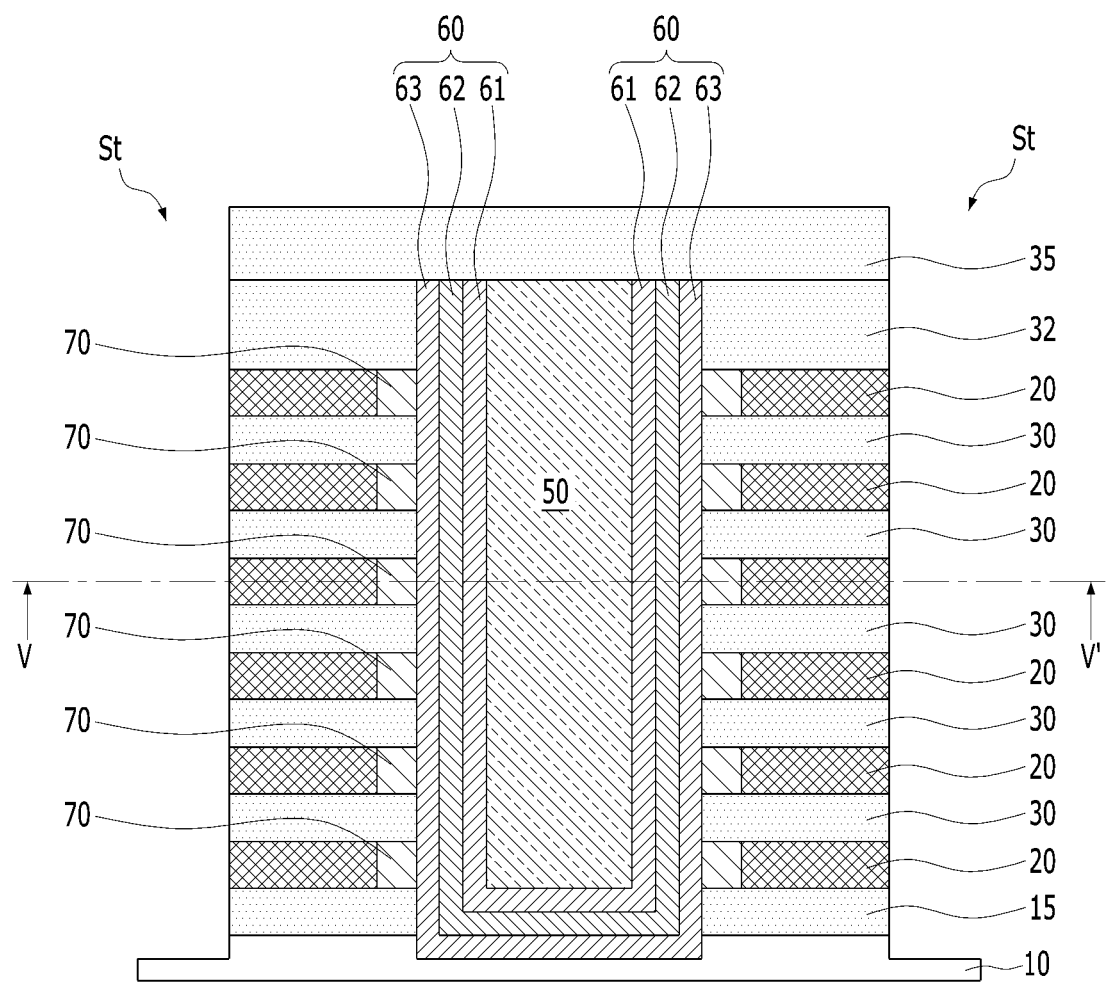
Figure 30B:
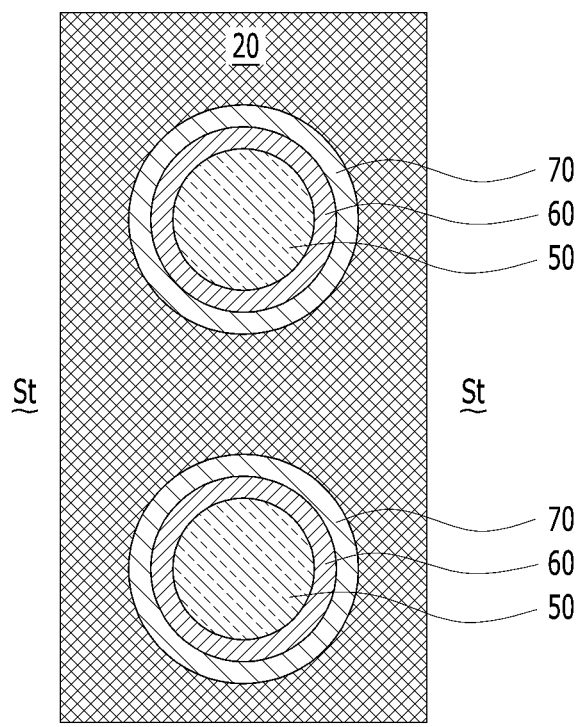

FIG. 30B is a horizontal cross-sectional view taken along the line V-V' of FIG. 30A. Referring to FIGS. 30A and 30B, the method may include forming slits St which divide the capping dielectric layer 35, the uppermost interlayer dielectric layer 32, the interlayer dielectric layers 30, the sacrificial layers 20 and the lowermost interlayer dielectric layer 15, by performing an etching process. The surfaces of the substrate 10 which are exposed in the slits St may be recessed.

Figure 31A:
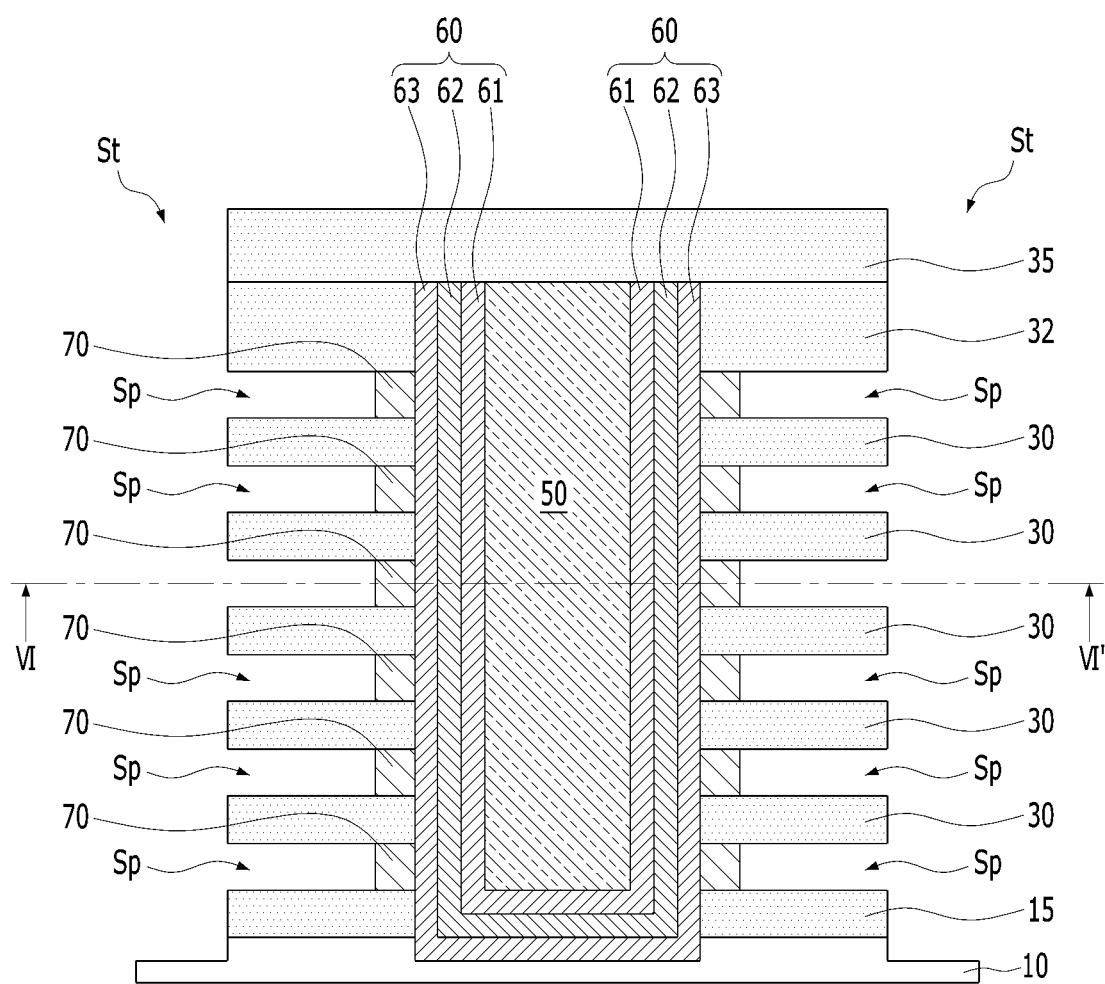
Figure 31B:
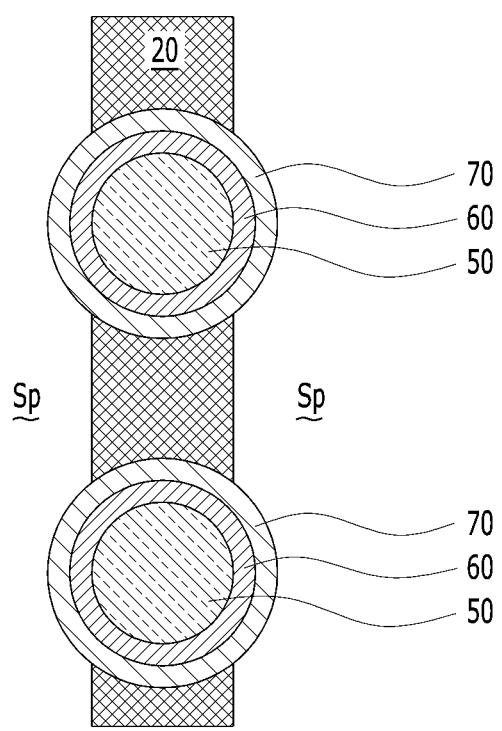

FIG. 31B is a horizontal cross-sectional view taken along the line VI-VI' of FIG. 31A. Referring to FIGS. 31A and 31B, the method may include forming spaces Sp which expose the side surfaces of the channel layers 70, by removing portions of the sacrificial layers 20 through performing an isotropic etching process through the slits St. The sacrificial layers 20 may not be entirely removed, and may remain between the spaces Sp to couple the channel layers 70. That is to say, the sacrificial layers 20 may spatially divide and separate the spaces Sp.

Figure 32:
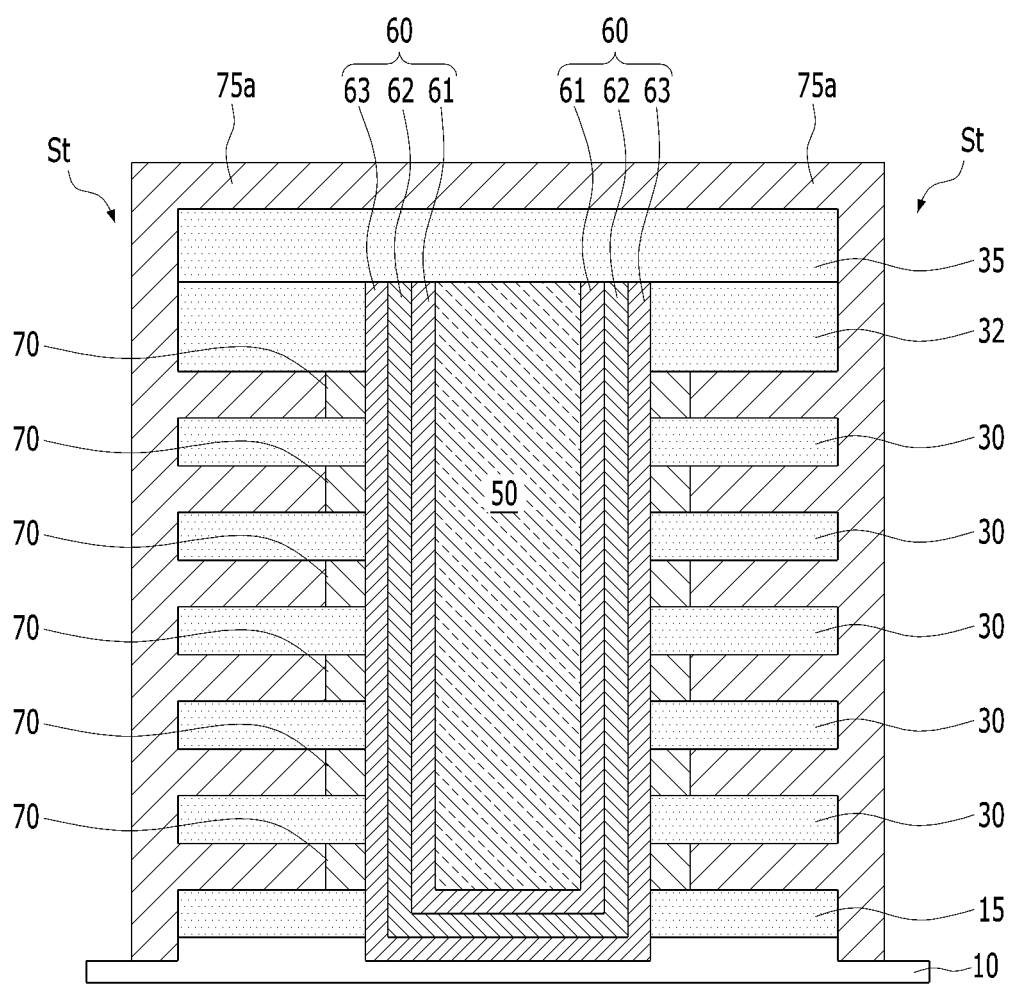

Referring to FIG. 32, the method may include forming a conductive material layer 75a which fills the spaces Sp. The conductive material layer 75a may include at least one among an N-doped polysilicon, a metal silicide such as a titanium silicide (TiSi) or a tungsten silicide (WSi), a metal such as tungsten (W), a metal compound such as a titanium nitride (TiN) or a tantalum nitride (TaN) and a metal alloy.

Figure 33A:
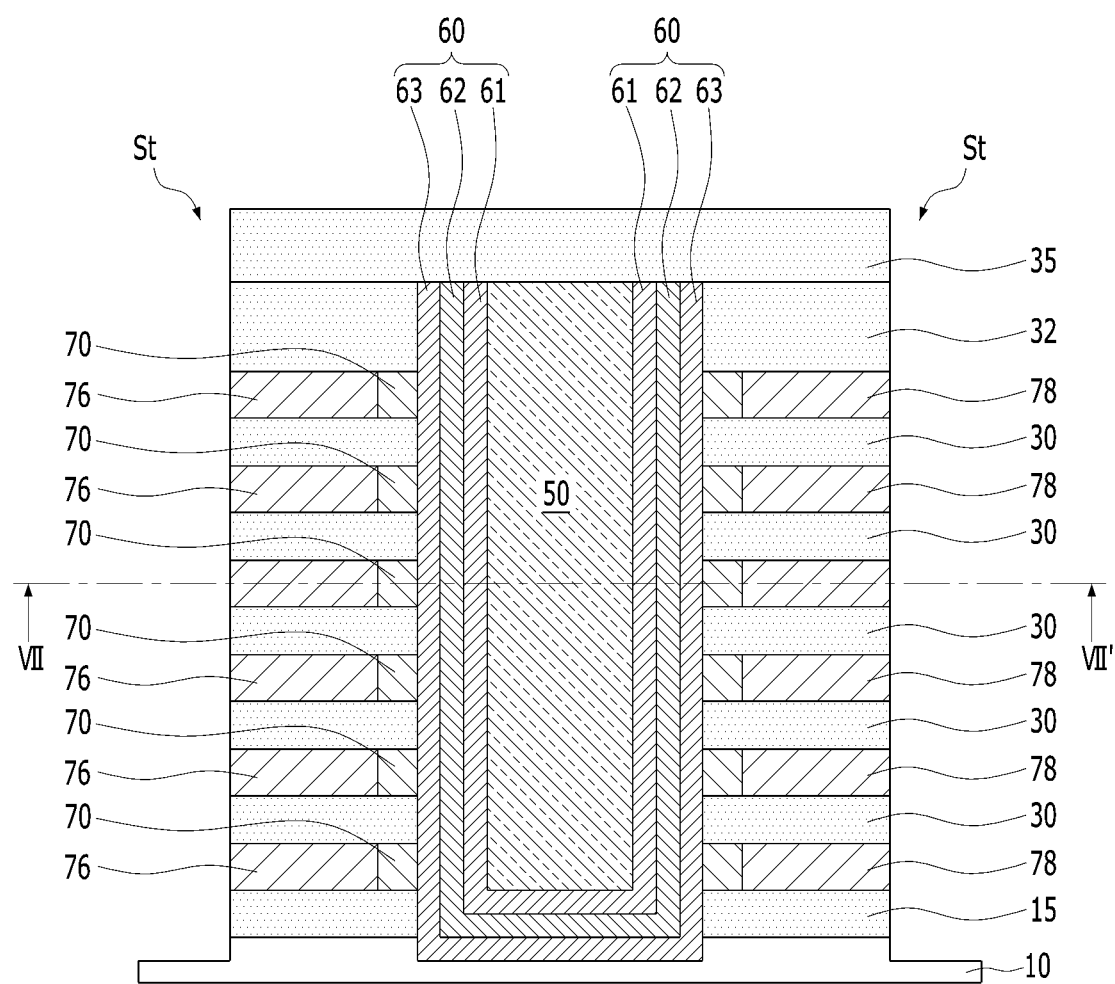
Figure 33B:
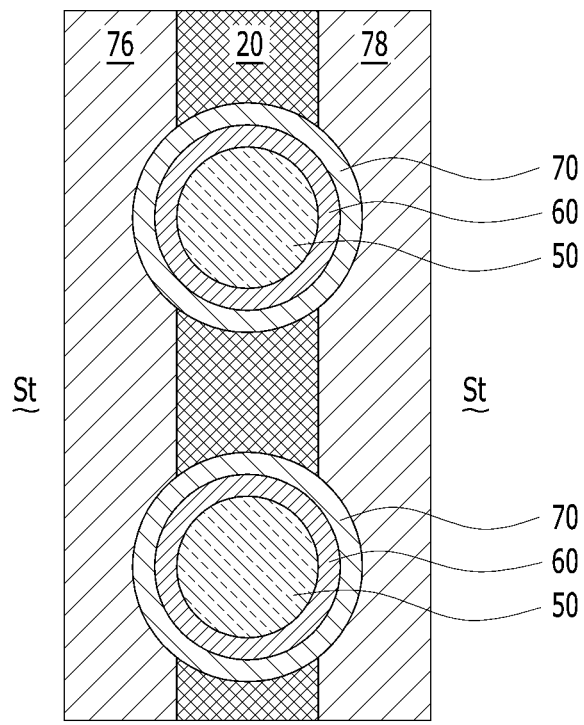

FIG. 33B is a horizontal cross-sectional view taken along the line VII-VII' of FIG. 33A. Referring to FIGS. 33A and 33B, the method may include forming bit lines 76 and source lines 78 by leaving the conductive material layer 75a in the spaces Sp, through performing an unisotropic etching process.

Figure 34A:
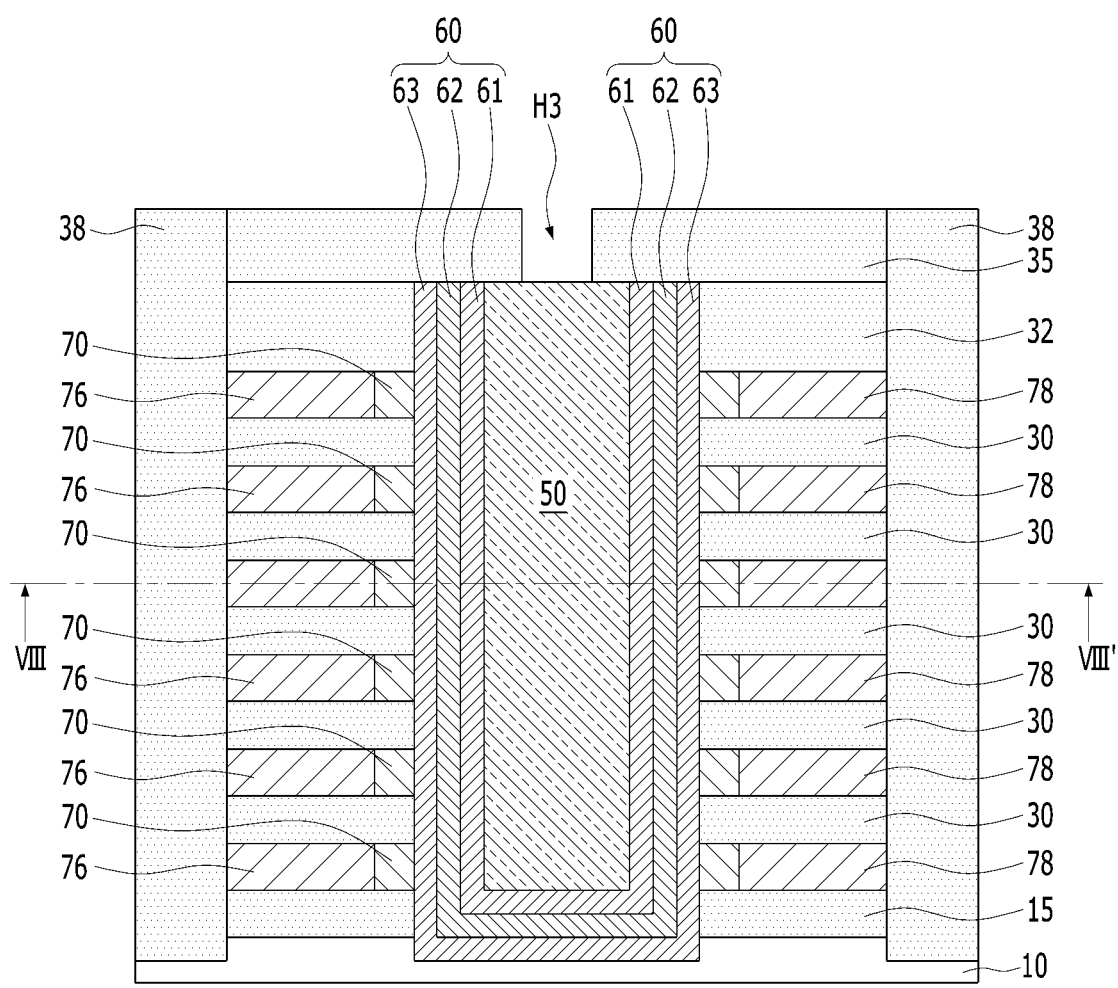
Figure 34B:
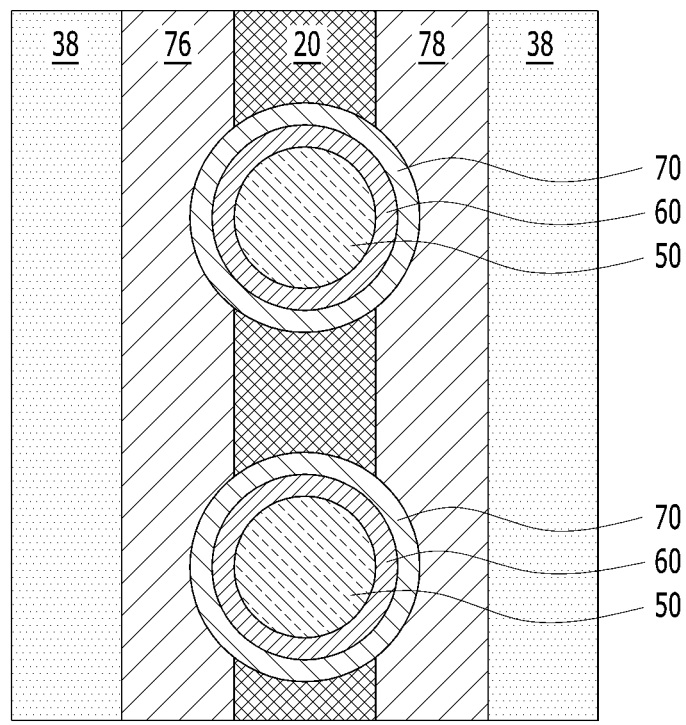

FIG. 34B is a horizontal cross-sectional view taken along the line VIII-VIII' of FIG. 34A. Referring to FIGS. 34A and 34B, the method may include forming a gate contact hole H3 which exposes a portion of the gate electrode 50, by selectively removing the capping dielectric layer 35 through performing an etching process after filling a filling dielectric layer 38 in the slits St by performing a deposition process. The filling dielectric layer 38 may include a silicon oxide ($SiO_2$).

Figure 35:
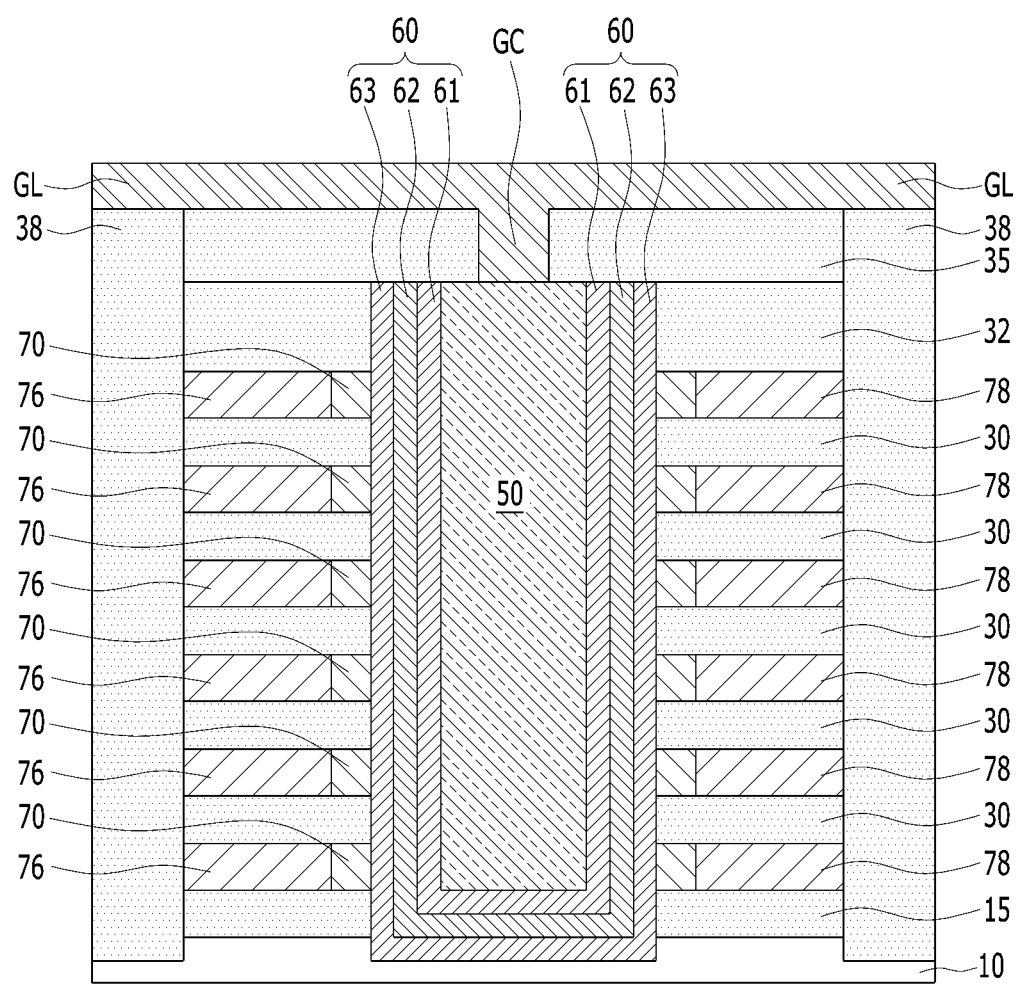

Referring to FIG. 35, the method may include forming a gate contact plug GC which fills the gate contact hole H3 and forming a gate line GL on the gate contact plug GC and the capping dielectric layer 35, by performing a deposition process. The gate contact plug GC and the gate line GL may include at least one among an N-doped polysilicon, a metal silicide such as a titanium silicide (TiSi) or a tungsten silicide (WSi), a metal such as tungsten (W), a metal compound such as a titanium nitride (TiN) or a tantalum nitride (TaN) and a metal alloy.

Figure 36A:
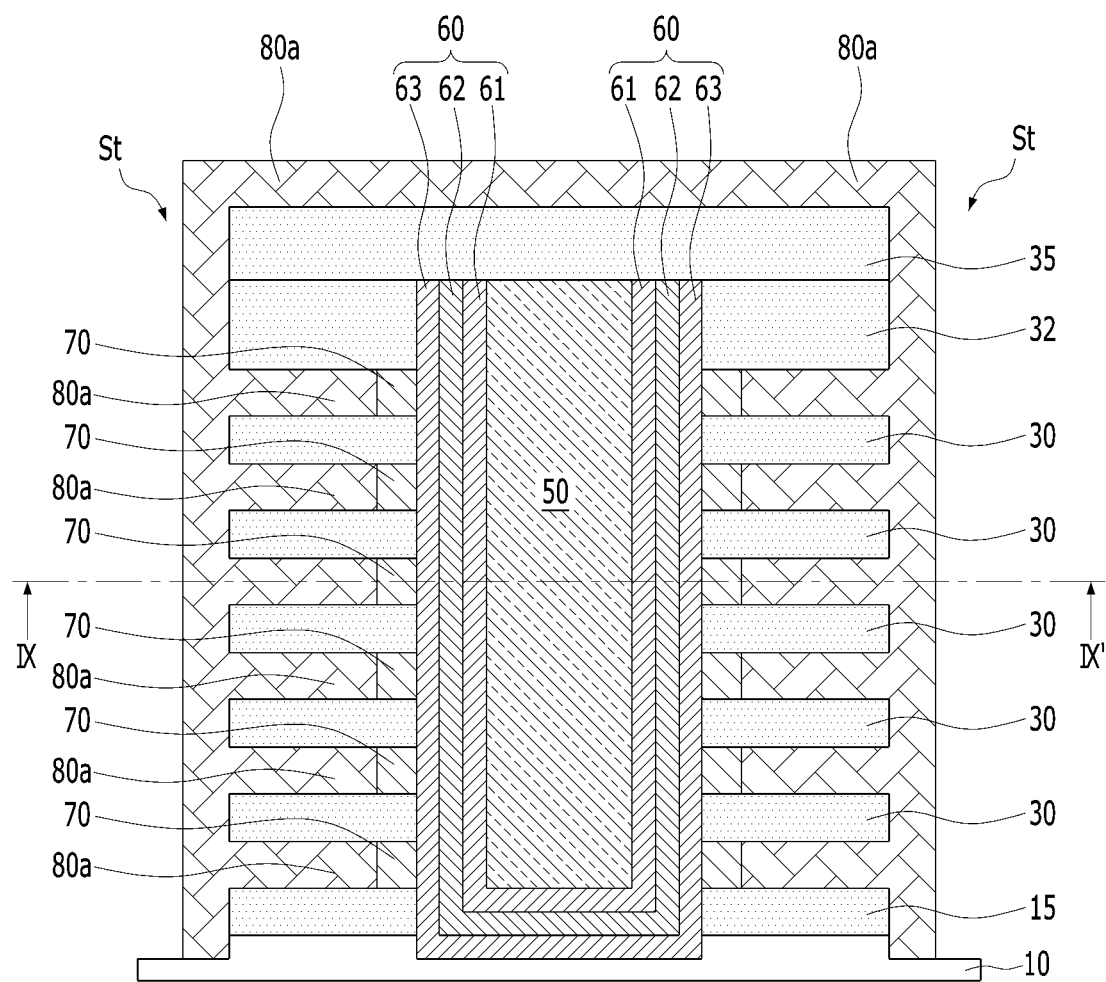
Figure 36B:
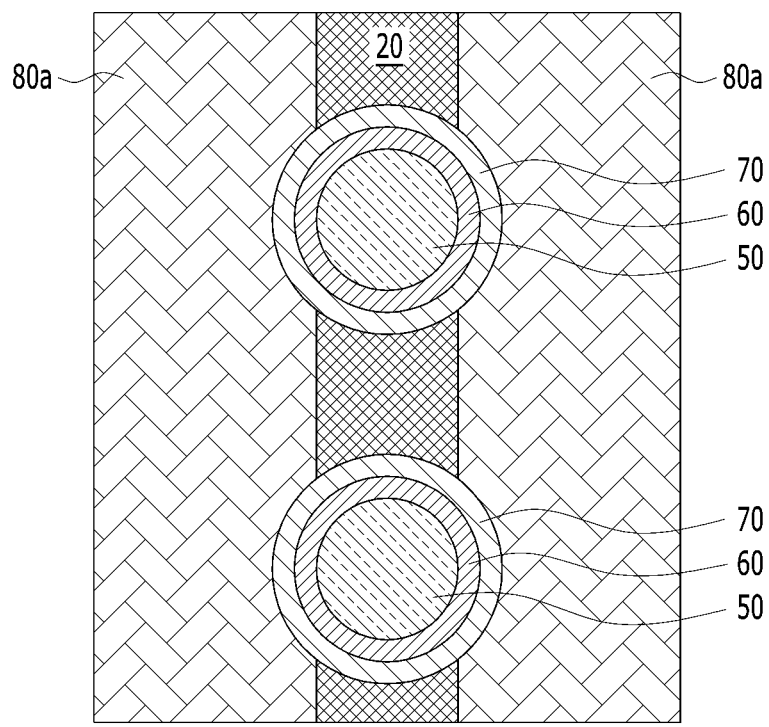
Figure 37A:
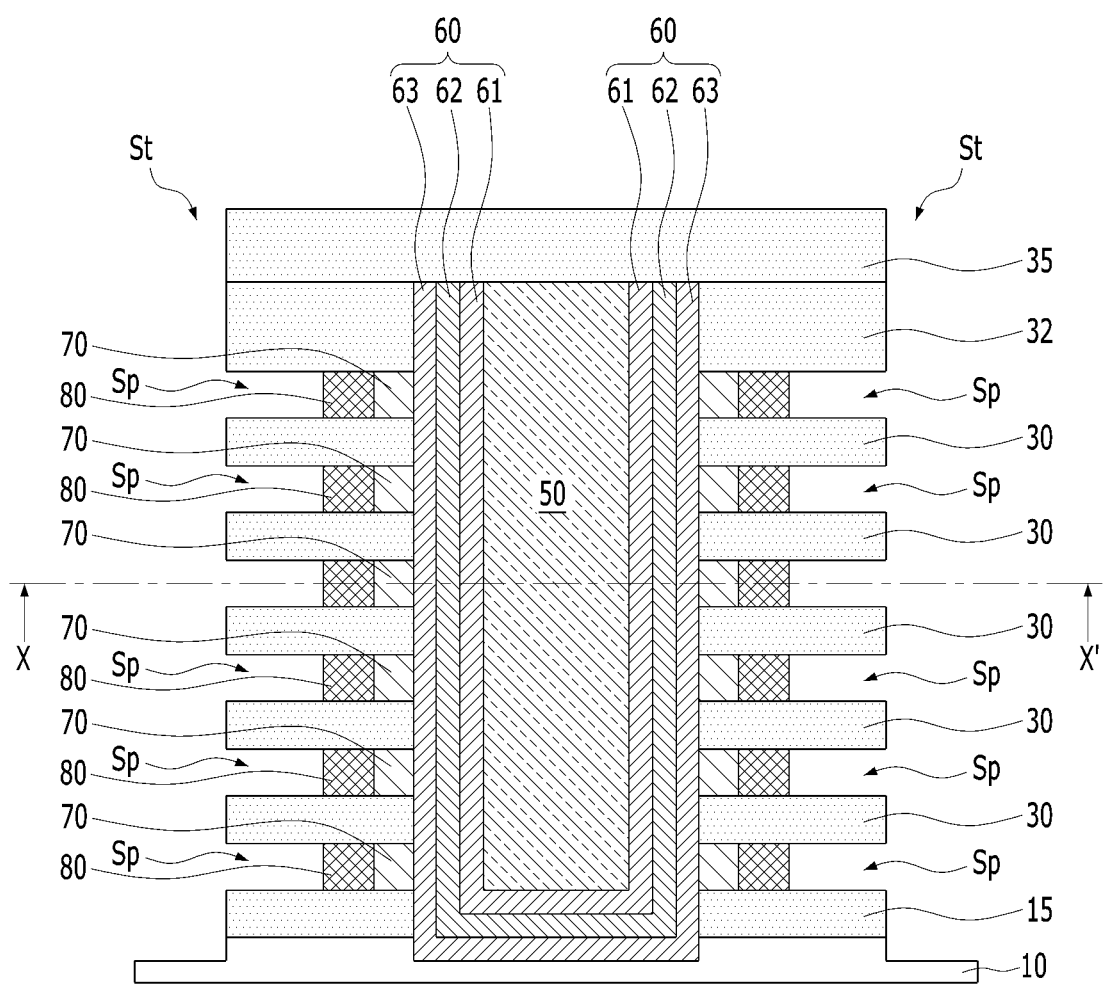
Figure 37B:
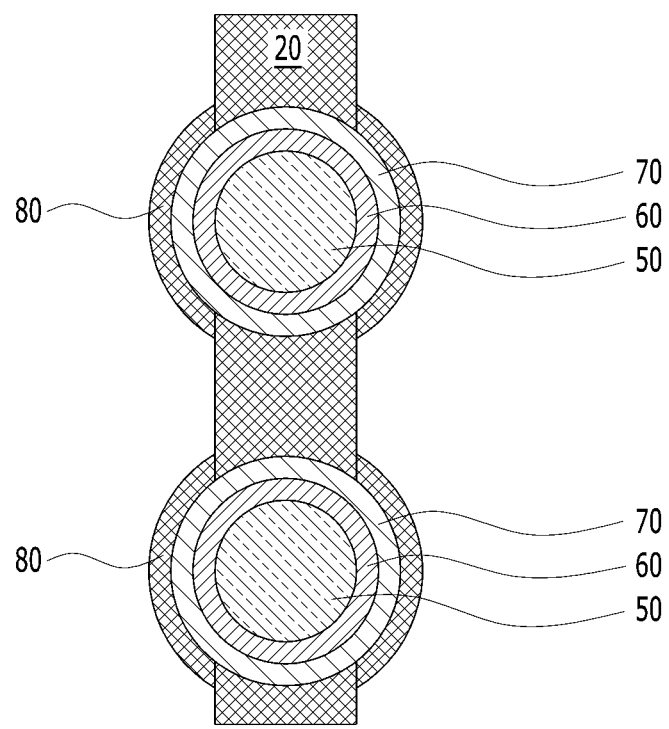
Figure 38A:
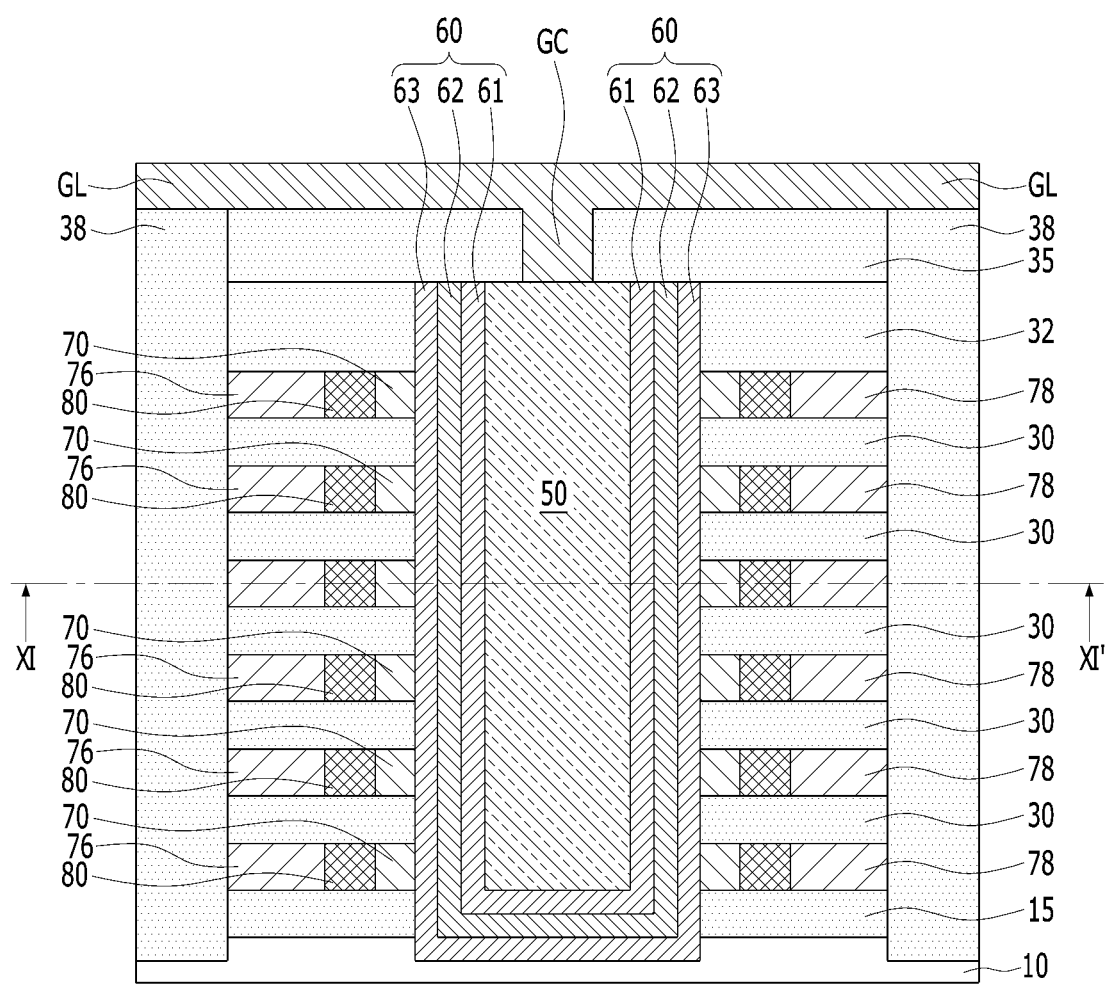
Figure 38B:
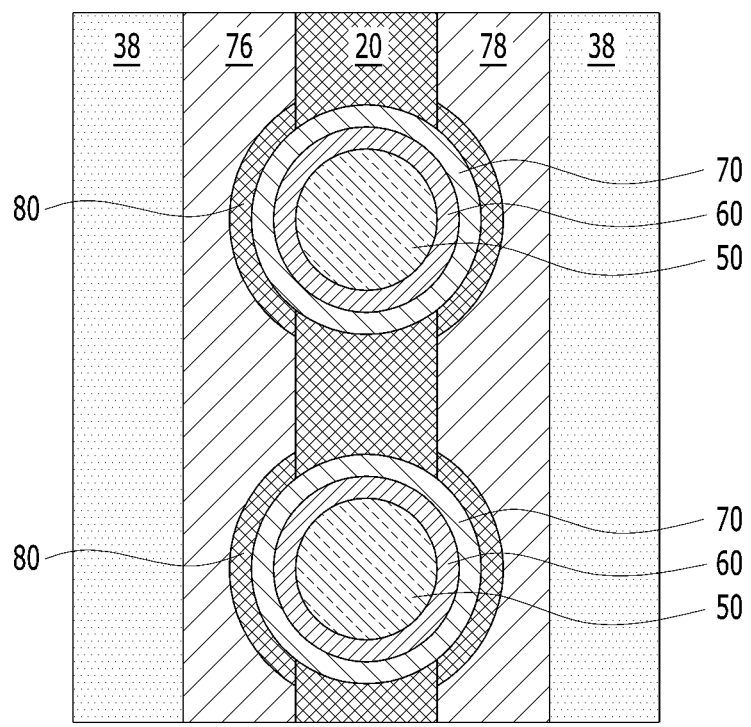

FIGS. 36A and 36B to 38A and 38B are representations of examples of views to assist in the explanation of a method for forming a nonvolatile memory device in accordance with an embodiment of the disclosure. FIGS. 36A, 37A and 38A are vertical cross-sectional views, and FIGS. 36B, 37B and 38B are horizontal cross-sectional views taken along the lines IX-IX', X-X' and XI-XI' of FIGS. 36A, 37A and 38A. Referring to FIGS. 36A and 36B, the method for forming a nonvolatile memory device may include forming a buffer material layer 80a which fills the spaces Sp, after performing the processes described above with reference to FIGS. 24 to 31A and 31B. The buffer material layer 80a may include a metal such as tungsten (W), titanium (Ti), nickel (Ni), cobalt (Co) or tantalum (Ta) or a metal compound such as a titanium nitride (TiN) or a tantalum nitride (TaN). In the case where the buffer material layer 80a includes a metal, the method may include performing a silicidation process. For example, a portion of the buffer material layer 80a which is brought into contact with the channel layers 70 may be converted into a metal silicide as the channel layers 70 and the buffer material layer 80a undergo a silicidation reaction.

Referring to FIGS. 37A and 37B, the method may include forming buffer layers 80 in the spaces Sp, by performing an isotropic etching process. In the case where the buffer layers 80 include a metal silicide, the etching process may include removing the buffer material layer 80a which is not silicided. Alternatively, in the case where the buffer layers 80 include a metal compound, the etching process may include leaving the buffer material layer 80a partially in the spaces Sp. The buffer layers 80 may be formed in the shape of a meniscus-like semi-disc shapes on the outer side surfaces of the channel layers 70.

Referring to FIGS. 38A and 38B, the method may include forming bit lines 76 and source lines 78, forming a filling dielectric layer 38, forming a gate contact plug GC and forming a gate line GL, by performing the processes described above with reference to FIGS. 32 to 35.

Figure 39:
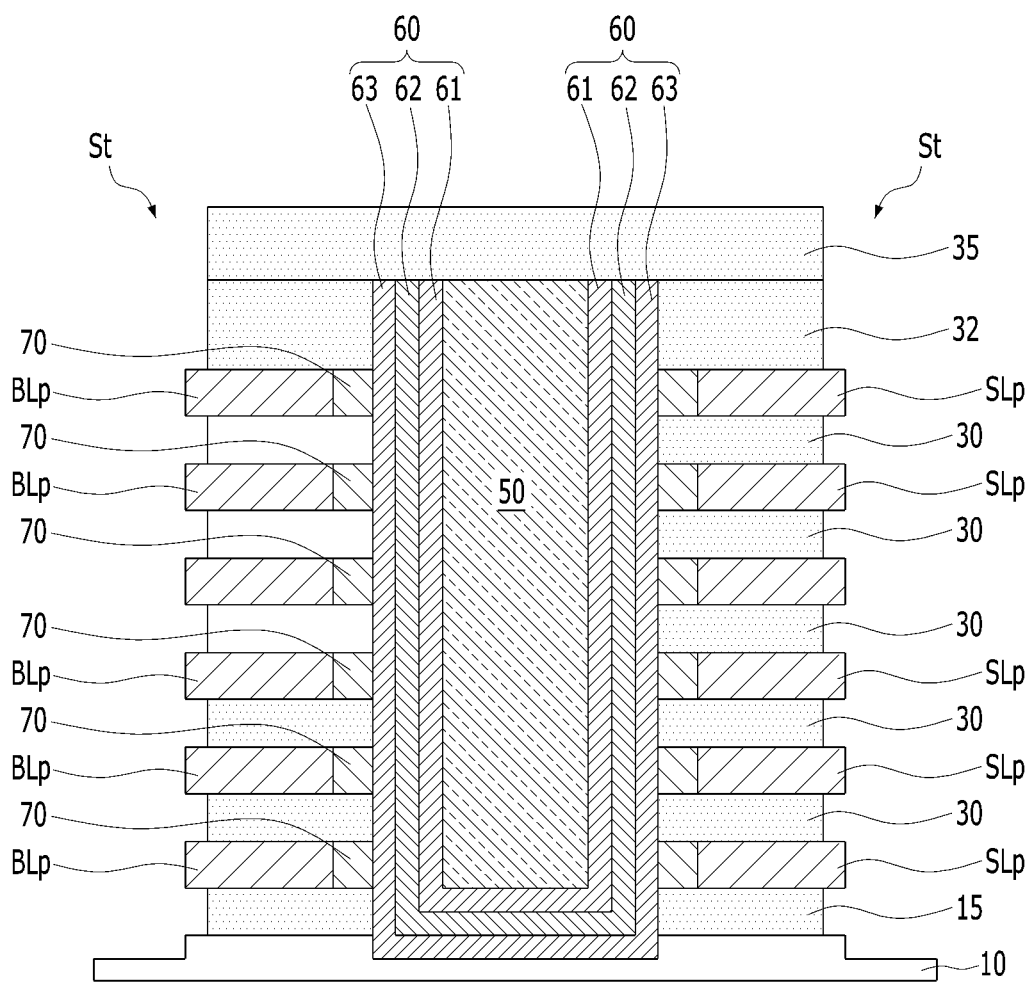
Figure 40A:
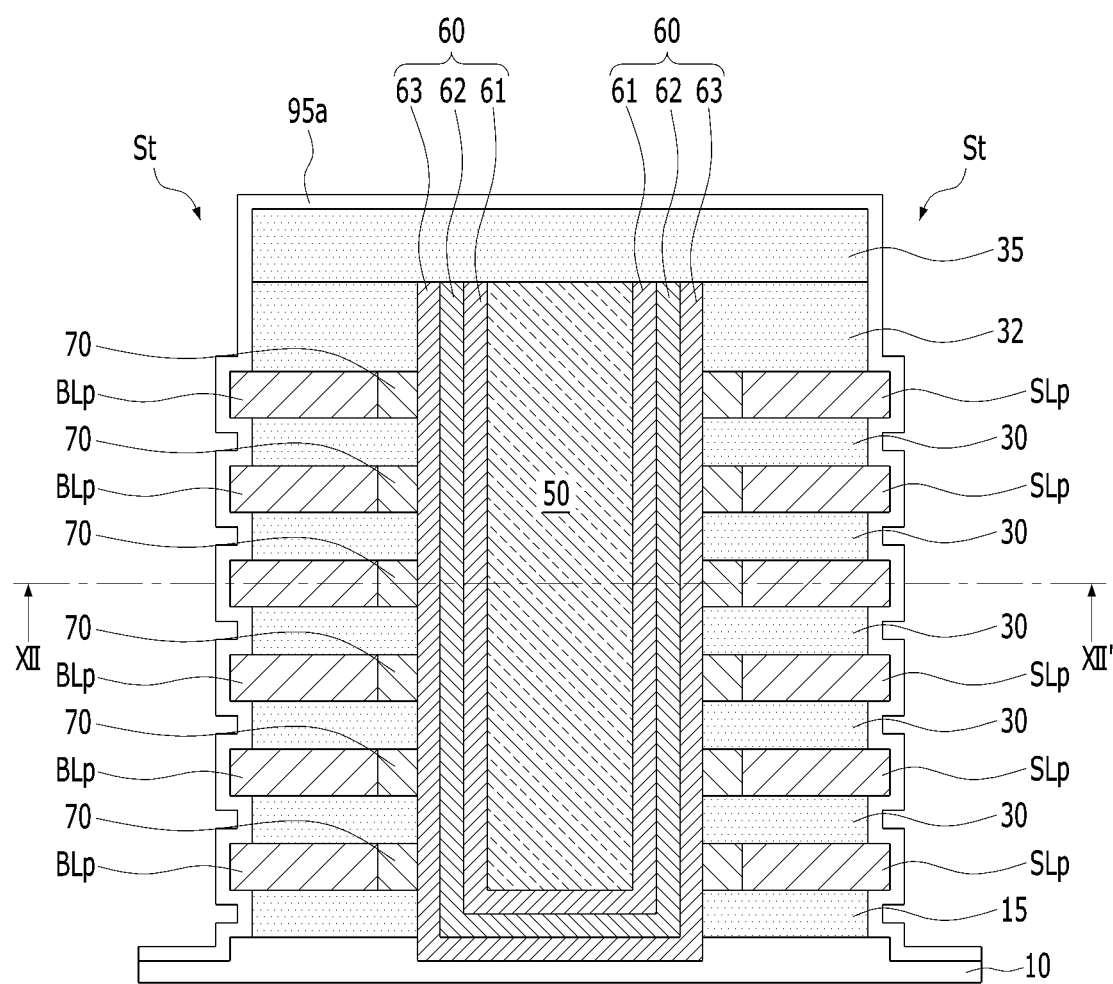
Figure 40B:
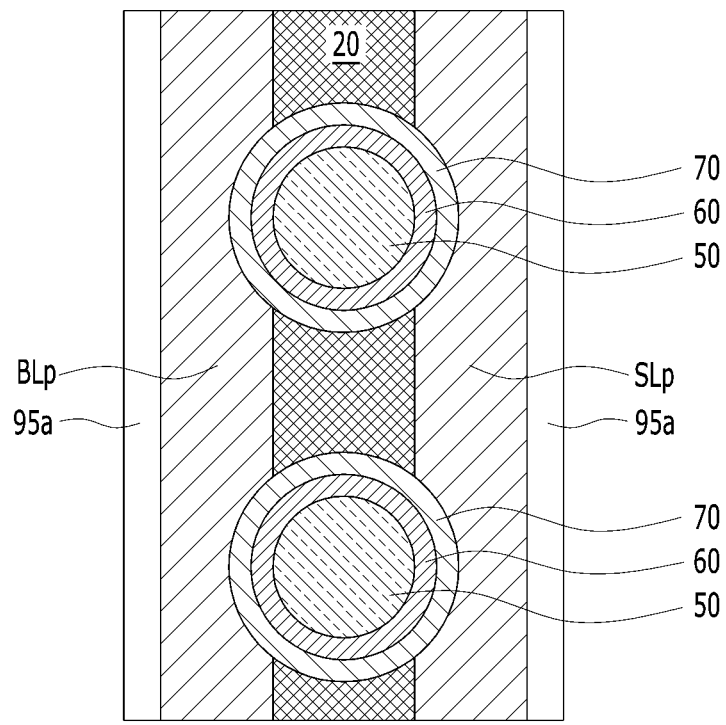
Figure 41A:
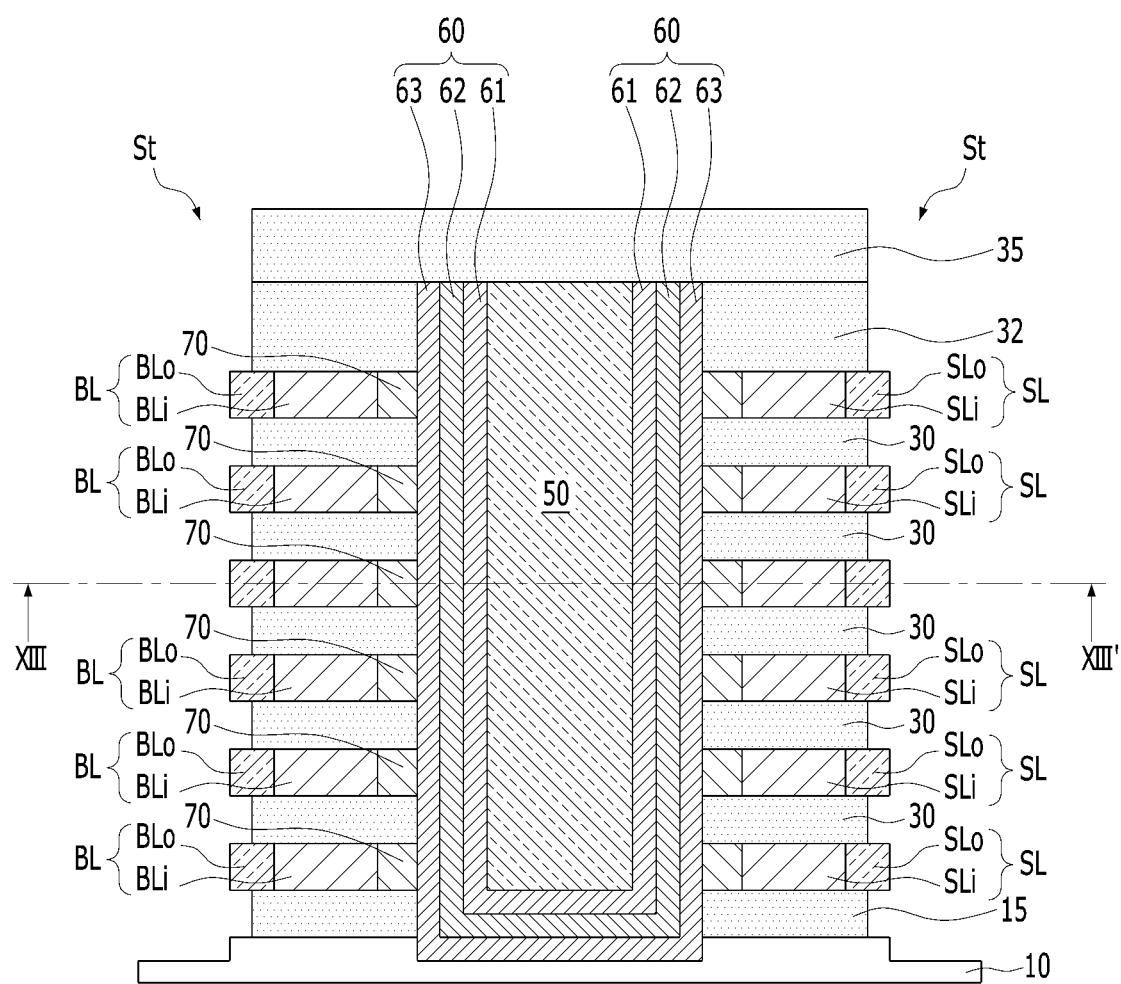
Figure 41B:
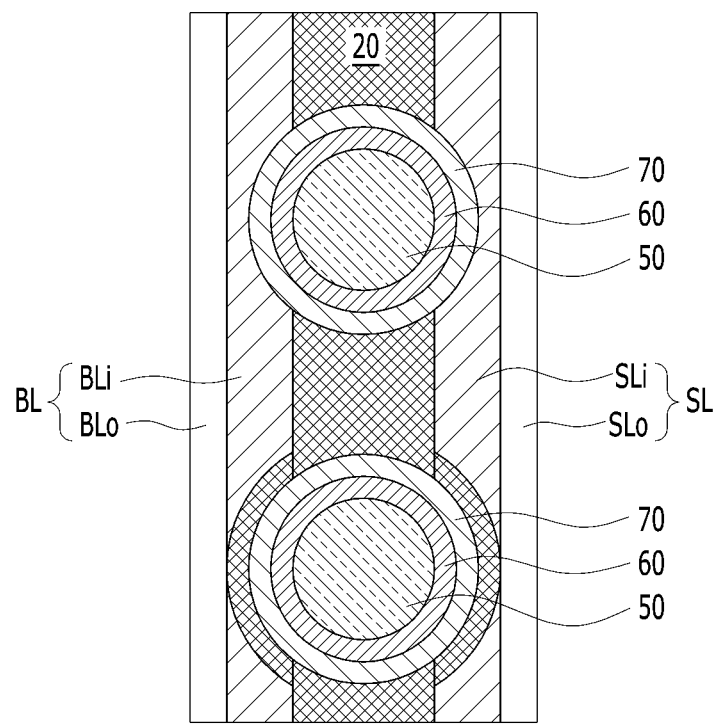

FIGS. 39 to 41A and 41B are representations of examples of views to assist in the explanation of a method for forming a nonvolatile memory device in accordance with an embodiment of the disclosure. FIGS. 39, 40A and 41A are vertical cross-sectional views, and FIGS. 40B and 41B are horizontal cross-sectional views taken along the lines XII-XII' and XIII-XIII' of FIGS. 40A and 41A. Referring to FIG. 39, the method for forming a nonvolatile memory device may include partially removing and recessing the surfaces of the interlayer dielectric layers 30, the uppermost interlayer dielectric layer 32 and the capping dielectric layer 35, after performing the processes described above with reference to FIGS. 24 to 33A and 33B. According to this fact, the bit lines 76 and the source lines 78 may be converted into pre-bit lines BLp and pre-source lines SLp which have shapes horizontally projecting out of the sidewalls of the interlayer dielectric layers 30 and the uppermost interlayer dielectric layer 32.

FIG. 40B is a horizontal cross-sectional view taken along the line XII-XII' of FIG. 40A. Referring to FIGS. 40A and 40B, the method may include conformally forming a metal layer 95a on the projecting portions of the pre-bit lines BLp and the pre-source lines SLp, the exposed sidewalls of the interlayer dielectric layers 30 and the uppermost interlayer dielectric layer 32 and the surfaces of the capping dielectric layer 35. The metal layer 95*a* may be formed by performing a deposition process such as PVD (physical vapor deposition) or CVD (chemical vapor deposition). The metal layer 95*a* may include at least one among various metals such as tungsten (W), titanium (Ti), tantalum (Ta), cobalt (Co), nickel (Ni) and aluminum (Al).

FIG. 41B is a horizontal cross-sectional view taken along the line XIII-XIII' of FIG. 41A. Referring to FIGS. 41A and 41B, the method may include performing an annealing process for forming a silicide and removing the metal layer 95*a*. The annealing process may include causing the metal atoms of the metal layer 95*a* and portions of the pre-bit lines BLp and portions of the pre-source lines SLp to undergo a silicidation reaction, by heating the metal layer 95*a* to about 400° C. During this process, the portions of the pre-bit lines BLp and the portions of the pre-source lines SLp may be converted into a metal silicide. The metal silicide may include a tungsten silicide (WSi), a titanium silicide (TiSi), a tantalum silicide (TaSi), a cobalt silicide (CoSi), a nickel silicide (NiSi), or various metal silicides (M-Si). Thereafter, as the metal layer 95*a* which is not converted into the metal silicide by the silicidation reaction is removed, bit lines BL and source lines SL including inner bit lines BLi and inner source lines SLi which include a conductive N-doped polysilicon and outer bit lines BLo and outer source lines SLo which include a metal silicide may be formed. Then, the method may include performing the processes described above with reference to FIGS. 34A, 34B and 35, and accordingly, the nonvolatile memory device illustrated in FIGS. 5A and 5B may be formed.

Figure 42:
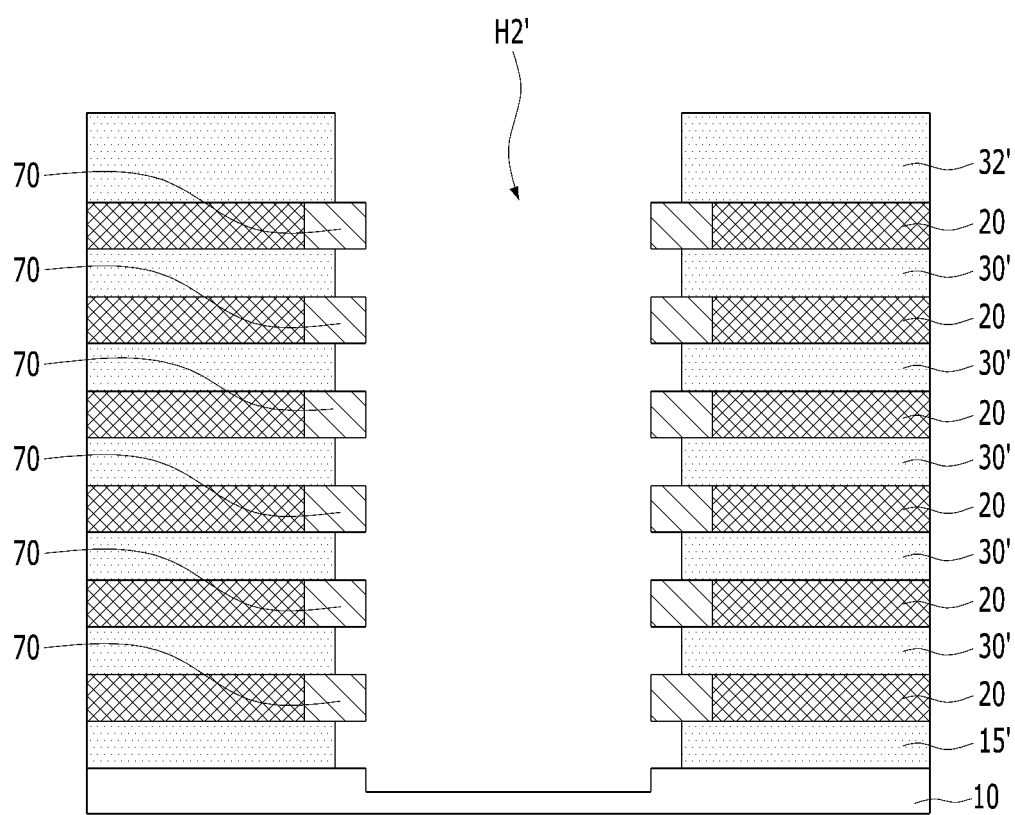
FIGS. 42 to 46 are representations of examples of views to assist in the explanation of a method for forming a nonvolatile memory device in accordance with an embodiment of the disclosure.

FIGS. 42 to 46 are representations of examples of views to assist in the explanation of a method for forming a nonvolatile memory device in accordance with an embodiment of the disclosure. Referring to FIG. 42, the method for forming a nonvolatile memory device in accordance with the embodiment of the disclosure may include projecting the channel layers 70 in a horizontal direction by recessing the interlayer dielectric layers 30 in the horizontal direction through performing an isotropic etching process, after performing the processes described above with reference to FIGS. 24 to 27A and 27B. The gate hole H2 may be extended to an extended gate hole H2'.

Figure 43:
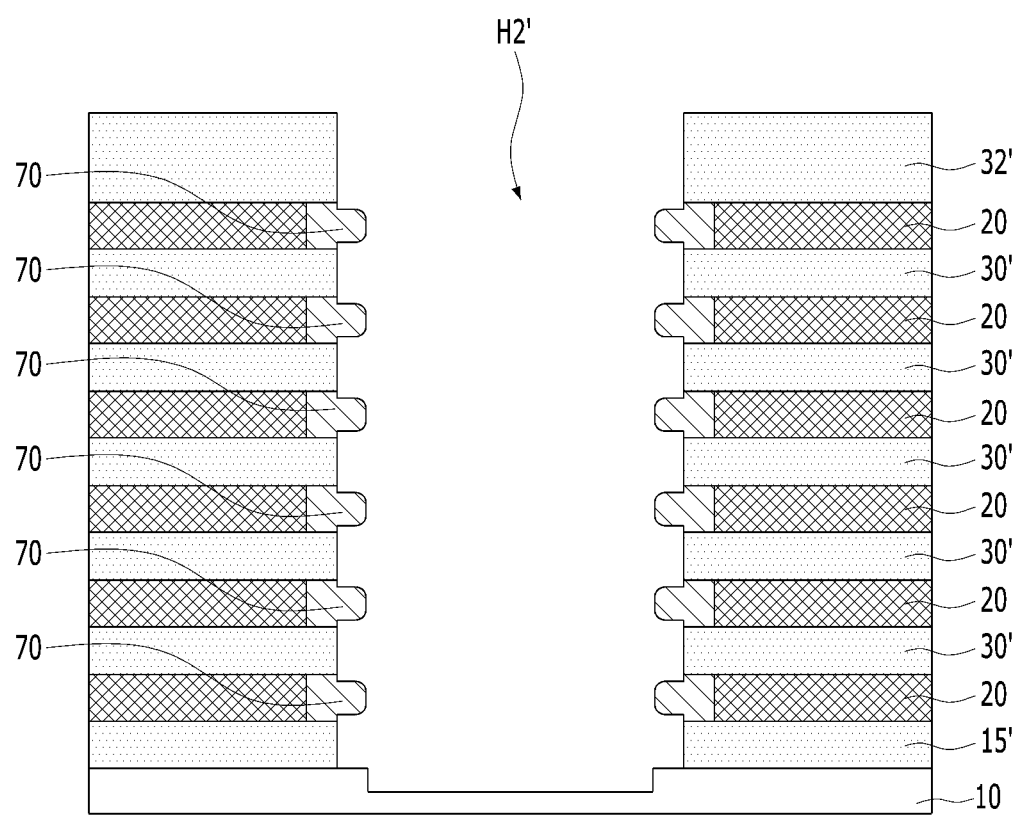

Referring to FIG. 43, the method may include partially removing the projecting portions of the channel layers 70 by performing an etching process or a cleaning process. In detail, the method may include slightly oxidating the surfaces of the projecting portions of the channel layers 70 and removing the oxidated surfaces. In another embodiment, the method may include naturally oxidating the surfaces of the projecting portions of the channel layers 70 and removing the naturally oxidated surfaces. The etching process or the cleaning process may be performed by using a wet etchant including diluted hydrofluoric acid (HF).

Figure 44:
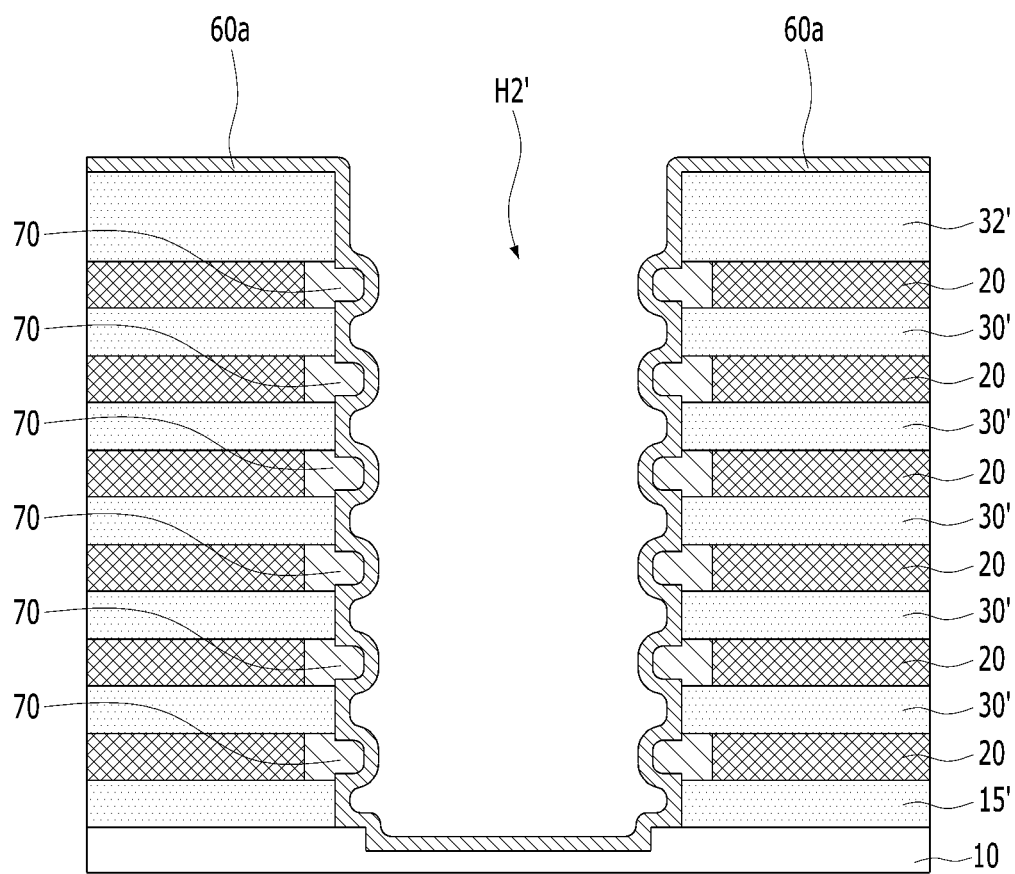

Referring to FIG. 44, the method may include conformally forming a gate dielectric material layer 60*a* in the extended gate hole H2', by performing a deposition process. The gate dielectric material layer 60*a* may be conformally formed along sidewall profiles of the channel layers 70 and interlayer dielectric layers 30' to have a wave shape, a concavo-convex shape or a zigzag shape. Referring to FIG. 28, the gate dielectric material layer 60*a* may include first to third gate dielectric material layers 61*a*, 62*a* and 63*a*.

Figure 45:
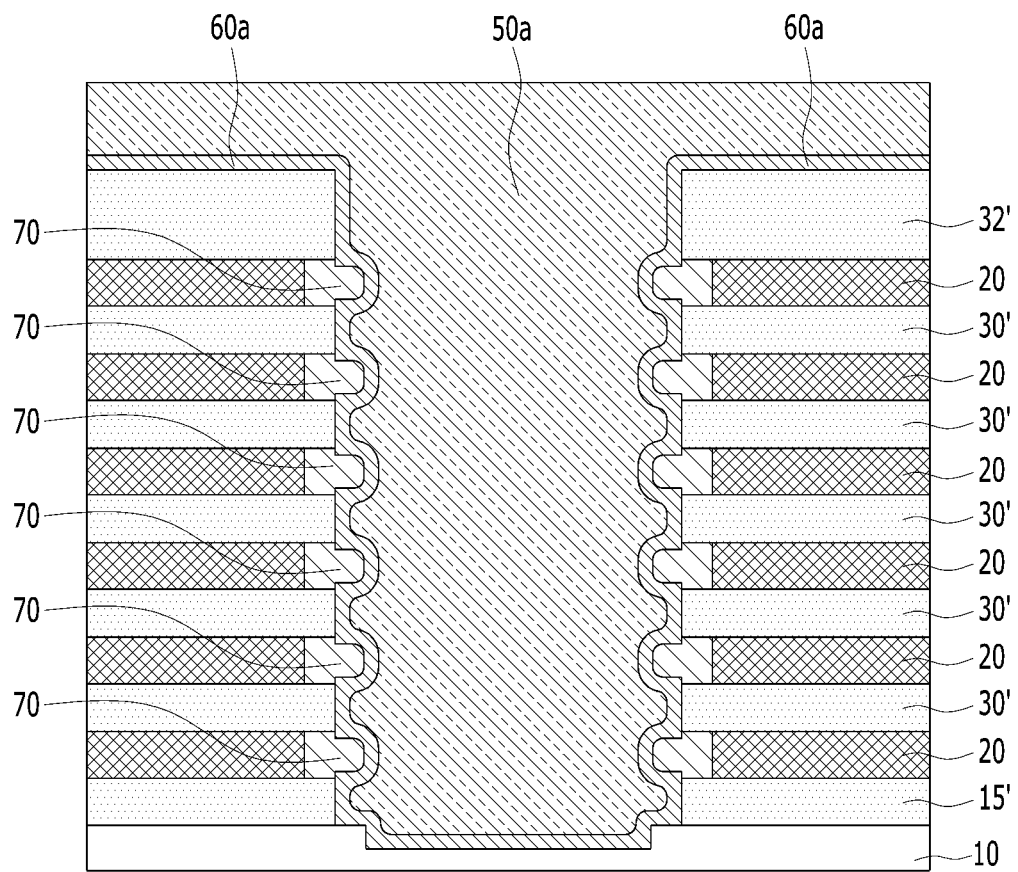

Referring to FIG. 45, the method may include forming a gate electrode material layer 50*a* in the extended gate hole H2', by referring to FIG. 28.

Figure 46:
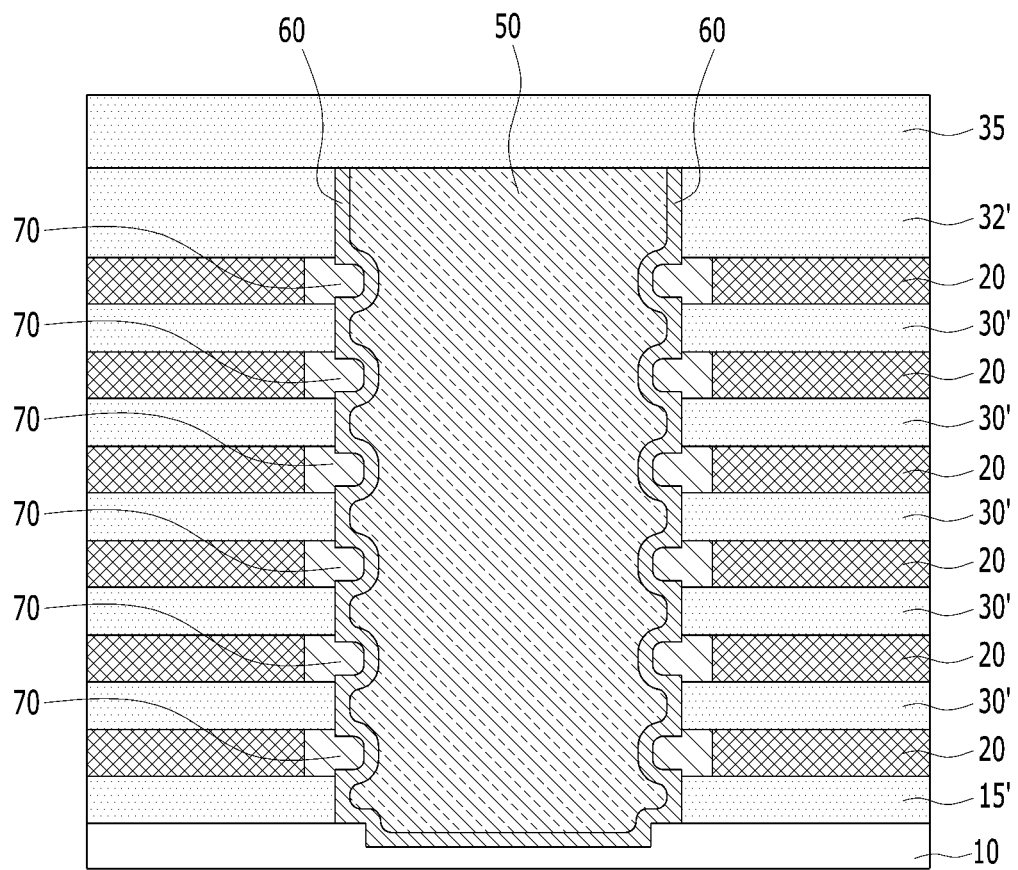

Referring to FIG. 46, the method may include forming a gate electrode 50 and a gate dielectric layer 60 by removing the gate electrode material 50*a* and the gate dielectric material layer 60*a* on the uppermost interlayer dielectric layer 32 through performing a planarization process such as CMP, and forming a capping dielectric layer 35 on the gate electrode 50, the gate dielectric layer 60 and the uppermost interlayer dielectric layer 32, by referring to FIG. 29. Then, the method may include performing the processes described above with reference to FIGS. 30A and 30B to 35, and accordingly, the nonvolatile memory device illustrated in FIGS. 7A to 7D in accordance with the embodiment of the disclosure may be formed.

Although various embodiments have been described for illustrative purposes, it will be apparent to those skilled in the art that various changes and modifications may be made without departing from the spirit and scope of the invention as defined in the following claims.

What is claimed is:

1. A neuromorphic device comprising:
   a plurality of stacked cell transistors,
   the plurality of stacked cell transistors comprising:
   a common gate electrode extending in a vertical direction in a pillar-like shape;
   a common gate dielectric layer disposed around an outer surface of the common gate electrode;
   a plurality of channel layers, each in a ring shape, that are vertically spaced apart from each other along an outer surface of the common gate dielectric layer in the vertical direction;
   a plurality of bit lines, each coupled with a corresponding one of the plurality of channel layers;
   a plurality of source lines, each coupled with a corresponding one of the plurality of the channel layers; and
   a plurality of conductive buffer layers disposed between the plurality of bit lines and the plurality of channel layers and between the plurality of source lines and the plurality of channel layers,
   wherein each of the plurality of conductive buffer layers has the shape of a meniscus.

2. The neuromorphic device according to claim 1, further comprising a plurality of gate electrodes, wherein:
   each of the plurality of gate electrodes is electrically coupled to a plurality of stacked cell transistors,
   each of the plurality of gate electrodes is electrically coupled at an upper end to a gate line extending in a horizontal direction, and
   each of the plurality of gate electrodes is electrically floated at a lower end.

3. The neuromorphic device according to claim 1, wherein the common gate dielectric layer comprises a tunneling gate dielectric layer that includes a silicon oxide, a charge trap gate dielectric layer that includes a silicon nitride, and a blocking gate dielectric layer that includes a metal oxide.

4. The neuromorphic device according to claim 1, wherein the common gate electrode and the common gate dielectric layer are disposed between the bit lines and the source lines of the plurality of cell transistors.

5. The neuromorphic device according to claim 1, wherein each of the conductive buffer layers includes a metal, a metal compound or a metal silicide.

6. The neuromorphic device according to claim 1, wherein
   each of the plurality of bit lines comprises an inner bit line and an outer bit line in contact with each other, wherein the outer bit line comprises a polysilicon, and the inner bit line comprises one among a metal, a metal compound and a metal silicide, and wherein each of the source lines comprises an inner source line and an outer source line in contact with each other, wherein the outer source line comprises a polysilicon, and the inner source line comprises one among a metal, a metal compound and a metal silicide.

7. A neuromorphic device comprising:

a plurality of stacked cell transistors, the plurality of stacked cell transistors comprising:

a common gate electrode extending in a vertical direction in a pillar-like shape;

a common gate dielectric layer disposed around an outer surface of the common gate electrode;

a plurality of channel layers, each in a shape of a ring, that are vertically spaced apart from each other along an outer surface of the common gate dielectric layer in the vertical direction;

a plurality of bit lines, each coupled with a corresponding one of the plurality of channel layers; and a plurality of source lines, each coupled with a corresponding one of the plurality of the channel layers, wherein:

the common gate electrode, the bit lines and the source lines are conductors, the common gate dielectric layer comprises a tunneling gate dielectric layer, a charge trap gate dielectric layer and a blocking gate dielectric layer, and each of the plurality of channel layers comprise a polysilicon.

8. A neuromorphic device comprising:

a plurality of gate lines extending in parallel in a first horizontal direction, and a plurality of cell transistors, each of the cell transistors comprising:

a gate electrode extending in a vertical direction from a gate line;

a gate dielectric layer surrounding an outer surface of the gate electrode extending in the vertical direction;

a channel layer surrounding an outer surface of the gate dielectric layer; and a bit line and a source line extending substantially in parallel in a second horizontal direction perpendicular to the first horizontal direction, wherein a first portion of the channel layer is electrically coupled to the bit line and a second portion of the channel layer is electrically coupled to the source line, wherein the gate dielectric layer includes a tunneling gate dielectric layer, a charge trap gate dielectric layer, and a blocking gate dielectric layer, wherein the bit line comprises an inner bit line and an outer bit line in contact with each other, and wherein the source line comprises an inner source line and an outer source line in contact with each other.

9. The neuromorphic device of claim 8, wherein:

the gate electrode has a rod-like shape, and the channel layer has an annular shape.

10. The neuromorphic device of claim 8, wherein:

the tunneling gate dielectric layer includes a silicon oxide, the charge trap gate dielectric layer includes a silicon nitride, and the blocking gate dielectric layer includes a metal oxide.

11. The neuromorphic device of claim 8, wherein an upper end of the gate electrode is electrically coupled with the gate line, and a lower end of the gate electrode is electrically floated.

12. The neuromorphic device of claim 8, wherein:

the gate dielectric layer is a cylindrical shape, and the channel layer is a ring shape.

13. The neuromorphic device of claim 8, further comprising:

a first buffer layer disposed between the channel layer and the bit line, and a second buffer layer disposed between the channel layer and the source line.

14. The neuromorphic device of claim 13, wherein the first and second buffer layers comprise a metal silicide or a metal nitride.

15. The neuromorphic device of claim 13, wherein the first and second buffer layers have a meniscus-like shape.

16. The neuromorphic device of claim 8, wherein:

the outer bit line comprises a polysilicon, and the inner bit line comprises one among a metal, a metal compound, and a metal silicide, and the outer source line comprises a polysilicon, and the inner source line comprises one among a metal, a metal compound, and a metal silicide.

* * * * *